US008260581B2

(12) United States Patent
Hoguet

(10) Patent No.: US 8,260,581 B2
(45) Date of Patent: Sep. 4, 2012

(54) JOINING AND DISJOINING INDIVIDUAL ROOMS IN A FLOOR PLAN

(75) Inventor: Ramsay Hoguet, Marblehead, MA (US)

(73) Assignee: DesignIn Corporation, Marblehead, MA (US)

( * ) Notice: Subject to any disclaimer, the term of this patent is extended or adjusted under 35 U.S.C. 154(b) by 692 days.

(21) Appl. No.: 11/563,604

(22) Filed: Nov. 27, 2006

(65) Prior Publication Data

US 2008/0126022 A1 May 29, 2008

(51) Int. Cl.
*G06F 17/50* (2006.01)
*G06F 3/00* (2006.01)
*G06F 3/048* (2006.01)

(52) U.S. Cl. ............... 703/1; 715/700; 715/764

(58) Field of Classification Search ............ 345/630, 345/648; 703/1; 715/700, 764
See application file for complete search history.

(56) References Cited

U.S. PATENT DOCUMENTS

| | | | |
|---|---|---|---|
| 5,963,964 A | 10/1999 | Nielsen | |
| 6,446,030 B1 | 9/2002 | Hoffman et al. | |
| 7,047,014 B1 * | 5/2006 | Friday et al. | 455/446 |
| 7,127,378 B2 | 10/2006 | Hoffman et al. | |
| 7,523,411 B2 * | 4/2009 | Carlin | 715/782 |
| 2004/0162840 A1 * | 8/2004 | Rappaport et al. | 707/100 |
| 2005/0081161 A1 * | 4/2005 | MacInnes et al. | 715/765 |
| 2006/0085732 A1 | 4/2006 | Jiang et al. | |
| 2007/0171223 A1 * | 7/2007 | McArdle et al. | 345/420 |
| 2008/0125892 A1 | 5/2008 | Hoguet | |
| 2008/0126020 A1 | 5/2008 | Hoguet | |
| 2008/0126021 A1 | 5/2008 | Hoguet | |
| 2008/0126023 A1 | 5/2008 | Hoguet | |

FOREIGN PATENT DOCUMENTS

| | | |
|---|---|---|
| WO | WO 01/27712 A2 | 4/2001 |
| WO | WO 2008/067191 A2 | 6/2008 |

OTHER PUBLICATIONS

Konstantinos Papamichael et al., "Decision Making through Use of Interoperable Simulation Software", Proceedings of the Building Simulation '97 Fifth International IBPSA Conference, vol. II, Sep. 8-10, 1997, Prague, Czech Republic.*

Aniket Murarka and Benjamin Kuipers, "Using CAD Drawings for Robot Navigation", Proceedings of the 2001 IEEE Systems, Man, and Cybernetics Conference, vol. No. 2, pp. 678-683, Oct. 2001.*

Autodesk, Inc., AutoCAD Architectural Desktop Release 2 User's Guide, 1999, 826 pages.*

Hsieh-Chang Tu et al., "An Architecture and Category Knowledge for Intelligent Information Retrieval Agents," Proc. 31st Annual Hawaii International Conference on System Sciences, IEEE Computer Science, vol. IV, Jan. 6, 1998, pp. 405-414.

Yoelle S. Maarek, et al., "Automatically Organizing Bookmarks per Contents," Fifth International World Wide Web Conference, pp. 1-13, May 1, 1996.

(Continued)

*Primary Examiner* — Suzanne Lo
(74) *Attorney, Agent, or Firm* — Daly, Crowley, Mofford & Durkee, LLP

(57) ABSTRACT

This patent application relates generally to systems, methods, and computer program products for home and/or landscape design. In some aspects, this application relates to a system and method for separating a floor plan in a database into separate rooms. In some additional aspects, this application relates to joining adjacent walls of two distinct rooms.

19 Claims, 42 Drawing Sheets

OTHER PUBLICATIONS

Laptops at mySimon.com, mysimon.com (online), Nov. 14, 2006, pp. 1-10 (retrieved May 2, 2008). Retrieved from the Internet: http://web.archive.org/web/20061114140021/www.mysimon.com/laptops/4566-3121_8-0.html.

MyDesignIn Help, Mydesignin.com (online), Aug. 29, 2007, pp. 1-2 (retrieved May 2, 2008). Retrieved from the Internet: http://web.archive.org/web/20070829160503/http://www.mydesignin.com/Help/Help/aspx.

Invitation to Pay Additional Fees for International Application No. PCT/US2007/084944 and Partial International Search Report, dated May 19, 2008.

PCT International Search Report and Written Opinion for International Application No. PCT/US2007/084944, dated Jul. 23, 2008.

http://del.icio.us/.
http://stylehive.com.
http://www.kaboodle.com/.
http://www.view22.com/.
http://swatchbox.com/.
http://www.plan3d.com/.
http://www.scene7.com/.

* cited by examiner

FIG. 6

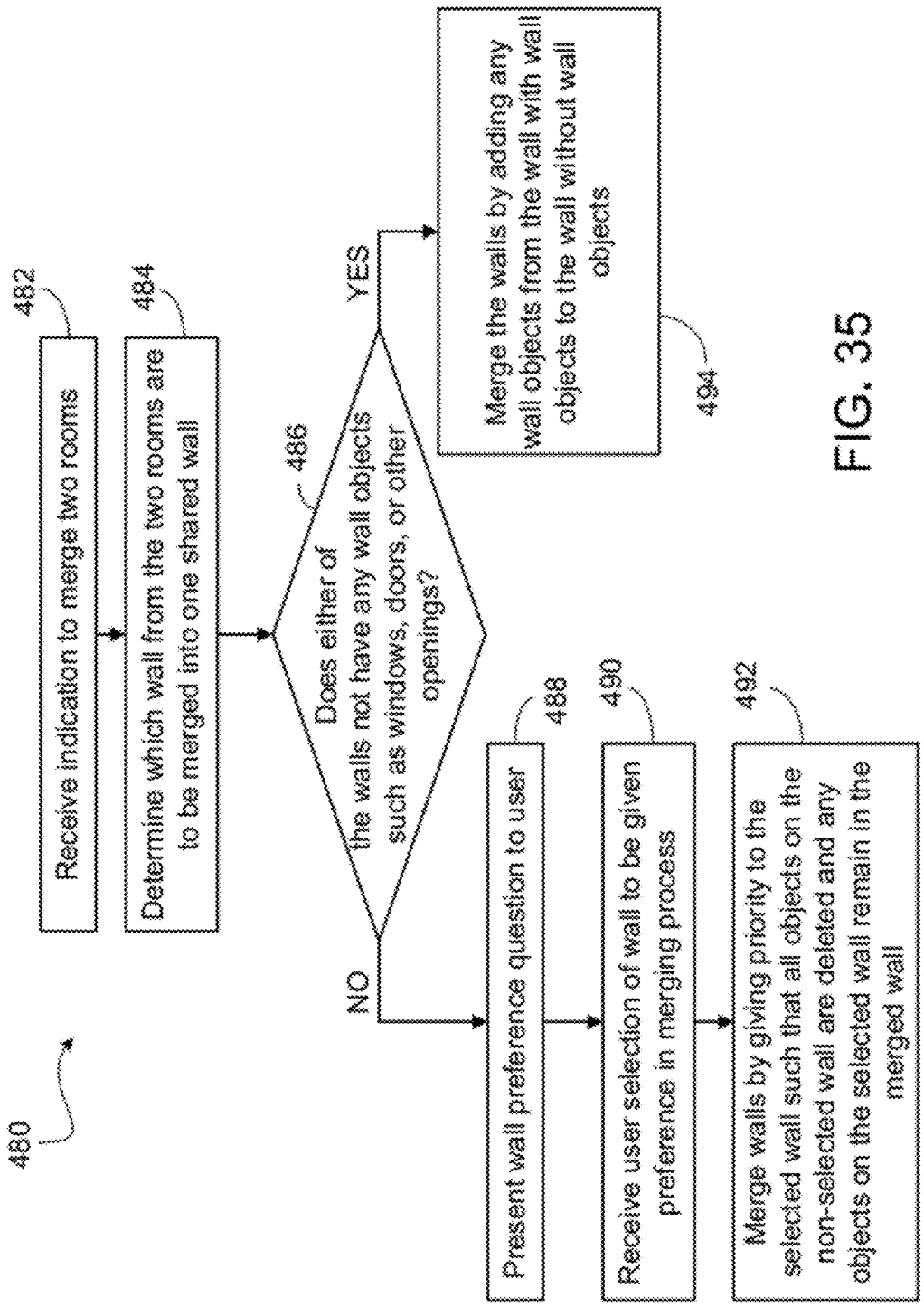

JOINING AND DISJOINING INDIVIDUAL ROOMS IN A FLOOR PLAN

TECHNICAL FIELD

This patent application relates generally to systems, methods, and computer program products for home and/or landscape design.

BACKGROUND

Designing the layout and products to include in a room can be a time consuming process. For example, a person designing a room can select various products to include in the room by collecting pages from magazines or from the internet. The person designing the room can later view these pages when selecting a product to purchase. The person designing the room may also use a computer-aided design (CAD) program or tool to generate a computer based layout of the room that includes the placement of various items within the room. If the person designing the room has questions about the items to include in the room or the layout of me room, he/she may ask a salesperson at a store about products or ask friends for recommendations or opinions about various aspects of his/her design.

The typical homeowner will spend months planning a home improvement project. The result can be an unorganised collection of pages torn out of magazines and catalogs, stacks of books with bookmarked pages, lengthy Internet Explorer "Favorites" lists with poor naming conventions and sketches of designs that are not to scale.

SUMMARY

This patent application relates generally to systems, methods, and computer program products for home and/or landscape design. More particularly, in some aspects this application relates to a system and method for separating a floor plan in a database into separate rooms. In some additional aspects, this application relates to joining adjacent walls of two distinct rooms.

In some aspects, a computer-implemented method for use in generating a home design layout includes receiving a floor plan from a user that includes multiple adjoining rooms, dividing, using a computer system, the floor plan that includes the multiple adjoining rooms into individual non-adjoined rooms, and storing information about the layout of the individual non-adjoined, rooms in a database.

Embodiments can include one or more of the following.

Dividing the floor plan into individual non-adjoined rooms, can include determining one or more walls from the floor plan to include in the information about a particular room. The method can also include determining if any home design products are associated with a particular room in the floor plan and storing information about the home design products, associated with the particular room with the information about the layout of the particular room in the database. The method can also include receiving a user selection of a particular room in the floor plan and presenting, on a user interlace, a computer-aided design (CAD) model of the particular roam without presenting the CAD models for adjoining rooms. The method can also include searching the database for other rooms that have a similar layout to one of the individual non-adjoined rooms. The method can also include updating information about one of the individual non-adjoined rooms.

In some aspects, a computer-implemented method for use in generating a home design layout includes receiving a request, the request comprising a request to join a first room and a second room, the first room having a wall and the second room having a wall, assigning a priority to one of the first and second rooms, the priority indicating a preference for merging the walls of the first and second rooms, and merging the wall of the first room and the wall of the second room based on the assigned priority.

Embodiments can include one or more of the following.

Merging the wall of the first room and the wall of the second room based on the assigned priority can include determining a placement of a door based on the location of a door in the room assigned the priority. Merging the wall, of the first room and the wall, of the second room based on the assigned priority can include joining first and second rooms using the wall from the room assigned the priority. Assigning, the priority can include receiving a user input of a preference of one of the first and second rooms. Assigning the priority can include automatically selecting one of the first and second-rooms based on one or more features of the wall of the first room and the wall of the second room.

In some aspects, a computer program product is tangibly embodied in an information earner for executing instructions, on a processor. The computer program product is operable to cause a machine to receive a request to receive a floor plan from a user that includes multiple adjoining rooms, divide the floor plan that includes the multiple adjoining rooms into individual non-adjoined rooms, and store information about the layout of the individual non-adjoined rooms in a database.

Embodiments can include one or more of the following.

The instructions to divide the floor plan into individual non-adjoined rooms can include instructions to cause a machine to determine one or more walls from the floor plan to include in the information about a particular room. The computer program product can also include instruction to determine if any home design products are associated with a particular room in the floor plan and store information about the home design products associated with the particular room with the information about the layout of the particular room in the database. The computer program product can also include instruction to receive a user selection of a particular room in the floor plan and present, on a user interface, a computer-aided design (CAD) model of the particular room without presenting the CAD models for adjoining rooms. The computer program product can also include instruction to search the database for other rooms that have a similar layout, to one of the individual non-adjoined rooms.

In some aspects, a computer program product is tangibly embodied in an information carrier for executing instructions on a processor. The computer program product is operable to cause a machine to receive a request, the request comprising a request to join a first room and a second room, the first room having a wall and the second room having a wall, assign a priority to one of the first and second rooms, the priority indicating a preference for merging the walls of the first and second rooms, and merge the wall, of the first room and the wall of the second room based on the assigned priority.

Embodiments can include one or more of the following.

The instructions to cause a machine to merge the wall of the first room and the wall of the second room based on the assigned priority can include instructions to cause a machine to determine a placement of a door based on the location of a door in the room assigned the priority. The instructions to cause a machine to merge the wall of the first room and the wall of the second room based on the assigned priority can include instructions to cause a machine to join first and second rooms using the wall from the room assigned the priority. The computer program product can also include instruction to receive a user input of a preference of one of the first and second rooms. The computer program product can also include instruction to automatically select one of the first and second rooms based on one or more features of the wall of the first room and the wall of the second room.

The details of one or more examples are set forth in the accompanying drawings and the description below. Further features, aspects, and advantages of the invention will become apparent from the description, the drawings, and the claims.

DESCRIPTION OF THE DRAWINGS

FIG. 6 is a diagram of a web interface for a home design product.

FIG. 35 is a flow chart of a process for joining two rooms.

Like reference numerals in different figures indicate like elements.

DETAILED DESCRIPTION

Figure 1:
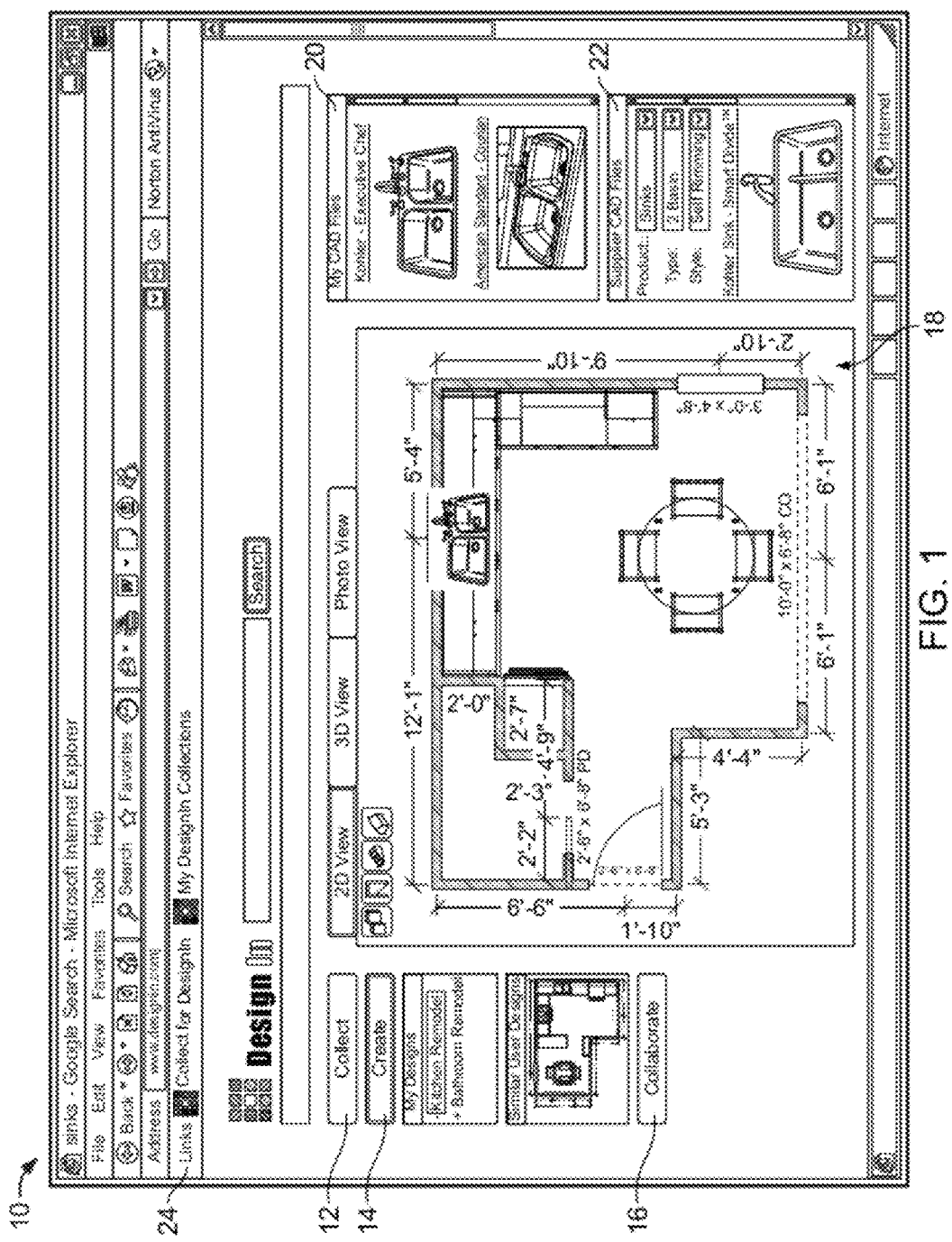
FIG. 1 is a diagram of a web interface for home design.

FIG. 1 shows a webpage 10 for a home design tool. The home and/or landscape design tool is a computer software based tool that enables a user to collect information about home and/or landscape design products from websites on the internet and use the collected information for designing a room or multiple rooms. The home and landscape design tool (referred to herein as the home design tool) includes a collect mode (indicated by collect button 12), a create mode (indicated by button 14), and a collaborate mode (indicated by button 16). In the collect mode, a user collects information and images about home and landscape design products from websites. The home design tool stores the information in the form of visual bookmarks that are saved in a database and can be viewed by the user to compare various products. In the create mode, a user generates a design for a particular room or home by drawing it from scratch, using similar user designs as a starting point or snapping together existing rooms from the system. Within create mode, the user may add home and landscape design products to their designs using the home and landscape design products from the visual bookmarks generated in the collect mode and associating them with 2D/3D models in the system. In the collaborate mode, a user can share designs he/she has generated with others and/or can view designs that have been generated by others.

Figure 2:
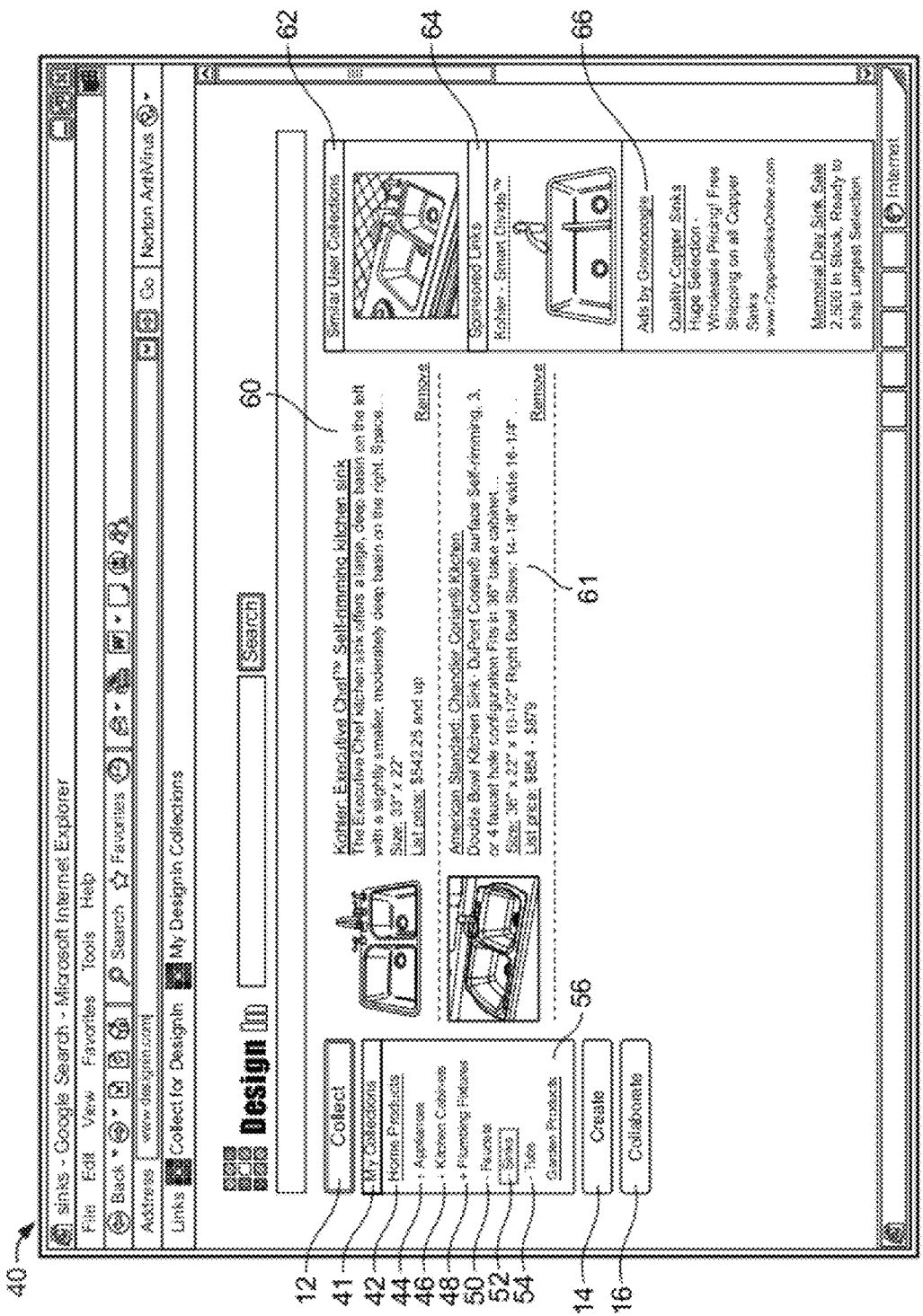
FIG. 2 is a diagram of a web interface that includes home design product bookmarks.

FIG. 2 shows a webpage 40 associated with the collect mode of the home design tool that is accessed by selecting the collect button 12. Webpage 40 is used in the collect mode of the home design tool to view, manage and edit visual bookmarks 60 based on home design product selections received from a user. Webpage 40 includes two visual bookmarks 60 and 61. The visual bookmarks provide a user with information about a particular product in an easily readable format. Visual bookmarks can include various information about the home design product that may be useful to the user when determining whether or not to use the home design product in a particular room design. Exemplary information that may be included in the visual bookmark or stored in the database related to the visual bookmark (e.g., and not included in the information displayed to the user in the visual bookmark) includes an image of the product, manufacturer name, vendor name, the name of the products, the model number, the model type, the size of the product, the finish and color of the product, the pattern, the price, the style, the construction type, the material(s), the features, mounting options, configuration options, installation type, accessories, accessory styles, application options, detail options, shape, power requirements, and control options.

Figure 3:
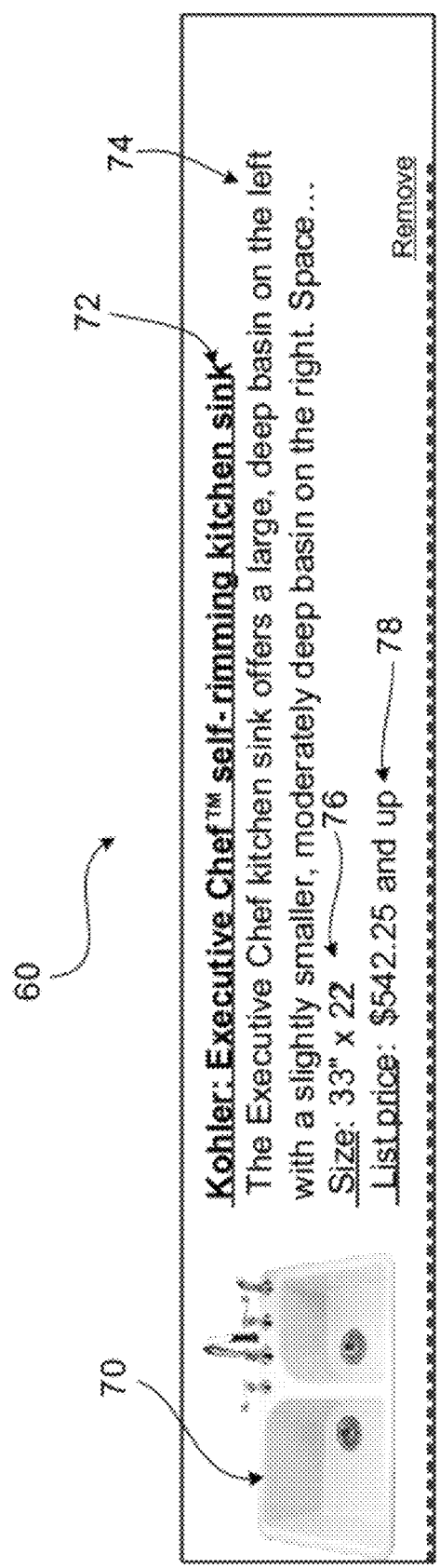
FIG. 3 is a diagram of an exemplary home design product bookmark.

FIG. 3 shows an exemplary visual bookmark 60 for a kitchen sink. Bookmark 60 includes an image of the sink 70, the name or model of the sink 72, a short summary of the features of the sink 74, the size of the sink 76, and the list price for the sink 78. The information and image included in the visual bookmark 60 is obtained by the home design tool from the product website.

Figure 4:
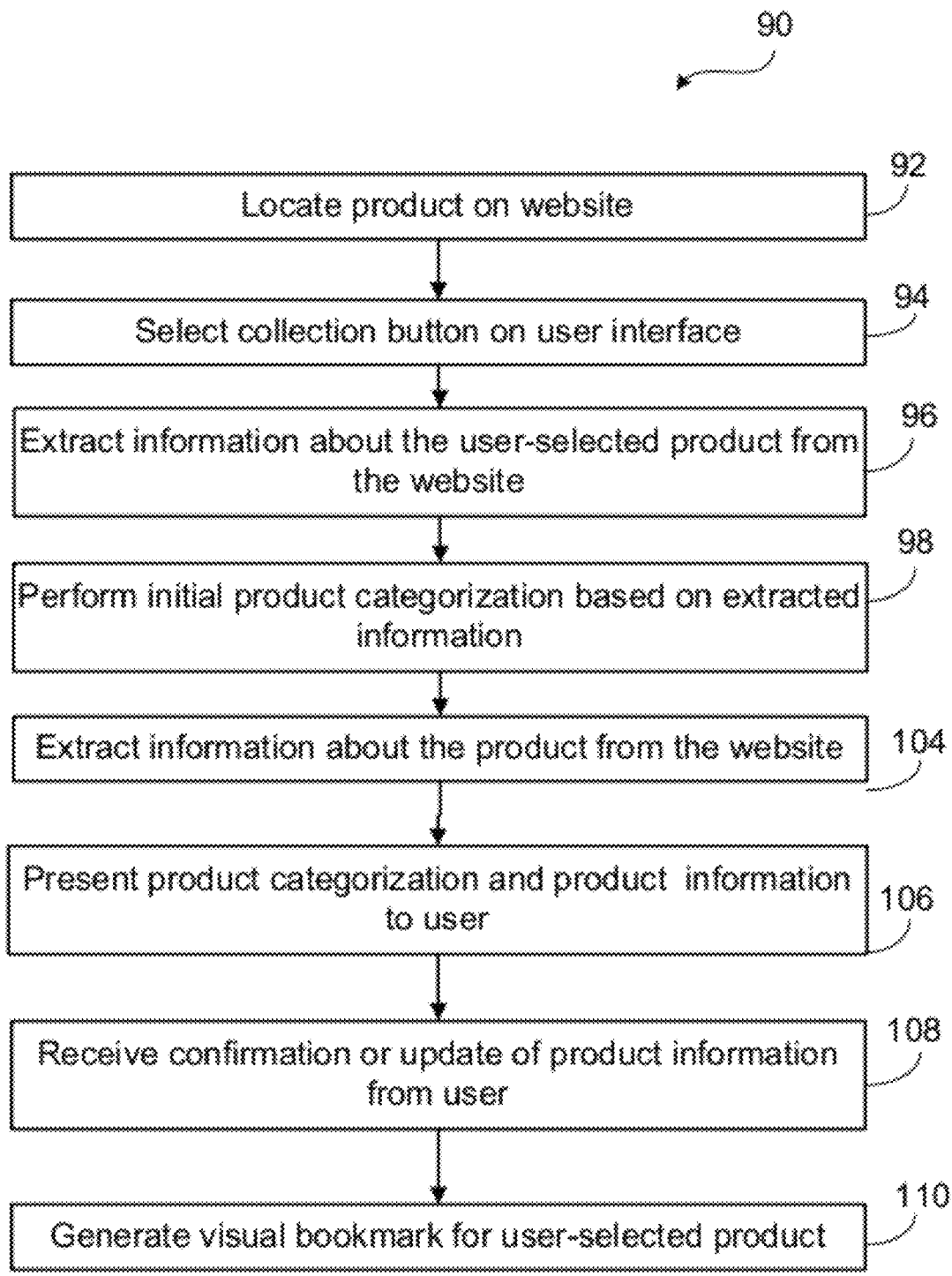
FIG. 4 is a flow chart of a process for generating home design product bookmarks.

FIG. 4 shows a process 90 for generating visual bookmarks based on home design products selected by a user from a website. To get started, the user registers to use the system and either installs the toolbar within their Web browser or right clicks on a link within a webpage that allows them to add a link to the website to their Favorites list within their Web browser. The user generates the visual bookmarks by finding products on the Internet that are of interest to the user (92). The user may use a search engine to locate products of a particular type and/or the user may browse a manufacturer's website in order to select home design products. Once the user has located a home design product of interest, the user selects a collect button from their Internet browser (or from the web page if the manufacturer has incorporated the Add to Design button within their website) to initialize a collection process that gathers information about the selected product used to generate a visual bookmark (94).

After the user has selected the product for which to generate the visual bookmark, the home design tool extracts information about the user-selected home design product from the website on which the product is displayed (96). In some implementations, the home design tool extracts the information by comparing what information was previously chosen to be extracted by other users that bookmarked the same page. The home design tool performs an initial product categorization based on the extracted information (98). The home design tool uses the initial categorization to extract product specific information from the website. In some implementations, the type of information extracted is based on the product categorization. For example, the information extracted for a kitchen sink may differ from the information extracted for cabinets or floor tiling (104). The product categorization and the product information extracted by the home design tool are presented to the user for review (106). The user reviews the categorization and other extracted information and either confirms the information is adequate or provides updated information about the home design product. The home design tool receives the confirmation or updated information about the home design product from the user (108) and generates a visual book mark for the selected home design product based on the extracted category and information (110).

Figure 5:
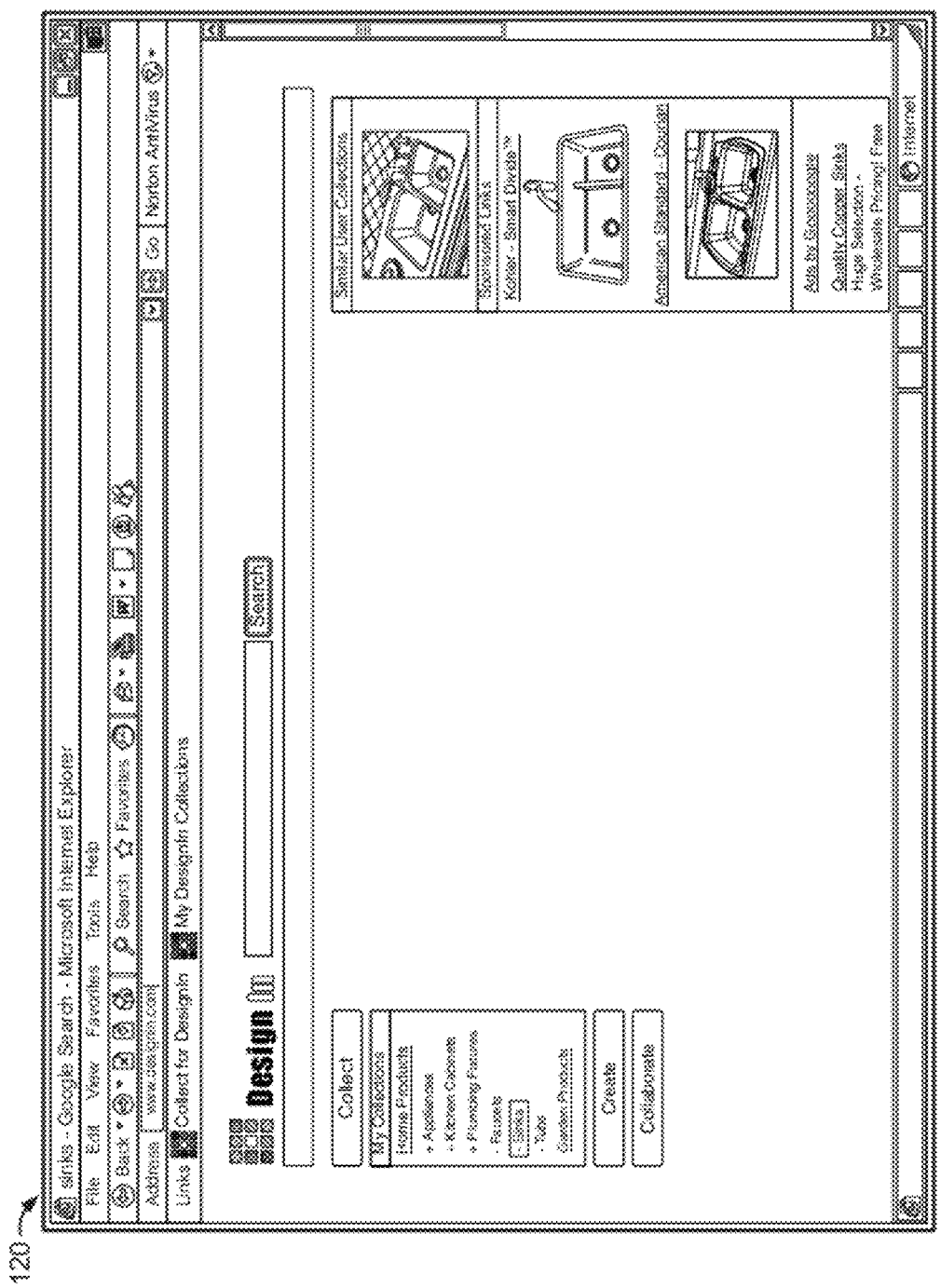
FIG. 5 is diagram of a web interface for viewing bookmarks of home design products.
Figure 6:
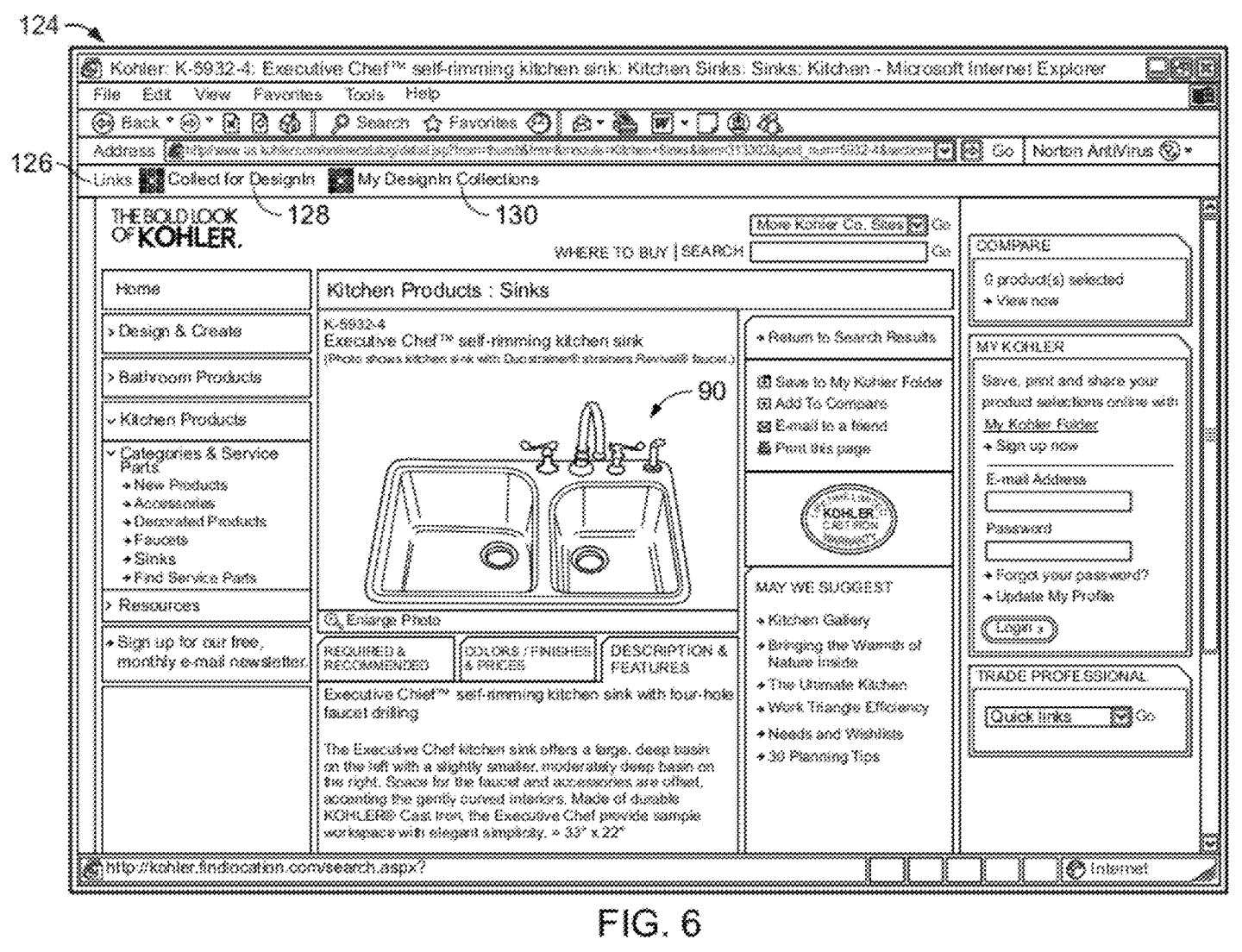
Figure 7:
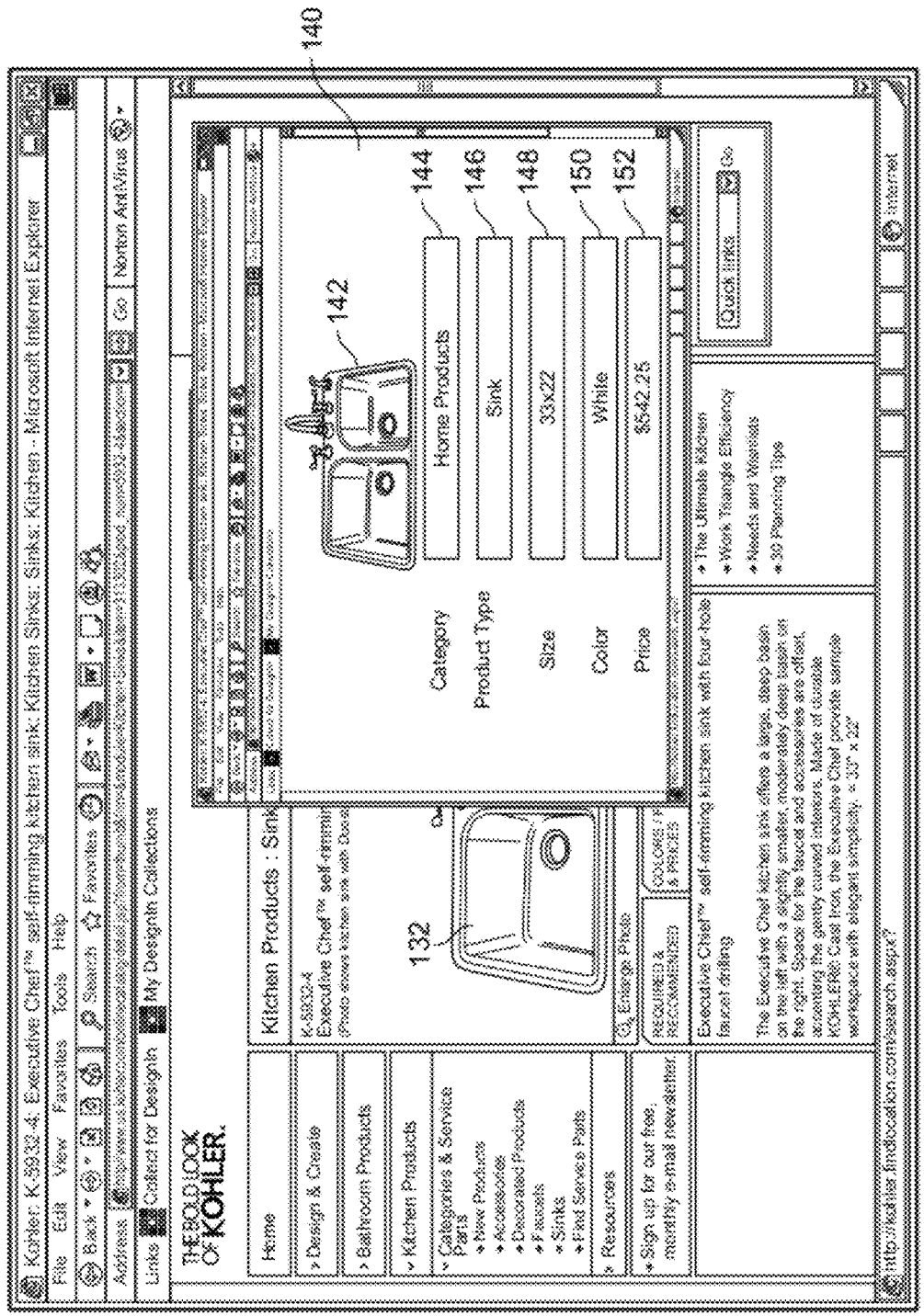
FIG. 7 is a diagram of a web interface that includes a menu for selecting product information.
Figure 8:
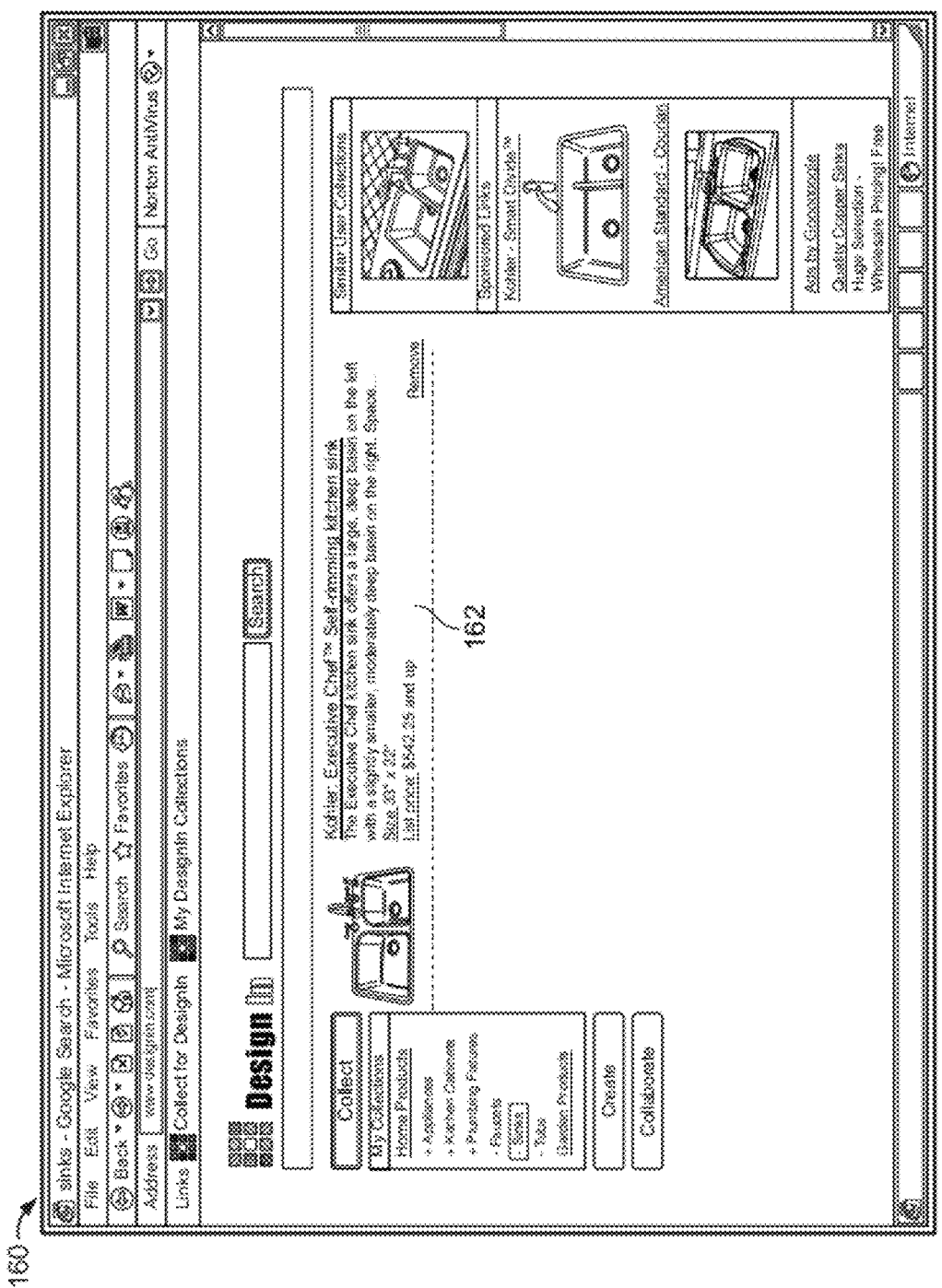
FIG. 8 is a diagram of a web interface that includes a home design product bookmark.

FIGS. 5-9 show exemplary screenshots of web interfaces 120 (FIG. 5), 160 (FIG. 6) from the process for generating a visual bookmark. As shown in FIG. 5, when the user first uses the home design tool, the user will not have any visual bookmarks. In order to generate the visual bookmarks the user navigates to websites that have products of interest. For example, as shown in FIG. 6, the user may desire to locate a kitchen sink. In this example, the user has selected a Kohler® sink 90 from the manufacturer's website 124. In order to generate a visual bookmark, the user selects the collect button 128 on toolbar 126. The home design tool extracts information related to the categorization of the sink 90 as well as other information that may be included in the visual bookmark. Since the information is automatically gathered by the home design tool, errors could potentially exist in the gathered information. In order to correct any errors, the information extracted about the sink is presented to the user for verification. For example, in some implementations, e.g., as shown in FIG. 7, the extracted information is presented in a pop-up window 140 for the user to review. In this example, the home design tool has extracted information about category, product type, size, color, and price as shown in boxes 144, 146, 148, 150 and 152 respectively. If any of this information is incorrect, the user can update the information by inputting the correct information into the respective box. After the user has confirmed the information, the home design tool uses the extracted information to generate a visual bookmark. For example, as shown in FIG. 8, a visual bookmark 162 for the sink includes an image of the sink as well as the information about the size, price, and general description of the sink extracted from the website.

This visual bookmark generation process is based on the integration of web scraping and extraction technology. The home design tool that executes the bookmark generation process is a hybrid taxonomy and folksonomy based system built for bookmarking anything related to the home improvement industry including products, design ideas and articles. In general, folksonomy is an Internet-based information retrieval methodology comprised of collaboratively generated, open-ended labels that categorize content on the web. In contrast, a taxonomy based system is a hierarchical tree structure of classifications for a given set of objects. Taxonomy based systems use a pre-established, controlled vocabulary.

The home design tool combines aspects of both taxonomy and folksonomy. For example, the categorization of a home design product selected by a user is categorized into pre-defined categories of product types and, thus, relies on a taxonomy based system. It is believed that using a taxonomy based system to categorize the home design product can provide various advantages such as offering a standard categorization schema that allows users to browse a directory of public visual bookmarks, simplifying product searches, simplifying and/or automating the process of associating the correct 2D drawing and 3D models with the bookmark, identifying key characteristics of the product and/or using this to refine the properties of the associated 2D drawing and 3D model. While the categorization of the product is based on a taxonomy based system, the information included in the visual bookmark for the home design product is based on a folksonomy based system. As such, the information in the visual bookmark is gathered from the information available on the website of the selected home design product. The tags for the visual bookmark are generated using a folksonomy based system to further describe the product characteristics including style, color, and dimensional information. It is believed that using a folksonomy based system for collecting and displaying additional information about the home design product can provide various advantages such as offering a more open ended system for categorizing products based on more detailed information such as the finish and color of the product, the pattern, the style, the construction type, the material(s) and other options listed above, offering a tag based system to simplify and refine searches for visual bookmarks created by other users; offering complementary system to the taxonomy based directory of public visual bookmarks allowing users to refine their product browsing with tags; and/or providing a more detailed information for associating the correct 2D CAD drawing and 3D CAD model with a visual bookmark.

The taxonomy based categorization and folksonomy based tags can be used to build intelligence for the home design tool As users collect products, design ideas, and articles, the home design system uses a neural network to learn and identify the correct taxonomy based categories and folksonomy based tags.

Figure 9:
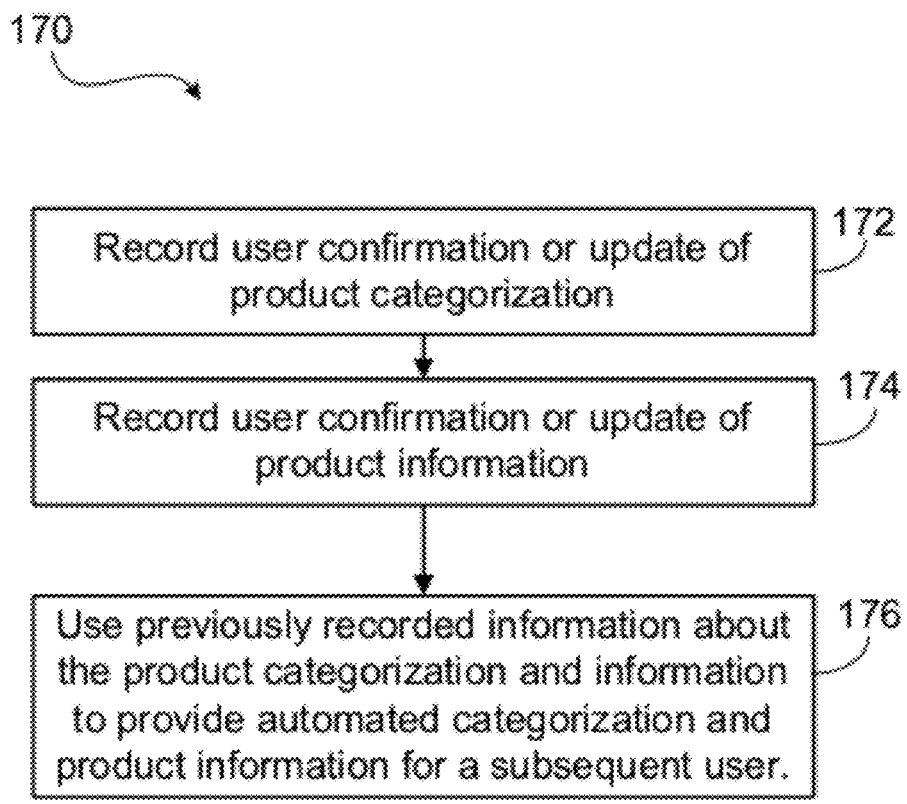
FIG. 9 is a flow chart of a process for updating information about a home design product

FIG. 9 shows a process 170 for updating and providing more accurate product categories and tags for a product based on previous information collected by the home design tool for the product. As described above, the home design tool automatically pre-selects both the product categorization and the product information and presents the categorization and information to the user who can confirm or update the categorization and information. When the user confirms or updates the taxonomy-based categorization for a particular home design product, the home design system records the user's input (172). Similarly, when the user confirms or updates the folksonomy-based information for the particular home design product, the home design system records the user's input (174). The system uses the information recorded about the product categorization and product information to provide more accurate automated categorization and product information for subsequent users (176).

For example, in FIG. 7, the home design system automatically categorized the sink as a home product (as shown in box 144). In addition, the home design tool extracted various information about the sink such as the product type (as shown in box 146), the size (as shown in box 148), the color (as shown in box 150), and the price (as shown in box 152). If any of this information is incorrect, the user can modify the information. For example, if the price of the sink were $250 rather than $542.25 as extracted by the home design tool, the user could enter the correct price of $250 into box 152. The home design tool would record the change in the price for the home design product made by the user. The visual book marks are stored in a database and available for others to view. Subsequently, if another user selects the same sink, the home design tool could use this information to initially provide the correct price of $250 to the user.

In some examples, the user may modify information such that the correct information is changed to be incorrect. For example, in FIG. 7 the size of the sink is accurately shown as 33×22. However, the user may change the size of the sink to be 12×12 or any other incorrect dimension. This may cause the home design tool to subsequently display the information, entered by the user (e.g., 12×12) rather than the correct information extracted, from the website. However, when this happens, the user will correct the information. As such, over time, the responses of the users of the system will show that the correct size of the sink is 33×22 and the system will "learn" to display this information for the sink dimensions in spite of the incorrect information entered by one of the users.

In some implementation, the home, design system can use neural networks as described to follow. The system scans the page for the initial taxonomy based criteria. Once identified, the system uses the taxonomy based criteria to scan a database of words and phrases identified to be key characteristics of the taxonomy based product type. The system also uses the taxonomy based criteria to scan the database of tags used by previous users to Identify not only a particular page/product but tags used to describe bookmarks within the same taxonomy based product category. The system uses these words to scan the page for these phrases and words and presents the user with a list of potential tags for further folksonomy based categorization of the product.

Referring back to FIG. 2, the home design tool groups the visual bookmarks according to product category and product type. For example, webpage 40 includes a menu 41 of collections of visual bookmarks generated by the user. The visual bookmarks are organized into categories based on the product categorization and into subcategories based on the type of the product. Exemplary product categories include appliances (e.g., as indicated by arrow 44), kitchen cabinets (e.g., as indicated by arrow 46), plumbing fixtures (e.g., as indicated by arrow 48), flooring, appliances; building structure; cabinets & storage; floors, walls & counters; furniture & accessories; landscape & outdoor; lighting; plumbing and other. Each of these product categories can be sub-divided Into particular types of products. An exemplary subdivision of product categories into particular types of products is shown to follow:

Appliances
  Cooktops
  Dishwashers
  Laundry
  Microwave Ovens
  Ovens
  Ranges
  Refrigerators
  Other
Building Structure
  Columns
  Doors
  Fireplaces
  Railings
  Stairs
  Windows
  Wood Stoves
  Other
Cabinets & Storage
  Closets
  Kitchen Cabinet
  Bathroom Cabinet
  Pantry
  Wine Storage
Floors, Walls & Countertops
  Architectural Elements
  Carpeting
  Ceilings
  Countertops
  Floor Laminate
  Hardwood Flooring
  Paint
  Rugs
  Tile
  Vinyl
  Wallpaper
  Window Coverings
  Other
Furniture & Accessories
  Bedding & Linens
  Beds
  Chairs
  Decorative Accessories
  Decorative Hardware
  Desks
  Fabrics
  Kitchen Accessories
  Ottomans
  Plants—Indoor
  Sofas
  Tables
  Tableware
  Other
Lighting
  Lamps
  Ceiling—Attached
  Wall—Attached
Landscape & Outdoors
  Arbors Columns
Fences
Hot Tubs
Outdoor Furniture
Patio Stones
Plants
Pools
Spas
Trees
Wall Stones
Other
Plumbing
Bath/Showers
Bathtubs
Faucets
Hot Tubs & Spas
Sinks—Bathroom
Sinks—Kitchen
Saunas & Steam Baths
Showers
Toilets
Other
Other
Heating & Cooling
Art For example, the category of plumbing fixtures can include products types such as faucets, sinks, and tubs (e.g., as indicated by arrows 50, 52, and 54 respectively). It is believed that arranging the visual bookmarks into product categories and product types can provide various advantages such, as making the information more easily accessible for the user to search for these products or browse a product directory based on these types of categories.

Webpage 40 also includes information about products not selected as visual bookmarks by the user. For example, webpage 40 includes similar user collections 62. The similar user collections 62 includes other items that are similar to the items selected by the user. The user can access the similar user collections 62 to view other products without having to sort through the large volumes of information available on the internet. The home design tool determines home design products to include in the similar user collections based on the products for which the user has generated visual bookmarks. For example, as shown in FIG. 2, the user had generated bookmarks for various dual-basin sinks. As such, the similar user collections could include dual-basin sinks available from other manufacturers and selected as visual bookmarks by other users. The system uses the taxonomy based, product categorization and the folksonomy based tags to identify similar products, Webpage 40 also includes sponsored links 64. In general, sponsored links 64 are links to products by a particular manufacturer associated with the type of products that the user has bookmarked. The manufacturer may pay a fee to have the sponsored links 64 displayed in order to advertise their brand, or their particular products, Webpage 40 also includes text based web advertisements 66. These advertisements can be sponsored by various companies or organizations. The displayed advertisements are selected by the home design tool based on the information about the type of products the user has generated visual bookmarks for. For example, in FIG. 2, the user had generated visual bookmarks for various types of sinks and the information presented in the web advertisements 66 is related to the general category of sinks. Both the text and image based, advertisements may include similar products using the same taxonomy based product, categorization and the folksonomy based tags to identify similar products in the advertising inventory. In some implementations, advertisers can choose product categories and products tags required for their advertisements to appear in the system.

The taxonomy based categorization, the folksonomy based tags and user activity tracking offer the foundation for the system's product search algorithms. Users may type a product name and characteristics into the search field. The system identifies and prioritizes the most popular product bookmarks for the specific terms based on what product categories and tags they assigned to the product, how many users have bookmarked these products, how many users have incorporated these products within their designs and how many users have viewed these products in other users collections and within other users designs. The algorithm relies heavily on how many users incorporate the bookmark into their designs since this shows that the user may actually purchase the product. Advertisements may also appear in search results using similar criteria as bookmarks. If the advertisers assign a specific URL to an ad, the system will include both visual bookmarks and advertisement selections for the same product as part of the prioritization calculation for the products. After typing a search term into the search field, specifying that the user is searching for products, and clicking the search button, the system presents the user with results based on the algorithm outlined above. On the left side of the screen, the user is presented with options to refine the search. For example if a user types in two basin sink within the search box, the results appear and the system automatically assigns a product category of plumbing and a product type of sink. The system may also present the user with the product style of two basin as a taxonomy based categorization or as a folksonomy based tag. Tags extracted from and most commonly shared among the search results are presented to user. These tags are shared characteristics of the product as outlined above in the description of potential tags. The user may select these tags such as "self-rimming" (an installation type) to refine the search results to sinks that are self-rimming meaning they are installed through the top of a counter. The user may also refine the importance of search criteria such as price, size, and specific tags. Specific tags may be selected from a list to be added to a search slide bar. Users may adjust the search sliders to adjust the importance of each criterion. These importance parameters are used as coefficients in search algorithm to raise or lower the weight of different metrics in search results.

As described above, the home design tool allows a user to collect information about borne design products and use the information for designing a room or multiple rooms. In the create mode, a user can generate a design for a particular room or rooms using the home design products collected in the collect mode. In order to allow users to add the products for which they generated visual bookmarks into a room design, the home design tool uses information collected in the collect mode about a home design product to associate and modify two-dimensional and three-dimensional computer-aided design (CAD) models from the system's database to the specifications of the product.

Figure 10:
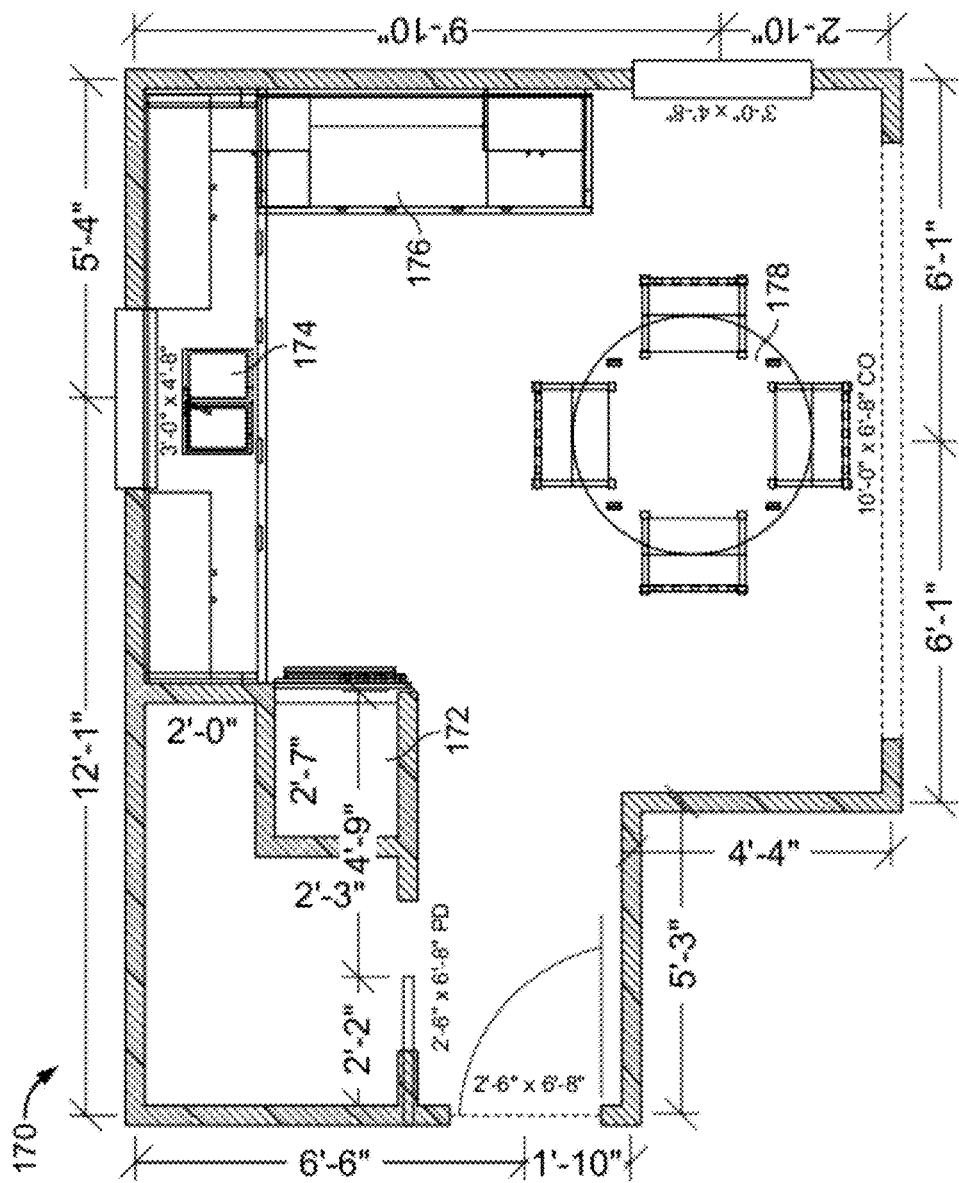
FIG. 10 is a diagram of a two dimensional room layout.

FIG. 10 shows an exemplary CAD design 170 that includes multiple CAD models for various home design products. For example, CAD design 170 includes a CAD model 172 for a stove, a CAD model 174 for a sink, a CAD model 176 for a set of cabinets, and a CAD model 178 for a table. The home design tool generates the CAD models for home design products based on information extracted from the website.

Figure 11:
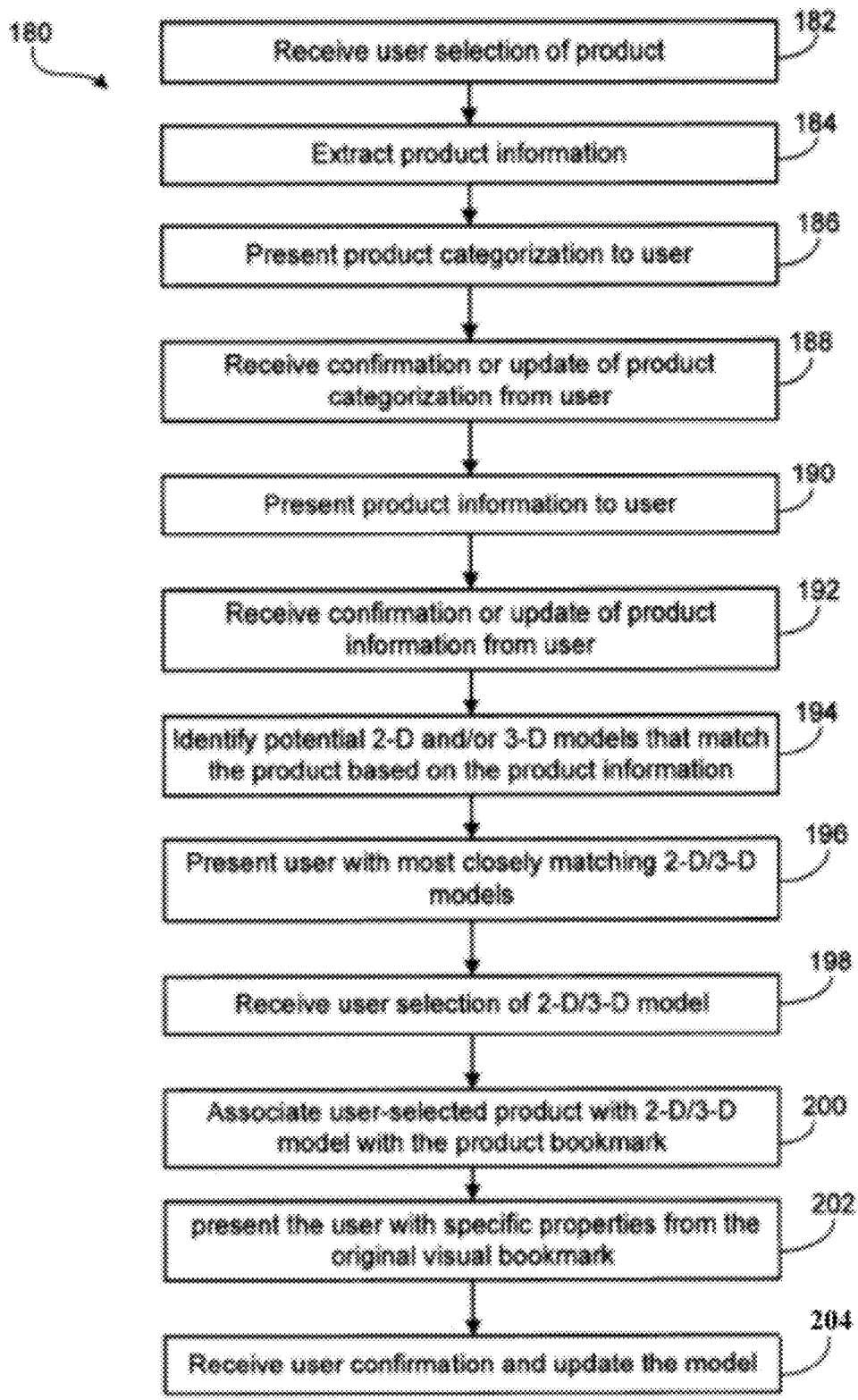
FIG. 11 is a flow chart of a computer-aided design (CAD) model selection process.
Figure 12:
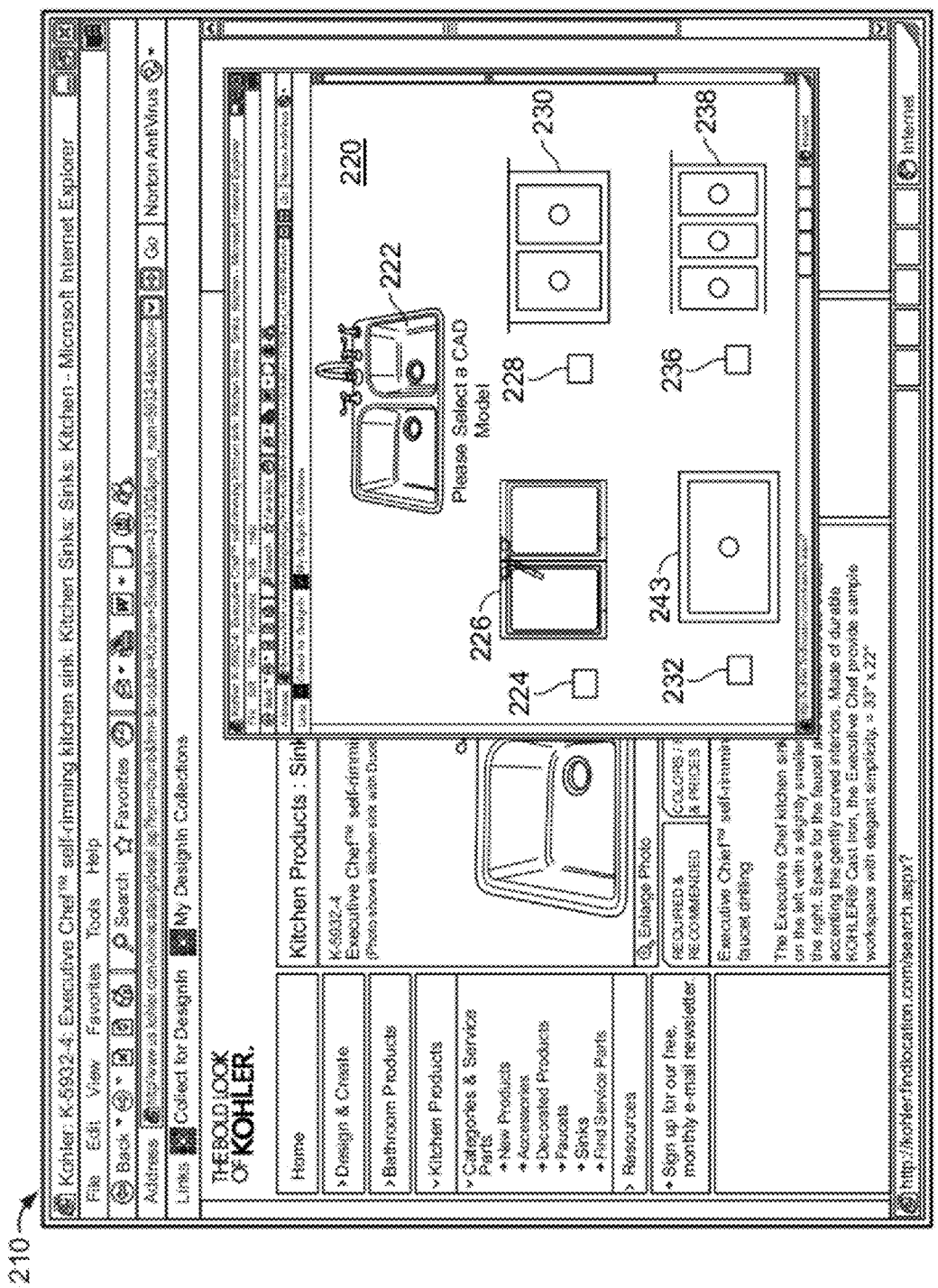
FIG. 12 is a diagram, of a web interface with a CAD model selection window.

FIG. 11 shows a process 180 for generating CAD models for home design products presented on a webpage based on a user selection of the home design product. The home design tool receives a user selection of a home design product from a website (182) and extracts information about the home design product (184). The home design tool presents product categorization information to a user based on information extracted from the website (186) and the user either confirms or updates the product categorization information (188). The home design tool also presents product information to the user (190) and receives a confirmation or an update of the information from the user (192). The extraction and confirmation of information (e.g., steps 182, 184, 186, 188, 190 and 192) are similar to the process described above in relation to generation of the visual bookmark for a home design product. The home design tool identifies potential two-dimensional and/or three-dimensional model(s) that are potential matches for the home design product based on the extracted categorization and information about the home design product (194). More particularly, the home design tool includes a database that includes multiple, different standard CAD drawings for different home design products. The home design tool uses the categorization information for the product and the dimensional information to narrow the number of potentially matching CAD models for the home design product. The potentially matching CAD model(s) are presented to the user (196). The user can select the CAD model that most closely represents the product he/she selected from the website. For example, as shown in FIG. 12, the home design tool presents the user with a pop-up window 220 within web interface 210 that includes multiple CAD model choices 226, 230, 234, and 238. The user can select a particular CAD model from the displayed CAD models 226, 230, 234, and 238 by selecting the associated button 224, 228, 232, or 236, respectively. Once the home design tool receives the user selection of a particular one of the CAD models (198), the home design tool associates the CAD model with the home design product and the visual bookmark for the home design product (200). Next the system will present the user with specific properties from the original visual bookmark for the 2D/3D model (202). For example, the color white and the sizing options of 33"×22." The user will confirm these options and the system updates the model (204). For example in this case the system applies the color white to the two basin sink and parametrically adjusts the base model to become 33"×22". Non-parametric adjustments may also be made. Instead of parametrically adjusting a model, the system may simply replace the model with a model that meets the specific criteria.

An additional implementation may include interpreting an image and transforming the image into a 3D model. This will be used for products that may not be included in the site's database of CAD models. For example if the user bookmarks a lamp and the system does not have a lamp in the database, the system will prompt the user to create a 3D model of the image. For a tall floor lamp, the system would identify the edges of the object and prompt the user to verify that the edges are correct or incorrect. The user can select nodes to move the vector based shape around the image and identify the shape of the image. The user may also draw a closed shape around objects. Once identified, the user may select how they would like the system to convert the image into 3D. The user could either browse the directory of CAD model in the system, create their own design or use the Image as a basis for the CAD model. For example with a tall, floor lamp, the system would identify the edges of the lamp and remove other graphics from the picture. The user could then use the revolve tool to revolve the image of the lamp around a vertical axis to create a 3D version of the product. The cropped image also becomes a texture map that may be applied to the 3D model. Tools used for creating a model from scratch may include: lines, arcs circles, rectangles, polygons, 3D box, spheres, cylinder, cones, toruses, wedges, revolve tools, sweep tools, 3D poly-lines, 3D splines, and other standard CAD drawing tools.

It is believed that generating CAD models for images found on the internet can provide various advantages. For example, since the home design tool makes the entire Web a content source for two-dimensional CAD drawing and three-dimensional CAD models of products, the users of the home design tool can select and use any home design product in designing a layout and is not constrained to manufacturers that offer CAD models for their products in specific formats. The user is not constrained to manufacturer's that provide CAD models because the CAD model matching and modification process identifies key characteristics of products based, on information available on the home design product's website and converts this information into CAD models that represent the style, color, and dimensional, information of the product.

Figure 13:
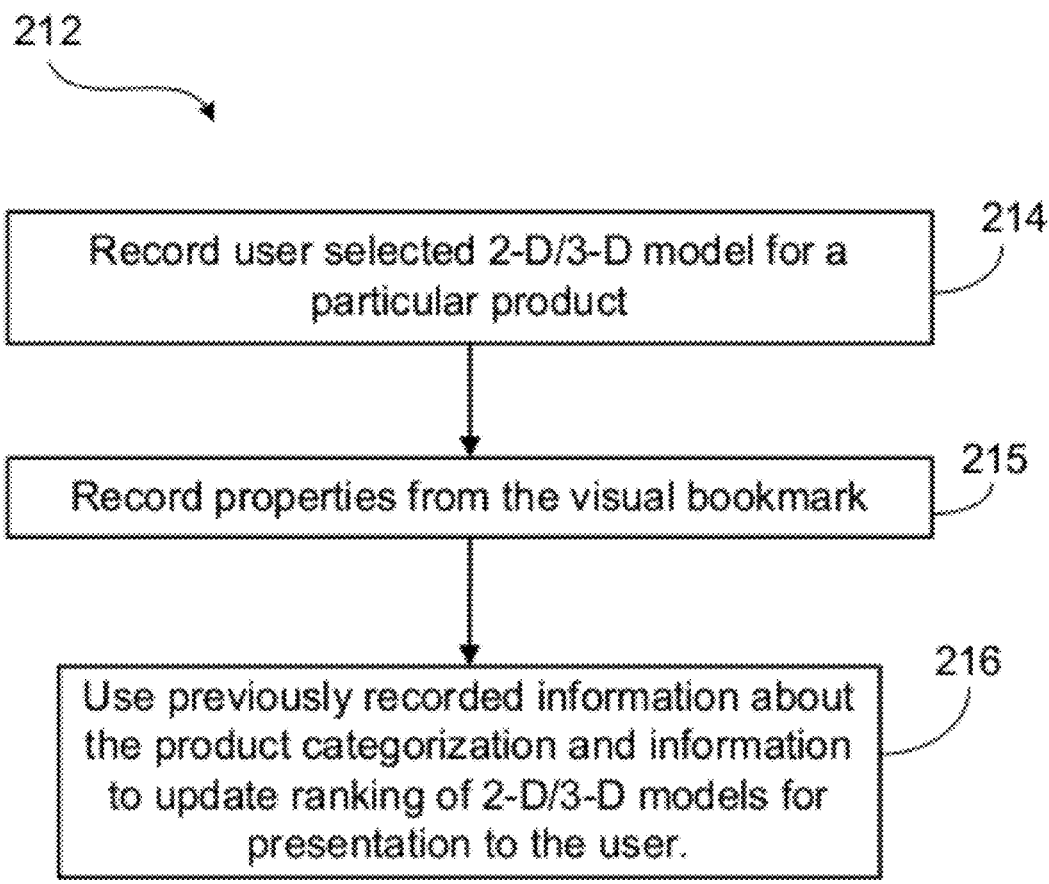
FIG. 13 is a flow chart of a model update process.

The taxonomy based categorization and folksonomy based tags used to associate the CAD models with the home design product selected, by the user build the intelligence for the system, that helps the system to correctly identify which CAD drawings and models to associate with a particular home design product. As described above, when a user adds this visual bookmark to a CAD drawing, the system presents the user with a selection of the closest matching CAD files (two-dimensional and/or three-dimensional CAD models) to associate with the visual bookmark. FIG. 13 shows a process 212 for building intelligence and using the intelligence about selected CAD design choices to provide more accurate selections to a user. As users associate the various CAD models/drawings with a, specific Web page and product information, the system records which CAD model is selected the most frequently (21.4). The system also records what properties from the visual bookmark like size and color are used to modify the model in the database (215). The home design tool uses this recorded information to update a ranking of the CAD models and prioritizes CAD model choices presented to the user for future bookmarks accordingly, as well as update the properties of the presented CAD model (216).

Figure 14:
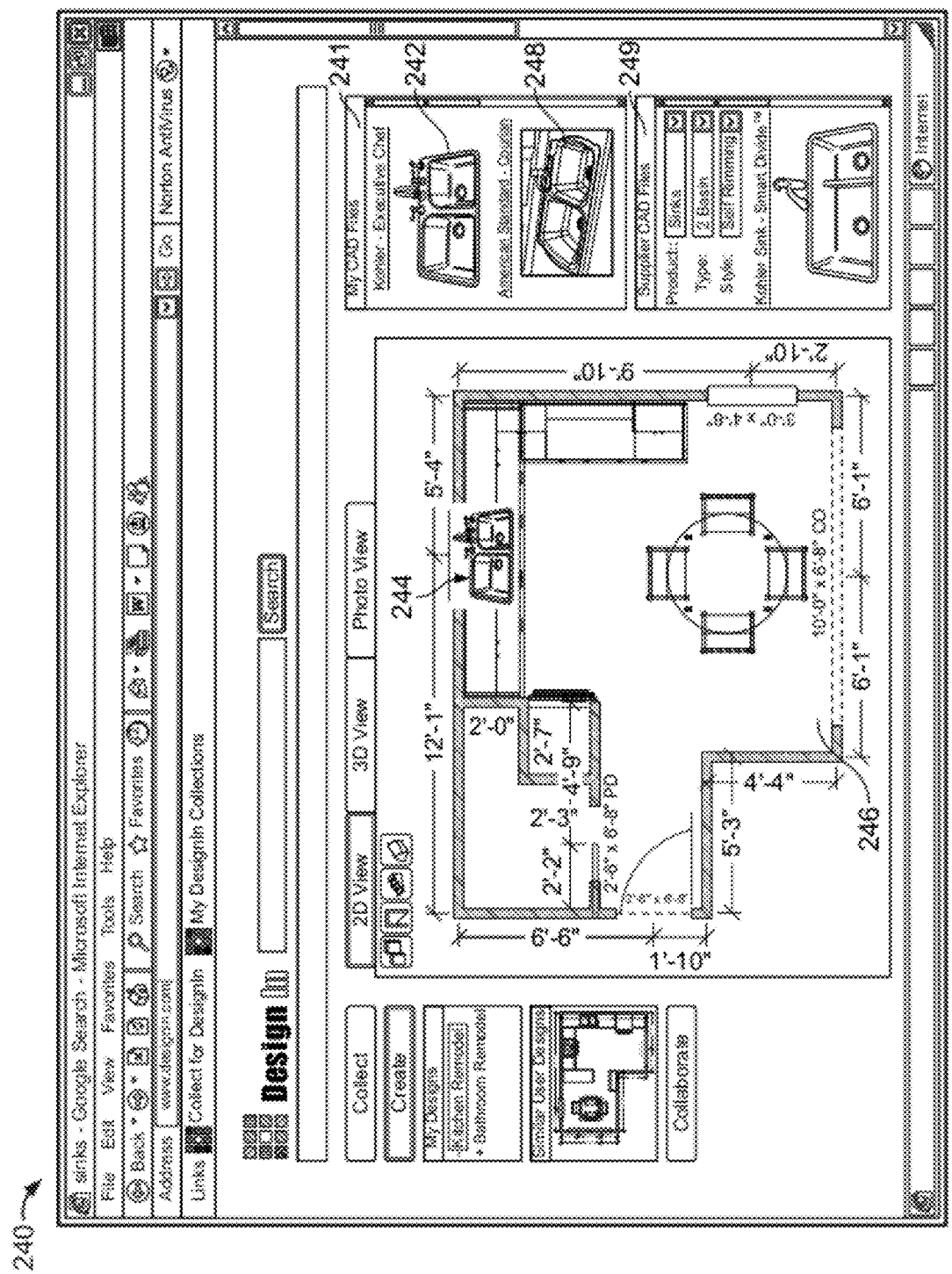
FIG. 14 is a diagram of a web interface with a two-dimensional room layout
Figure 15:
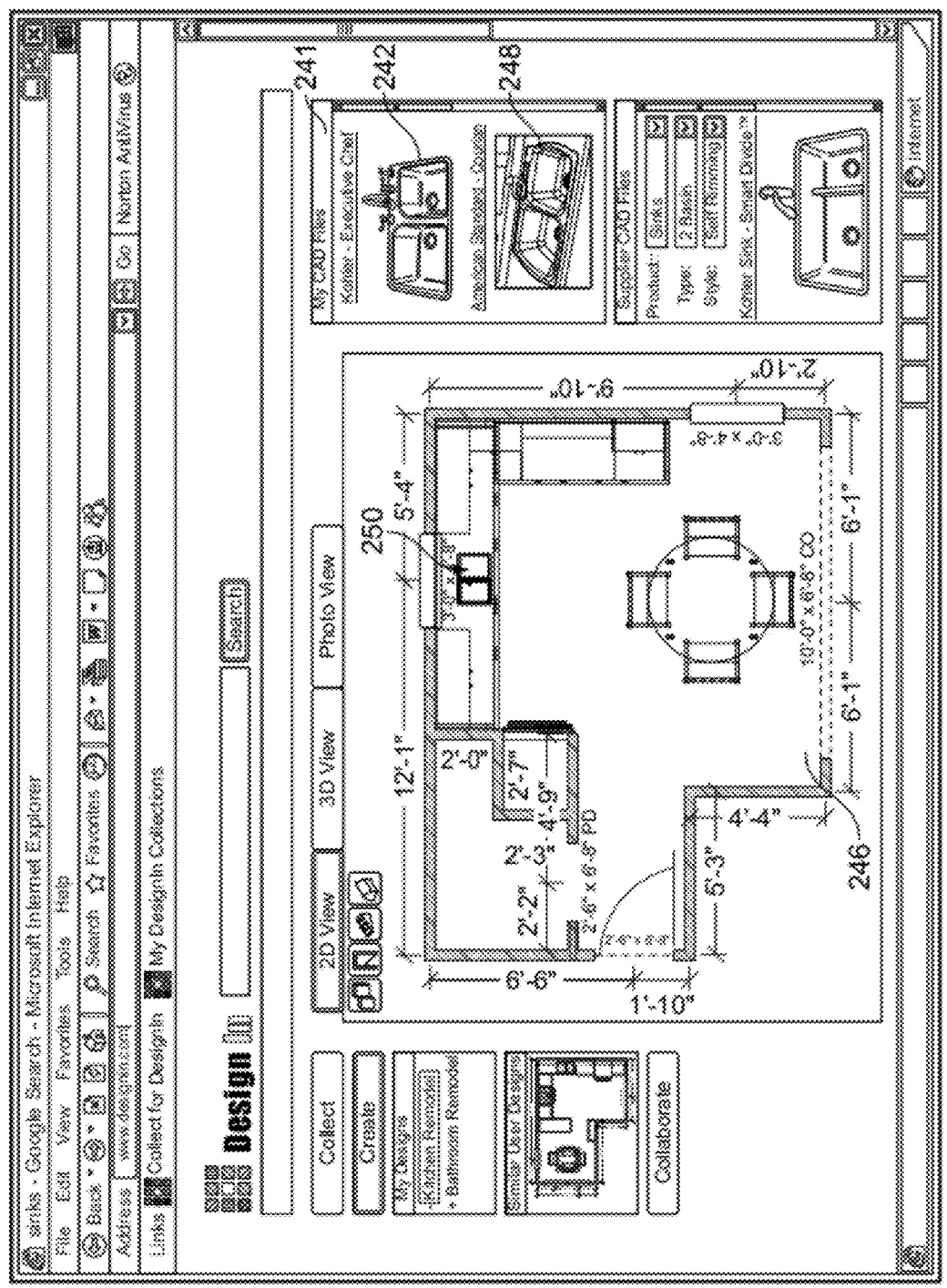
FIG. 15 is a diagram of a web interface with a two-dimensional room layout.
Figure 16:
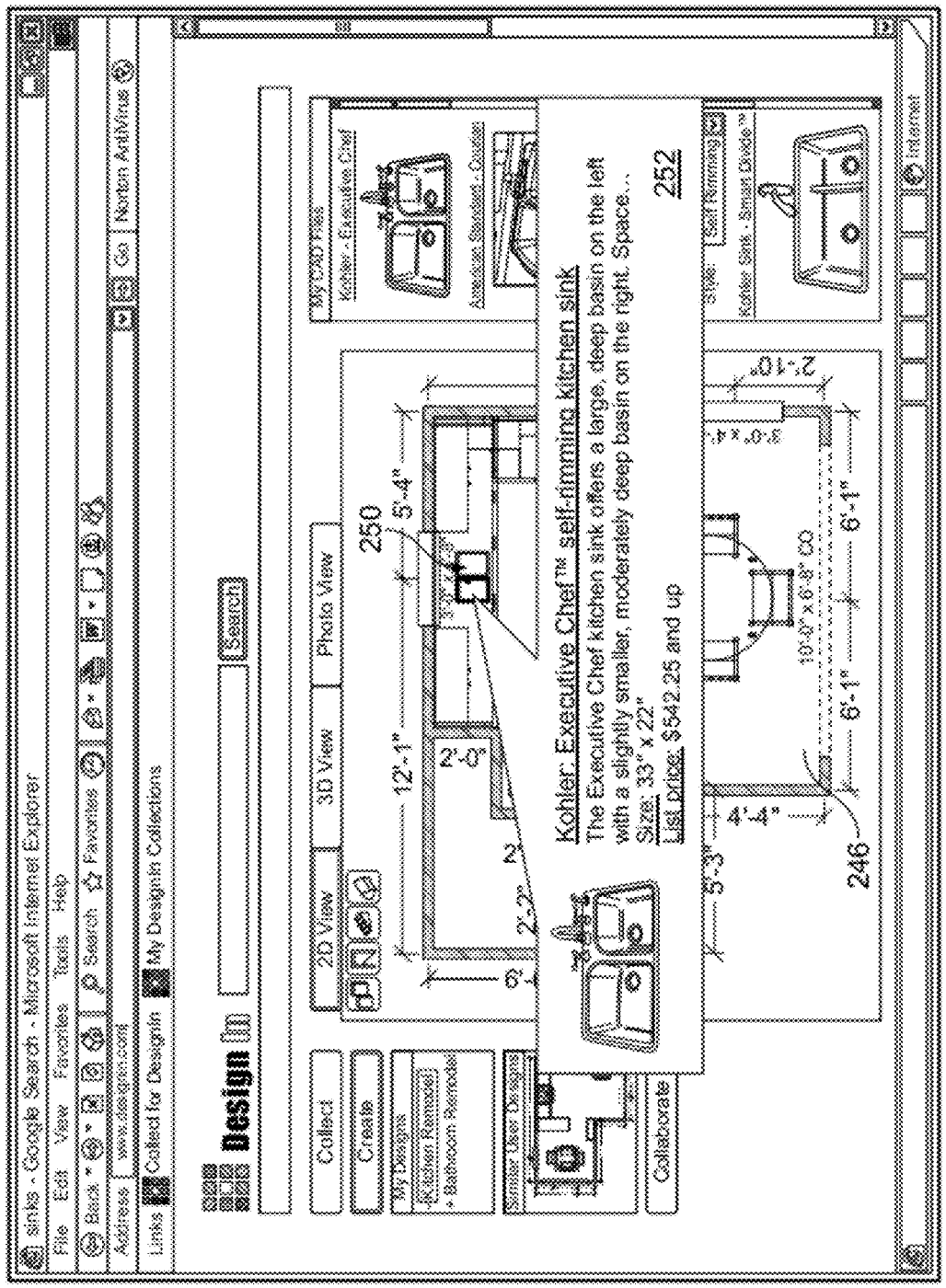
FIG. 16 is a diagram of a web interlace.

FIGS. 14-16 show an exemplary use of CAD models in a home design. Once CAD models have been associated with a particular user-selected product, the home design tool displays the home design products for the user to use in designing a layout for a room. For example, FIG. 14 shows a screen-shot 240 of a web interface for home design. The web interface 240 includes a portion 241 that shows pictures of the home design products for which the user has generated visual bookmarks and CAD models. It is believed that showing the image of the product (e.g., images 242 and 248) as opposed to showing the CAD model associated with the product can aid the user in easily recognizing and selecting the product. The web interface 240 also includes a portion 249 that provides a way for the user to access supplier generated CAD files. The supplier CAD files are files provided by the manufacturer. The user can sort for a supplier CAD file by entering information about the type of home design product he/she is looking for.

The home design tool allows the user to insert home design products into a home design layout (e.g., layout 246) by dragging the image of the product from section 241 into the desired location. For example, in FIG. 14, the user has selected the image of sink 242 and placed the sink into the layout 246 (as indicated by sink 244 in layout 246). After the user has placed the home design product into the layout 246, the home design tool replaces the image of the home design product with the associated CAD drawing of the home design product (e.g., as shown by CAD model 250 in FIG. 15).

In some implementations, once placed the object remains selected and a properties palette on the right side of the screen appears allowing the user to confirm the size and color of the sink or change it and see the properties update. In some additional implementations, the user selects the visual bookmark to be inserted and the properties palette appears prompting the user to verify the correct options are selected such as color and size. Once the user selects the properties, a 2D/3D model is parametric-ally generated by automatically modifying the original model in the database to the properties specifications from the original bookmark or based on user input. The user may now drag the 2D/3D model into his/her design.

As shown in FIG. 16, after the home design tool has replaced the image of the home design product (e.g., as shown in FIG. 14) with the CAD model of the home design product (e.g., as shown in FIG. 15), the user can view information relating to the home design product by moving a cursor over the CAD model 250. For example, as shown in FIG. 16, when the user positions a mouse over the CAD model 250 a message 252 appears that includes the visual bookmark information associated with the CAD model and the selected home design product. It is believed that this can be beneficial because the user can easily view information and an image of each home design product that has been added to a room's layout.

While in the implementations described above in relation to FIG. 11, the home design tool associates the CAD model with a product selected by the user at the time the visual bookmark is generated, other implementations are possible. For example, in some implementations, the potential CAD models may be presented to the user when the user attempts to add the bookmarked home design product to a layout. Associating the CAD model with the home design product at the time the product is added to a room layout can provide the advantage of requiring the user to select a CAD model only for the products they choose to add to the layout rather than for each product for which the user generates a visual bookmark.

While in the implementation described above, the system associates a CAD model, with a user-generated bookmark, other implementations are possible. In some implementations, the user specifies a generic 2D CAD drawing/3D CAD model to place in their design. The system scans the database of visual bookmarks that other users have matched to the specific CAD model and presents the user with a prioritized list of visual bookmarks. The system also scans the database of the entire database of advertisements that have CAD models associated with the advertisements. The system also presents the user with a prioritized list of image and text based products advertisements. The user then selects which visual bookmark or advertisement to associate with the CAD model.

Figure 17:
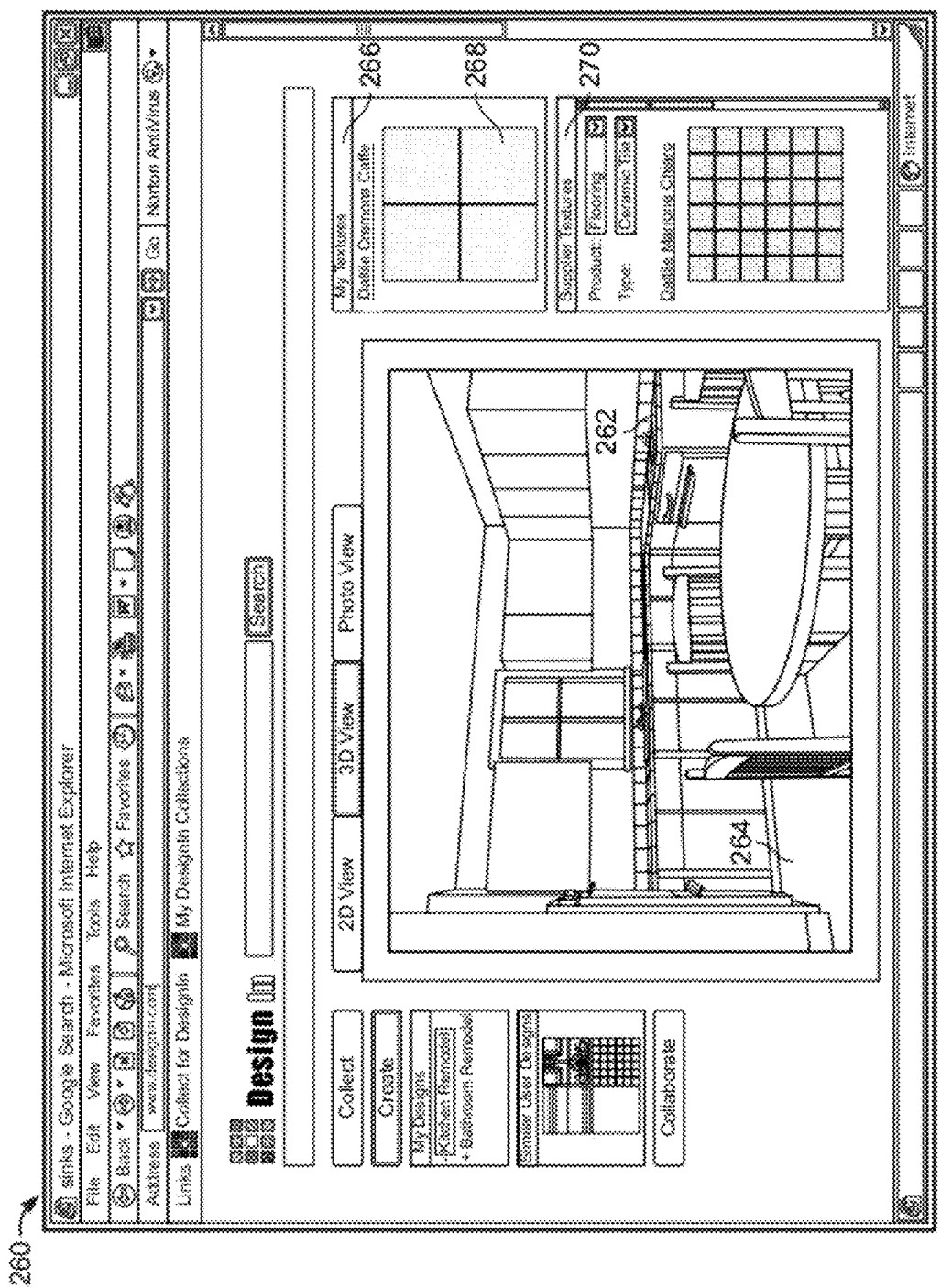
FIG. 17 is a diagram of a web interface with a three-dimensional room layout.

FIG. 17 shows a web interface 260 that includes a three-dimensional view 262 of a room based on a layout generated using two-dimensional CAD models. The three-dimensional view 262 allows a user to view the home design products and the placement of the products within the room. The home design tool includes two dimensional and three dimensional representations for most objects. In 3D, the system displays the 3D representation of objects included in a CAD drawing to generate objects having a visual appearance in 3D using auxiliary information from database and minimal user Input based on objects' properties that are specified in the two dimensional CAD drawing. The constructed representation includes polygons (triangles), which are displayed in 3D mode using standard graphics pipeline with parallel projection. The set of triangles is generated for rendering without special hardware acceleration and the rendering can be implemented using graphics technology (e.g., Macromedia Flash). Some implementations may use hardware acceleration to provide more realistic and more detailed geometry model rendering.

Figure 18:
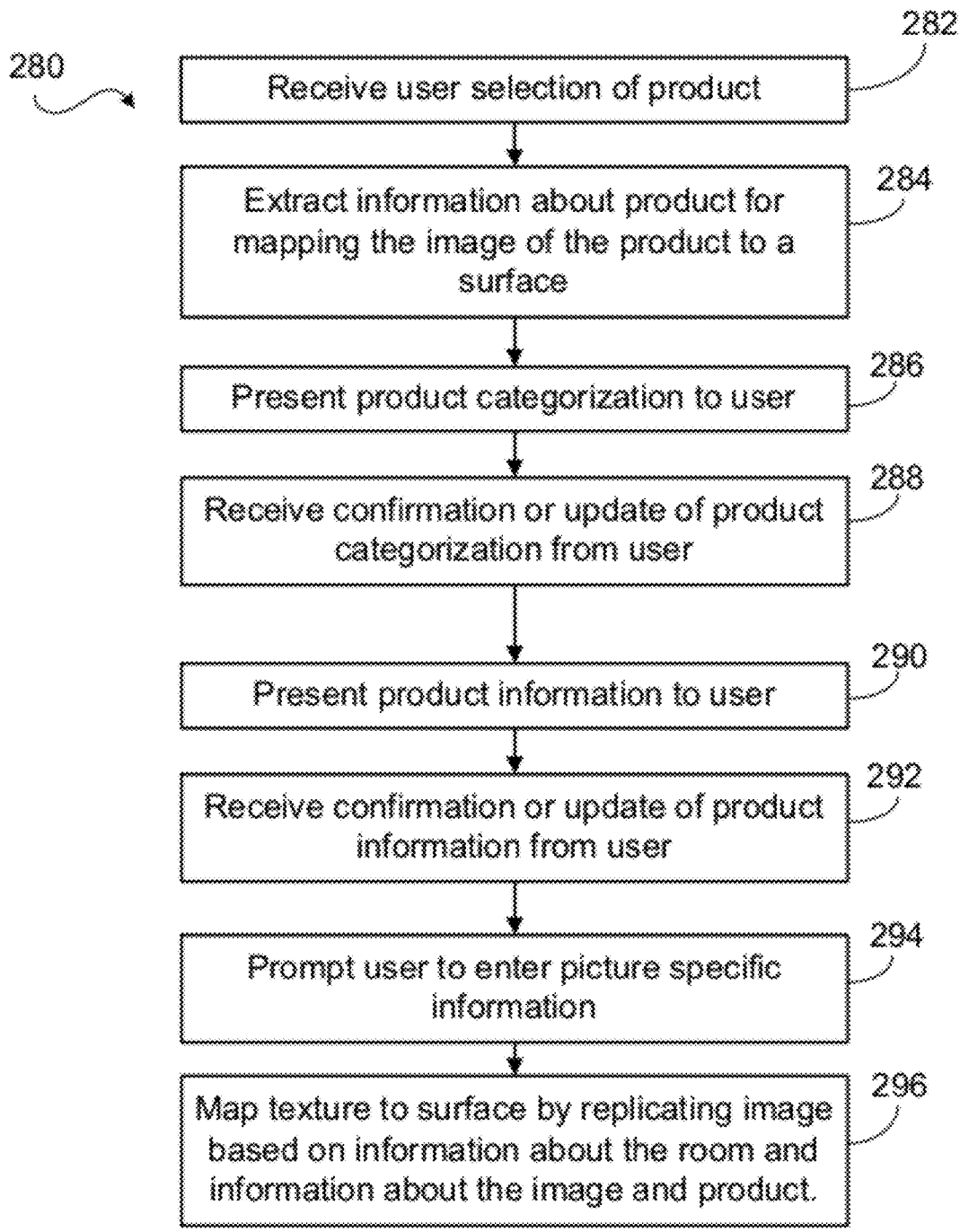
FIG. 18 is allow chart of a texture mapping process.

In order to provide the user with a visual representation of the floor and other surface coverings, the home design tool performs texture mapping of a product selected from a website based on an image extracted from the website. It is believed that providing texture mapping based on an image selected from the internet can provide-various advantages such as allowing a user to view any product they rind displayed on the internet rather than limiting the user to manufacturers who have provided texture mapping materials or models with texture maps associated with them, FIG. 18 shows a process 280 for generating and applying texture mapping of a texture shown in an image based on a user selection of the home design product exhibiting the texture. The home design tool receives a user selection of a product (e.g., a flooring, wall covering, or other product that has a texture to be applied to a surface) from a website (282) and extracts information about, the product (284). The home design tool presents product categorization information to a user based on information extracted from the website (286) and the user either confirms or updates the product categorization information (288). The home design tool also presents product information to the user (290) and receives a confirmation or an update of the information from the user (292). The extraction and confirmation of information (e.g., steps 282, 284, 286, 288, 290 and 292) are similar to the process described above in relation to generation of the visual bookmark for a home design product. In some implementations, the same extraction process can be used to extract the information for the texture mapping as for the visual book-marking and CAD model association. In order to obtain additional, information about what is shown in the image that is not available as text associated with the image on the webpage, the home design tool prompts the user to enter image specific information (294). Examples of Image specific information include the number of tiles shown in an image, the number of slats of hardwood shown in an image, the expected size of a non-regularly repeating texture such as carpeting or marble. The image specific information can also include information about how the texture might wrap around a sample object, what the parameters are for wrapping and projecting around an object, image clipping options, reflection properties, illumination mapping, scale, warping options and/or hump mapping options allowing the texture to not only be applied to surface(s) but allowing the texture to have detailed contours.

In some implementations, the system prompts the user with a preview of what the texture map might look like and automatically crops the image to make a consistent texture map or prompt the user to crop the image to make a consistent texture map. The system can also include hatching patterns to select from that represent how the texture maps. For example for 12" tile, the user would select a hatch pattern named 12" that has lines spaced about 12⅛" apart vertically and horizontally. The ⅛" allows for grout. The user may overlay the hatch pattern over the image and further align the hatch to the image. This in turn defines how the image will be repeated when mapped onto a surface. Another option is to interpret the image directly from the website and use a combination of the taxonomy based categorization, folksonomy based tags and neural network based learning to identify what type of repetitive characteristics and other properties of a texture. Then use the information to explore whether the texture meets these properties by comparing the pixels of the image with a vector based hatch pattern such as a grid defining a tile a pattern. In some implementations, the system can use the pixels of the image to identify the correct repetitive characteristics of the image. In order to do so the application will perform vectorization of the image using edge detection algorithms (i.e. Canny algorithm based on intensity jumps detection). If the vectors detected during this processing can be treated as texture mapping direction lines, then they are suggested to the user as an option for texture mapping.

The system may also include sample objects for defining how the texture will map around surface like couches and chairs. For example a stripped fabric could map in multiple directions to a couch. The system will provide tools for toggling how the texture maps to sample objects which in turn will define how the texture maps to 2D/3D CAD models in the design. The home design tool uses the information extracted from the product website in addition to the information received in response to the user prompt to map the texture to a surface by replicating the image to cover the surface and wrapping the image around a surface if required (296).

Figure 19:
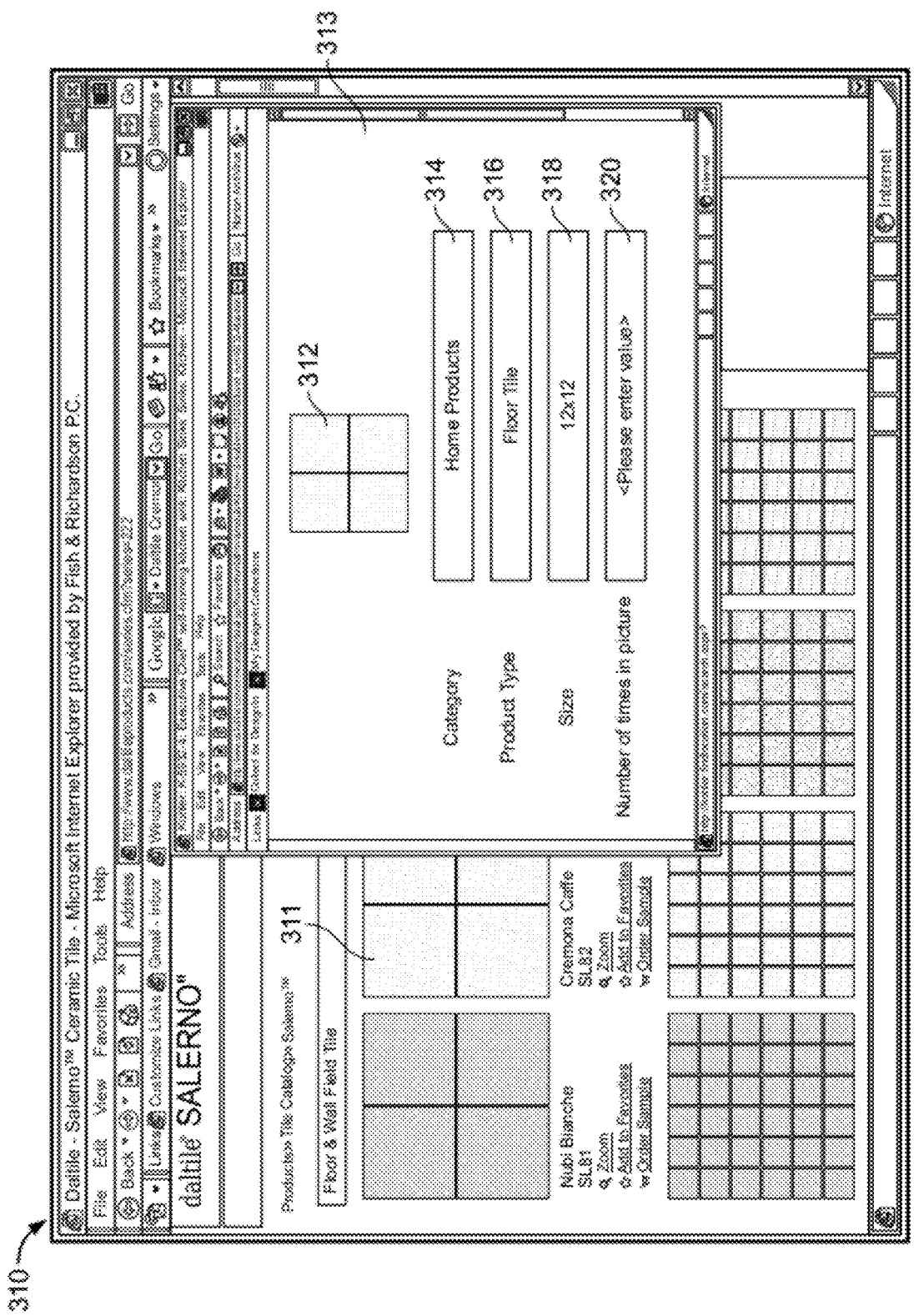
FIG. 19 is a diagram of a web interface and a menu for selecting product information related to a home design product.
Figure 20:
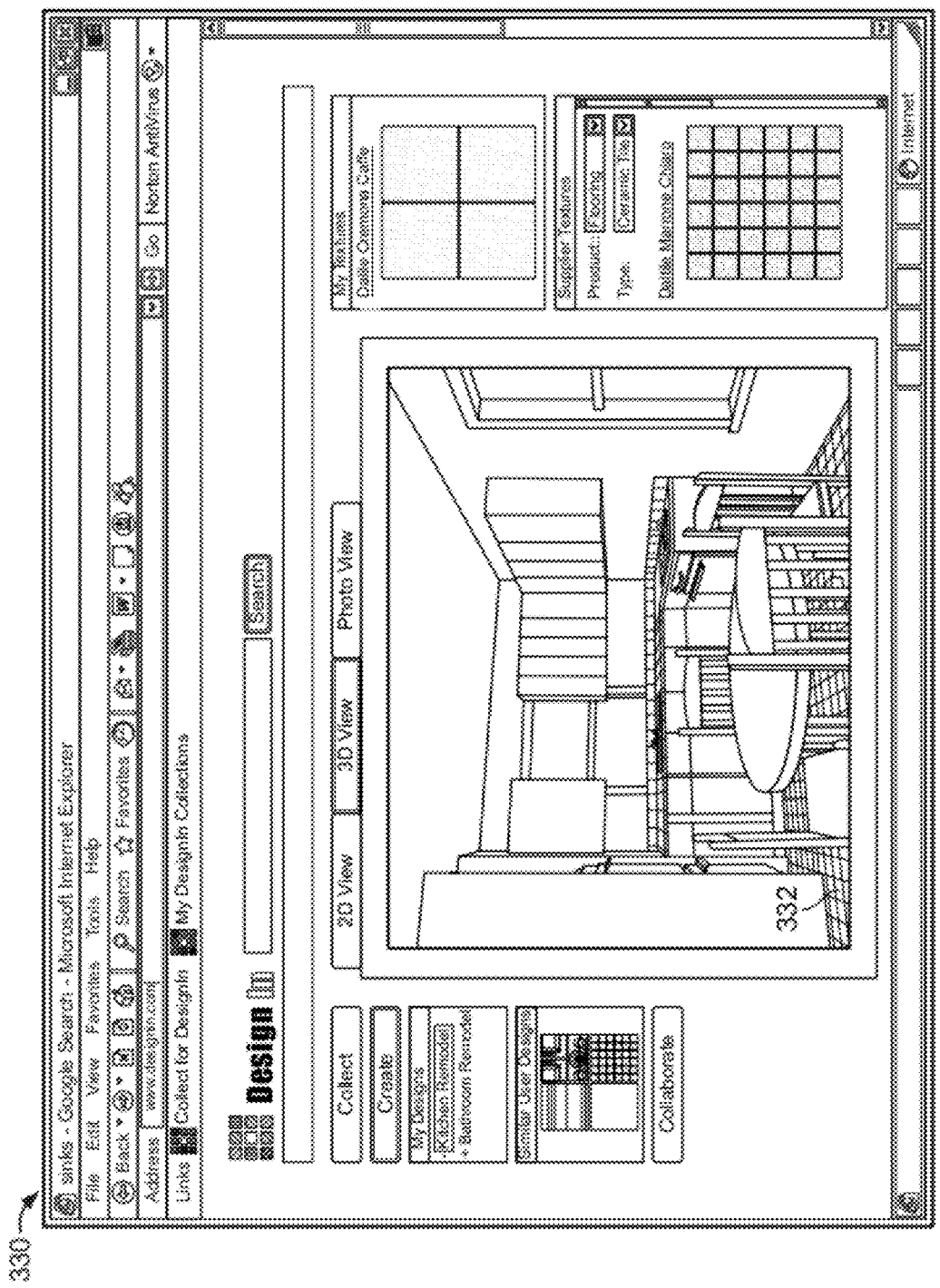
FIG. 20 is a diagram of a web interface that includes a three-dimensional room layout.

FIGS. 19 and 20 provide an exemplary texture mapping for a tile flooring based on an image of some tiles collected from a website. As described above, when the user selects a particular Image of the tiles, the home design tool generates a pop-up menu 313 that prompts the user to provide feedback about the product and about the selected image of the product. Some Information about the product such as the expected category (e.g., as indicated in block 314), product type (e.g., as indicated in block 316), and size (e.g., as indicated in block 318) is provided by the home design tool searching the webpage for the relevant information. The user views and confirms this information. Other information, such as image specific information, is not likely to be included in the text of the webpage. Therefore, the home design tool prompts the user to provide the information. As shown in FIG. 19, the home design tool prompts the user to enter the number of tiles shown in the image (e.g., as indicated in block 320). In this example, the user would input the number two for rows and two for columns since there are four tiles shown in the selected image. The automatic edge detection algorithm processes the image and detects the edges in the image and provides initial numbers (2 and 2) for the user to accept the input.

When the user goes into create mode, after receiving the information from the user, the home design tool maps the texture to a surface. For example, as shown in FIG. 17, the user could map the tile texture onto the floor 264 of the three-dimensional view of the room 262. For example, if the room 262 was ten foot, by ten foot, the home design tool could determine that the size of the image corresponded to a two foot by two foot (e.g., each tile is 12 inches by 12 inches and there are four tiles). As such, as shown in FIG. 20, the home design tool could size the image appropriately to replicate the image 25 times (e.g., 5 rows and 5 columns) to produce the effect of the texture appropriately sized for the surface.

Figure 21:
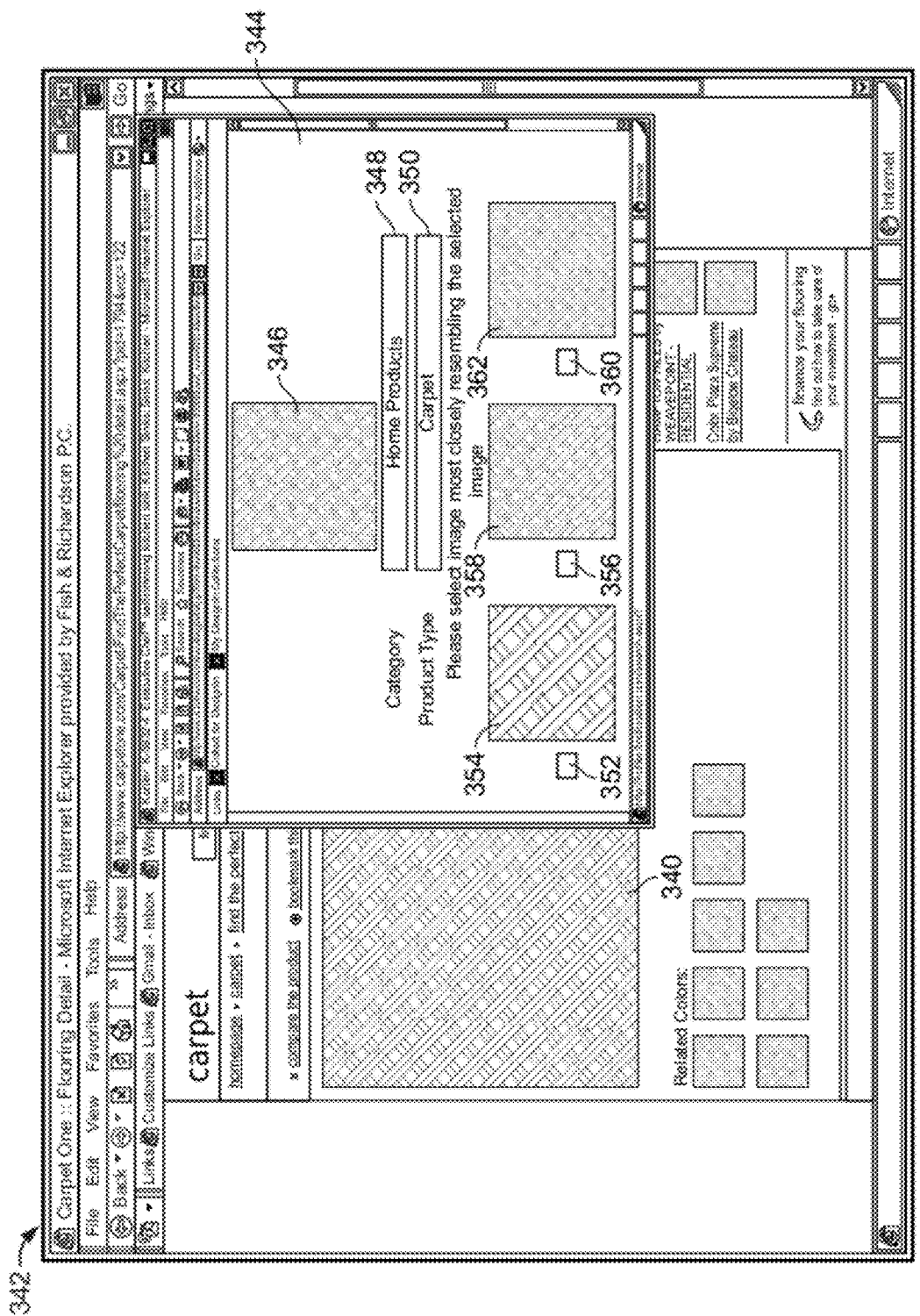
FIG. 21 is a diagram of a web interface that includes a menu for selecting product information related to a home design product.

While in the example above, the amount of area to be covered by one repetition of the image was discernable based on the size of the tile and the number of tiles shown in the image, in some examples the size is not easily determined from the image. For example, as shown in FIG. 21, a user may select a non-regularly repeating texture such as carpeting. In this example, the user has selected an image 340 of a carpet from a carpet manufacturer's website 342. The home design tool generates a pop-up window 344 requesting Input from the user. The home design tool automatically populates the category and product type for confirmation by the user (e.g.,  as shown in boxes 348 and 350). Since It may be difficult for the user to identify the expected scale of the carpet shown in the image, the home design tool displays various representative sized images of a similar type of carpet. For example, as shown in window 344, the home design tool presents a near view image of the carpet 354, a moderately sized image of the carpet 358, and a large area image of the carpet 362. The user selects the appropriate scale of the carpet in the image 346 by comparing the image 346 to the differently sized images 354, 358, and 362 and selecting the appropriate button 352, 356, or 360.

Figure 22:
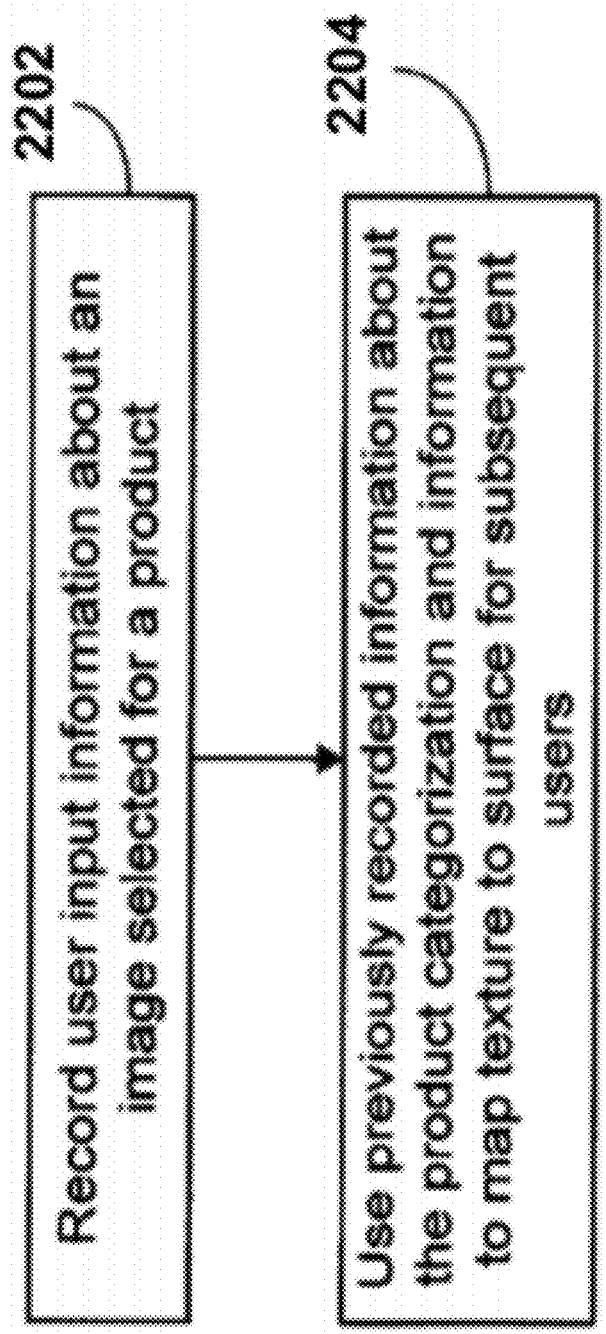
FIG. 22 is a flow chart, of a texture mapping update process.

The taxonomy based categorization and folksonomy based tags build the intelligence for the system, helping it identify which tag prompts to display for specific URLs and assist in mapping textures properly. As shown in FIG. 22, as users associate the various properties with images (textures) collected from a specific Web page, the system records the information (2202) and learns which properties are selected the most often and prioritizes user choices for texture mapping accordingly (2204).

It is believed that generating texture models for images found on the internet can provide various advantages. For example, since the home design tool makes the entire Web a content source for the texture maps, the users of the tool can select and use any carpeting, paint, tiles, hardwood, marble, and the like in designing a layout and is not constrained to manufacturers that offer texture models for their products. In addition the system provides a search feature for textures contributed by other users. As outlined above for product searches, the taxonomy based categorization, foe folksonomy based tags and user activity tracking offers a similar foundation for the system's texture search algorithms.

As described above, in addition to enabling a user to collect product information (e.g., by creating visual bookmarks) and enabling the user to create room layouts that include the selected product information, the home design tool also allows the user to collaborate with other users regarding various home design issues. For example, the user can collaborate with other users by searching of products that other users have selected or viewing room designs that other users have generated. In general, when a user creates a product collection or generates a floor plan, the user can select whether or not to make a product collection or the floor plan available for others to view.

Figure 23:
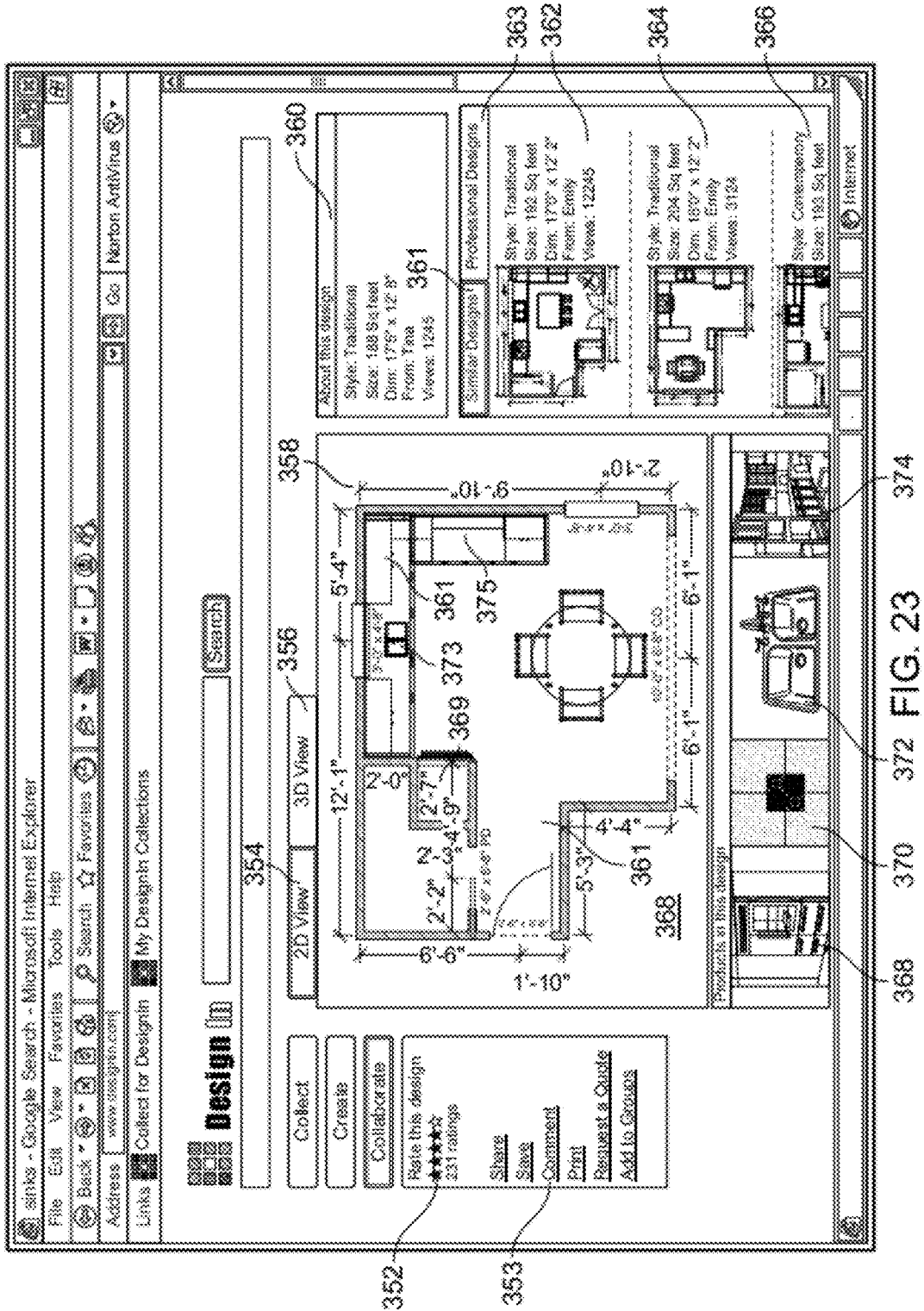
FIG. 23 is a web interface that Includes a two-dimensional room layout.

FIG. 23 shows an exemplary floor plan 358 that is shared for other users of the home design tool to view. It is believed that allowing other users to view the design can provide various advantages both to the person who generated the design and to those who are viewing the design. For example. In some Implementations, when others view the design they can rate the design (e.g., on a scale of 1 to 5 as shown in ratings 352) to provide feedback to the person who generated the room. Those viewing the design cars also provide comments 353 about the design. For example, if another user had previous positive or negative experiences with a similar room layout or with a particular product they could provide those comments about the design such that the person who generated the design would be aware of their positive or negative experience. The person who generated the room design can then decide whether or not to modify the design based on the feedback. It is believed that this type of information sharing can be beneficial especially to non-professional users who are attempting to design a room and may otherwise not have access to such historical information.

When a user shares their design, other users can view not only the CAD drawing of the room but also the home design products that the user has selected to place within the design.

Figure 24:
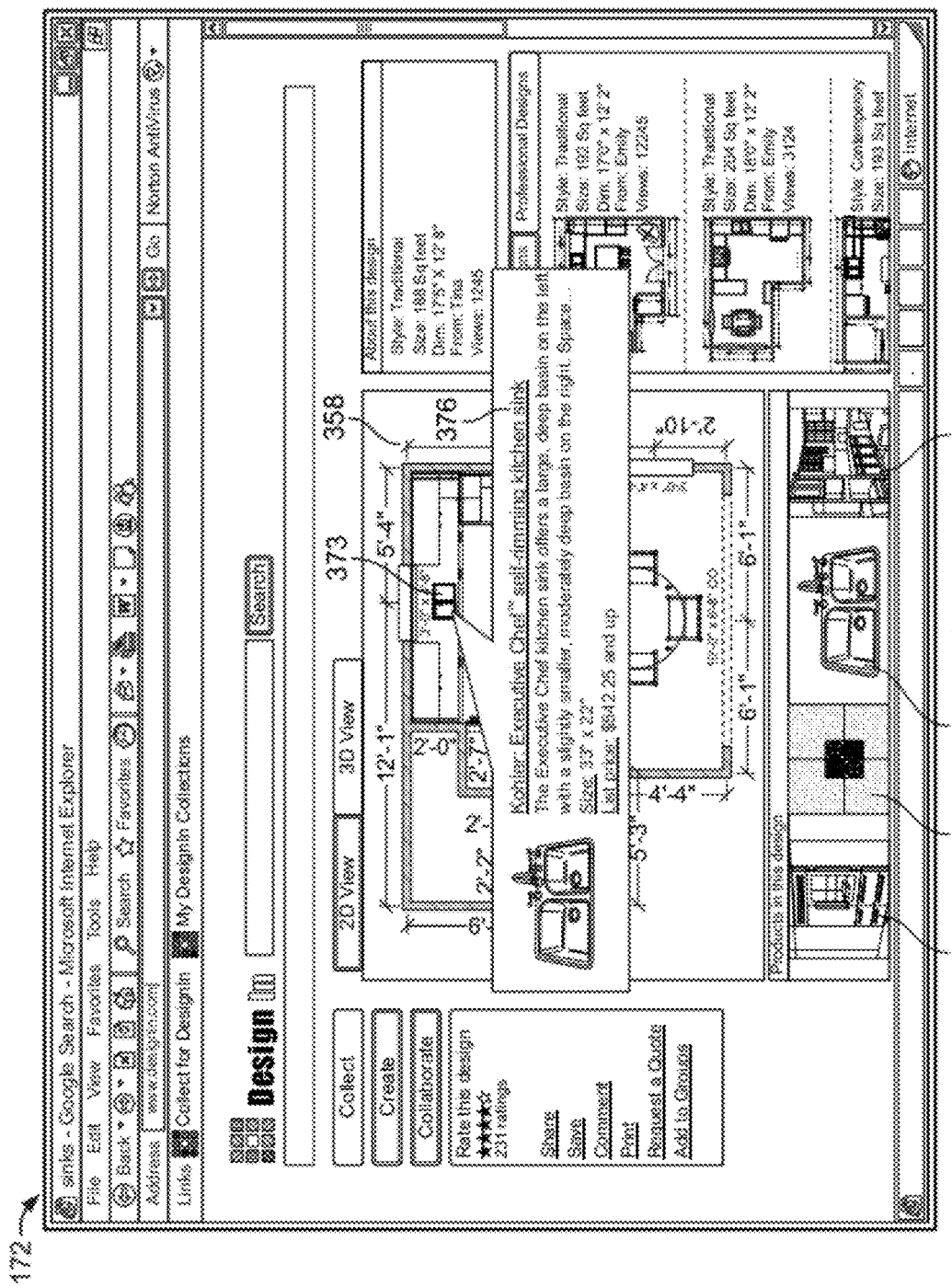
FIG. 24 is a web interface that includes a two-dimensional room layout.

In addition, to the CAD design, the home design tool displays images of the home design products included in the design. For example, in FIG. 23 the home design, tool displays an image 368 of the refrigerator 369 in the CAD drawing 358, an image 370 of the tile 361 included in the CAD drawing 358, an Image 372 of the sink 373 included in the CAD drawing 358, and an image 374 of the cabinets 375 included in the CAD drawing 358. As shown in FIG. 24, in addition to providing the images 368, 370, 372, and 374 of the home design products the home design tool can allow the person viewing the design to see additional information relating to the home design product by moving a cursor over the product in the CAD model 358. For example, when the user positions their mouse over the CAD model 373 of the sink a message 376 appears that includes the visual bookmark information associated with the CAD model for the sink. It is believed that this can be beneficial because the user can easily view information about a home design product that another user has included in the room design without searching for the information themselves.

In addition to viewing room designs generated by other users, in some implementations, the home design tool allows users to search a database of room designs generated by other users to find rooms with similar floor plans. For example, as shown in FIG. 23, in collaborate mode, the home design tool provides the user with a list of similar designs 361 and the ability to search. The similar designs are designs with similar floor plans (e.g., similar room shape, room dimensions, window placement, door openings and/or door placements) that have been generated by other users of the system. Similar designs may also be found by using taxonomy based and folksonomy based tags that users have assigned to their entire floorplan, individual rooms and products in the design. For example, a user may choose, artisan, country, contemporary, hip, or traditional for a design style from the taxonomy based lists of design styles. The user may also choose add folksonomy based tags like breakfast nook, colonial, island, mud room entrance, pantry to identify some characteristics of his/her design. Lastly the system may generate searchable tags based, on the characteristics of the designs. For example if the user draws a center island in his/her design, the system may tag the design with words like "island" and "center island". Similar algorithms are used to search for entire floor plans.

Figure 25:
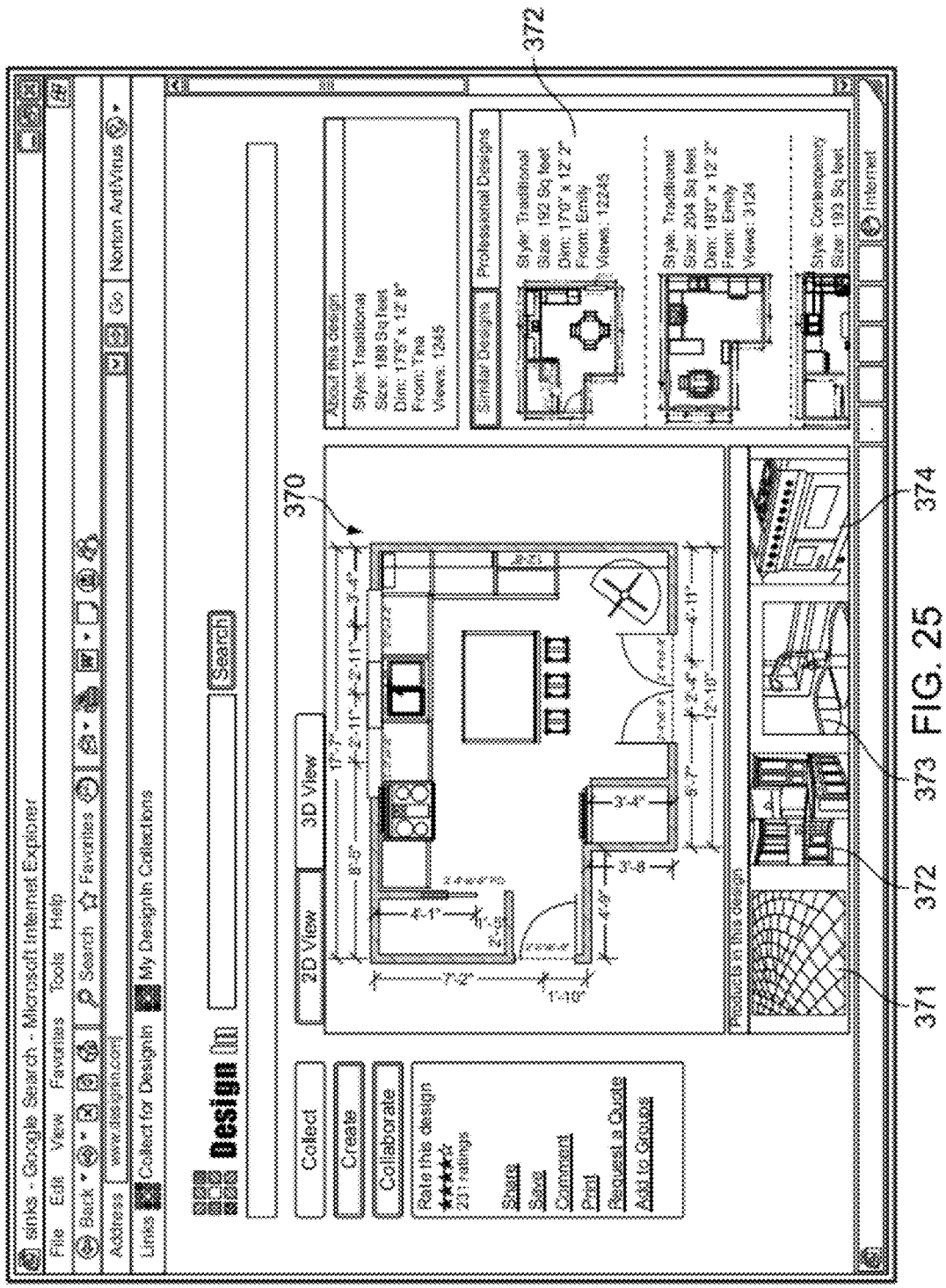
FIG. 25 is a web interface with a two-dimensional room layout.

Designs 362, 364, and 366 are exemplary designs included in a list of similar designs 361 for the room design shown in CAD model 358. While the designs included in the similar designs may not perfectly match the floor plan of the room designed by the user, they can still provide valuable information about how other users have organized the layout and design of a similar room. If a user desires to view one of the designs included in the list 361 of similar designs 361, the user selects the design from the list and the design is displayed by the home design tool. For example, as shown in FIG. 25, if the user selects design 362, the home design tool would present the CAD model 370 associated with design 362 and the products 371, 372, 373, and 374 included, in the CAD model 370 for the user to view. When the user navigates to a design, previously included in the list of similar designs, the home design tool adds the previously viewed design to the list of similar designs (e.g., the previously viewed CAD model 358 is included as a design 372 in the list of similar designs for the CAD model 370).

Figure 26:
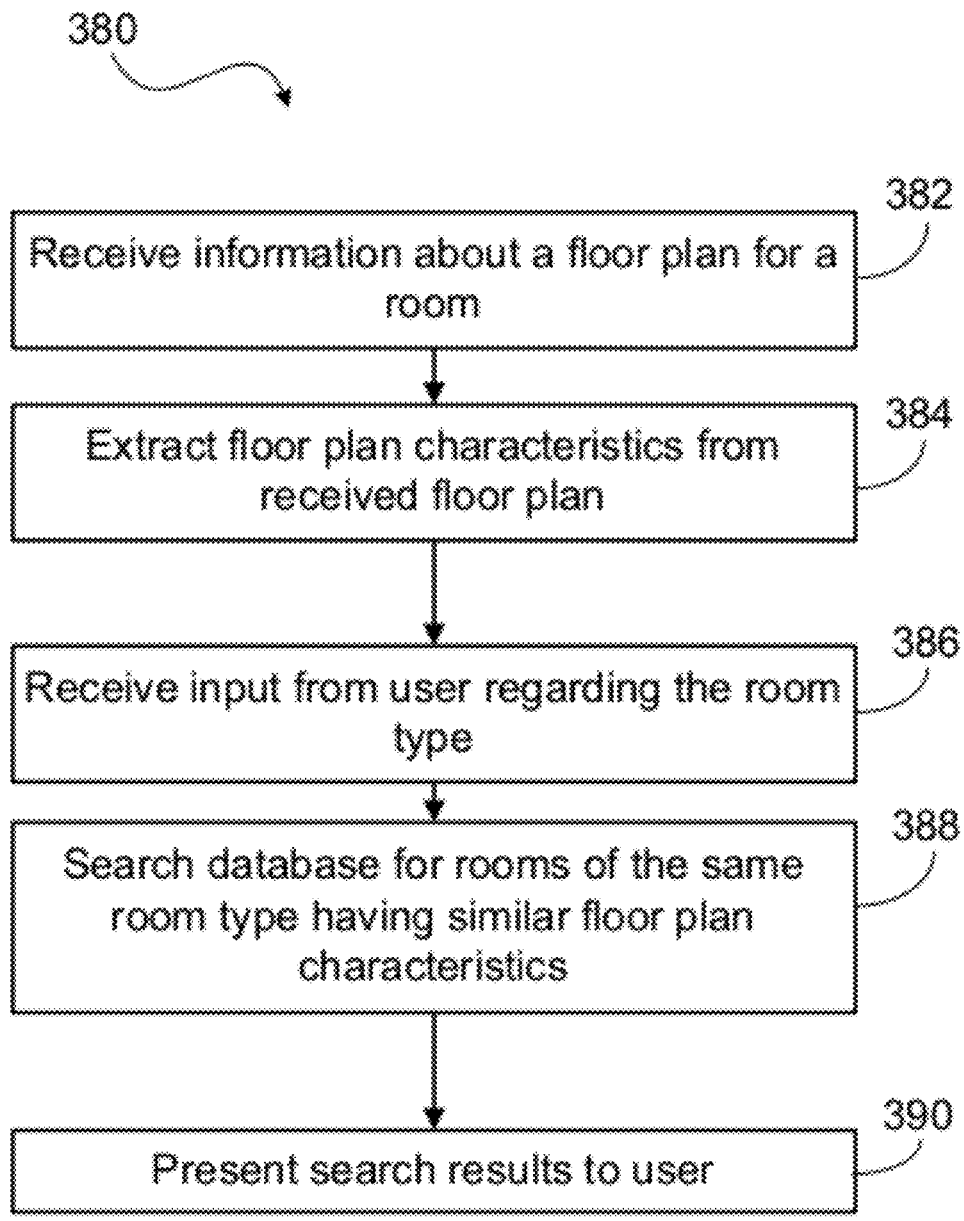
FIG. 26 is a flow chart of process for searching for related room designs.

FIG. 26 shows a flow chart of a process 380 for generating and displaying similar designs based on a vector based search. In order to search for similar designs, the home design tool received input regarding the floor plan of a room for which they would like to view similar designs. The system receives the information about of the floor plan from the user (382) and extracts floor plan characteristics from the received information (384). Exemplary floor plan characteristics include room shape, room dimensions, window placement, door openings and/or door placements. The user can provide the information about the floor plan in various forms.

Figure 27A:
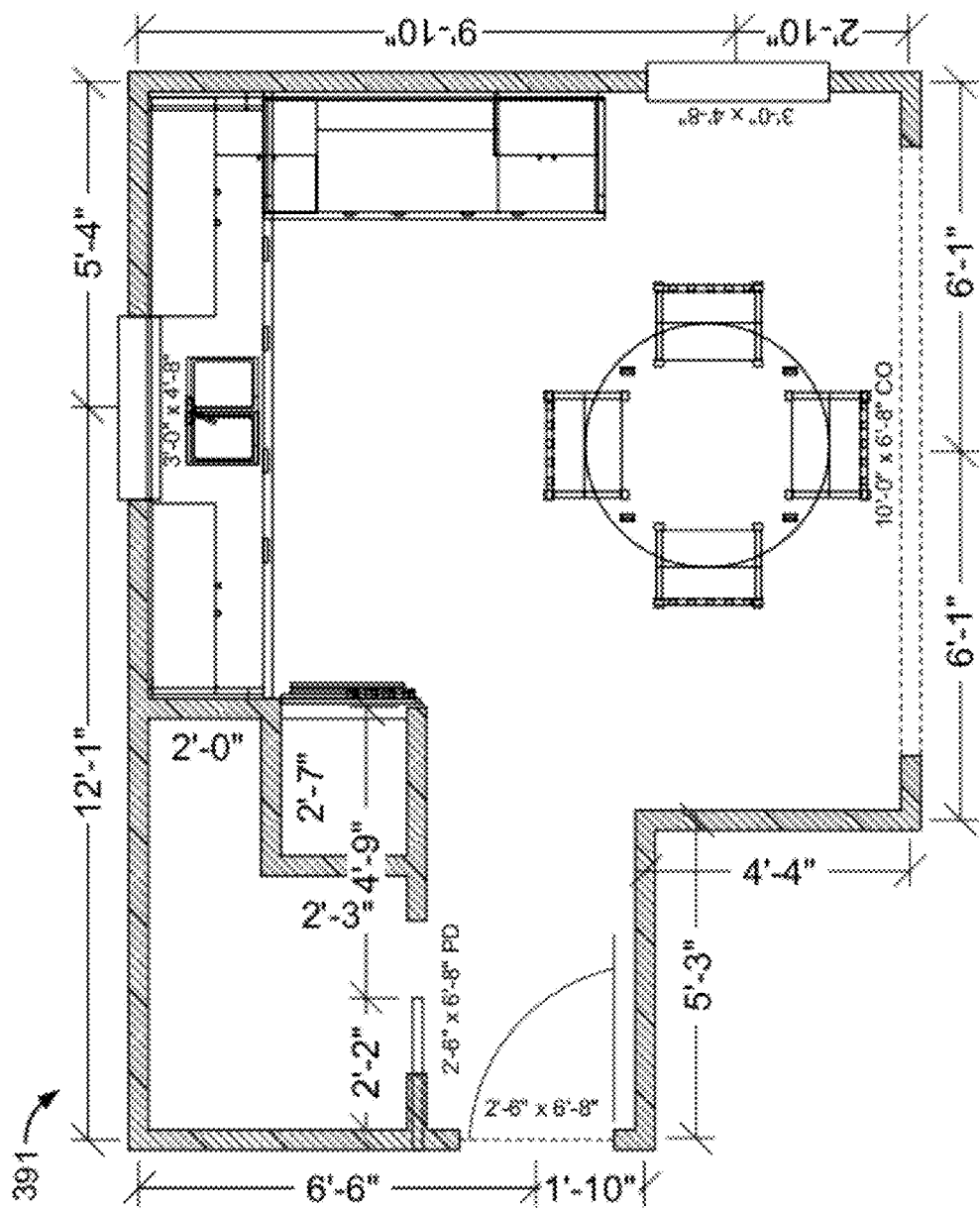
FIG. 27A is a CAD model of a room.

For example, in one implementation as shown in FIG. 27A, the user can provide a CAD model 391 of the floor plan. From the CAD design the home design tool can extract the location of doors, wall openings windows as well as the shape and dimensions of the room. In general, vector graphics (also referred to as geometric modeling or object oriented graphics) is based on the use of geometrical primitives such as points, lines, curves, and polygons, which are ail based upon mathematical equations to represent images in computer graphics. Vector graphics differs from raster graphics, which is the representation of images as a collection of pixels (dots).

Figure 27B:
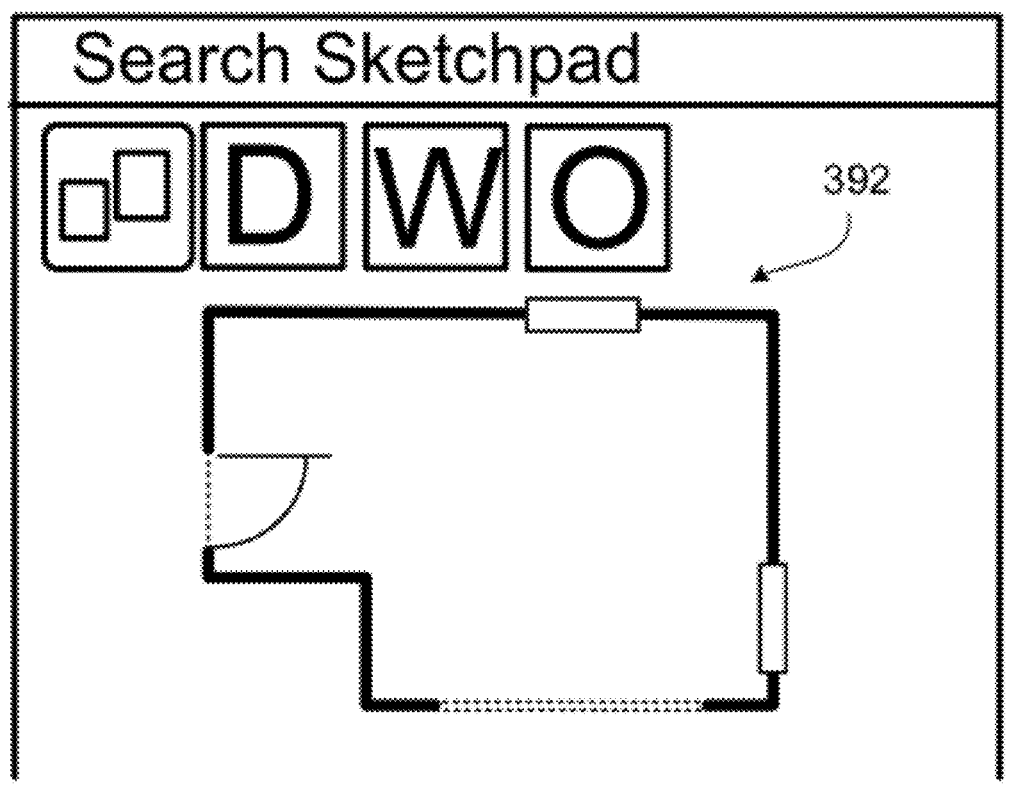
FIG. 27B is a sketch of a room.

As shown in FIG. 27B, in another implementation the user can provide information about the floor plan in the form of a sketch 392 of the room. For example, the user can sketch the room using their mouse or other computer input tool. In the search, sketch pad the user can draw walls and add windows, doors and wall openings. The search algorithm first looks for rooms that have a similar shape such as L-shaped or rectangular. Next the system identifies rooms that have a similar dimensions for the room walls (closets may be ignored). Next the system identifies similar window, door and wall opening locations. In addition the system compares the users' collections with products/visual bookmarks within the search results and prioritizes them based on similarity. The results of the search are basing on a set of heuristically defined metrics for the design and should not necessarily result in only exact matches. Close matches are also reported to the user.

In some implementations, the user can set importance of search criteria such as room dimensions; wall, window and wall openings; and similarity of objects in the design to the users collections to find designs with similar tastes and dimensional information. These importance parameters are used as coefficients in search algorithm to raise or lower the weight of different metrics in search results.

The taxonomy based categorization of room names, the folksonomy based tags for assigning criteria to rooms and user activity tracking offer the foundation for the system's product search algorithms. Users may type a room name and characteristics into the search field. The system identifies and prioritizes the most popular room designs for the specific terms based on what room categories and tags a user assigned to the design, how many users have bookmarks these designs, how many users have incorporated these room designs within their own designs and how many users have viewed the designs. The algorithm relies primarily on the shape, size and similar products variables as outlined above. At the second level the system relies heavily on how many users incorporate another user's design into their designs since this shows that this design is popular. Advertisements (entire room designs created by advertisers) may also appear in search results using similar criteria as to other users designs. Advertisements that are already incorporated in other designs will also be included in the calculation even if the design was edited. After typing a search term into the search field, specifying that the users is searching for designs, and clicking the search button, the system presents the user with results based on the algorithm outlined above. On the left side of the screen, the user is presented with options to refine the search. For example if a users types in l-shaped kitchen within the search box, the results appear and on the left side of the system automatically assigns a room name of kitchen and a tag of L-shaped. The system may also present the user with the design styles like artisan, country, contemporary, hip, traditional. These styles are taxonomy based characteristics assigned to design by the users at the time of creation. Additional options for refining search results are outline below.

It is believed that allowing a user to search for designs based on a sketch can provide the advantage of allowing the user to easily search for related floor plans without having to commit the time and effort of generating an entire room design. In addition it offers a unique advertising opportunity for advertisers to offer complete room, designs all with brand name products that they manufacture or sell.

Figure 29:
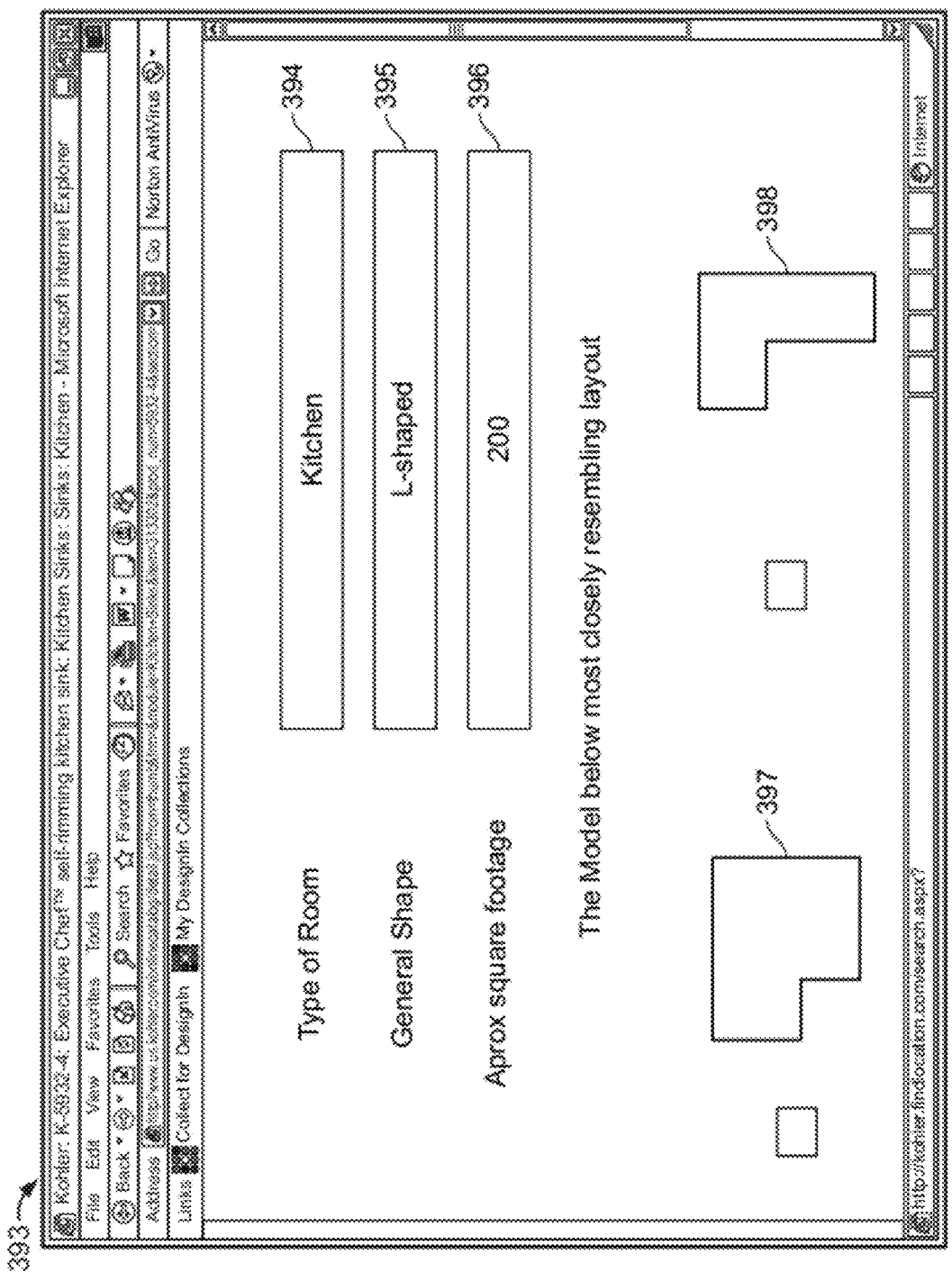
FIG. 29 is a selection menu.

As shown in FIG. 29, in another implementation the user can provide information about the floor plan by inputting information about the room plan using a text based user interface 393. For example, the user can enter information about the room type 394, shape 395, and square footage 396. In some implementations, in order to better refine the information, about the room, the home design tool can present the user with exemplary room layouts (e.g., layouts 397 and 398) based on the limited information such that the user can select the room design most similar to what they are attempting to design. The exemplary room layouts presented to the user can be based on room layouts that are frequently viewed or are included in the system that match the criteria input by the user.

Figure 28:
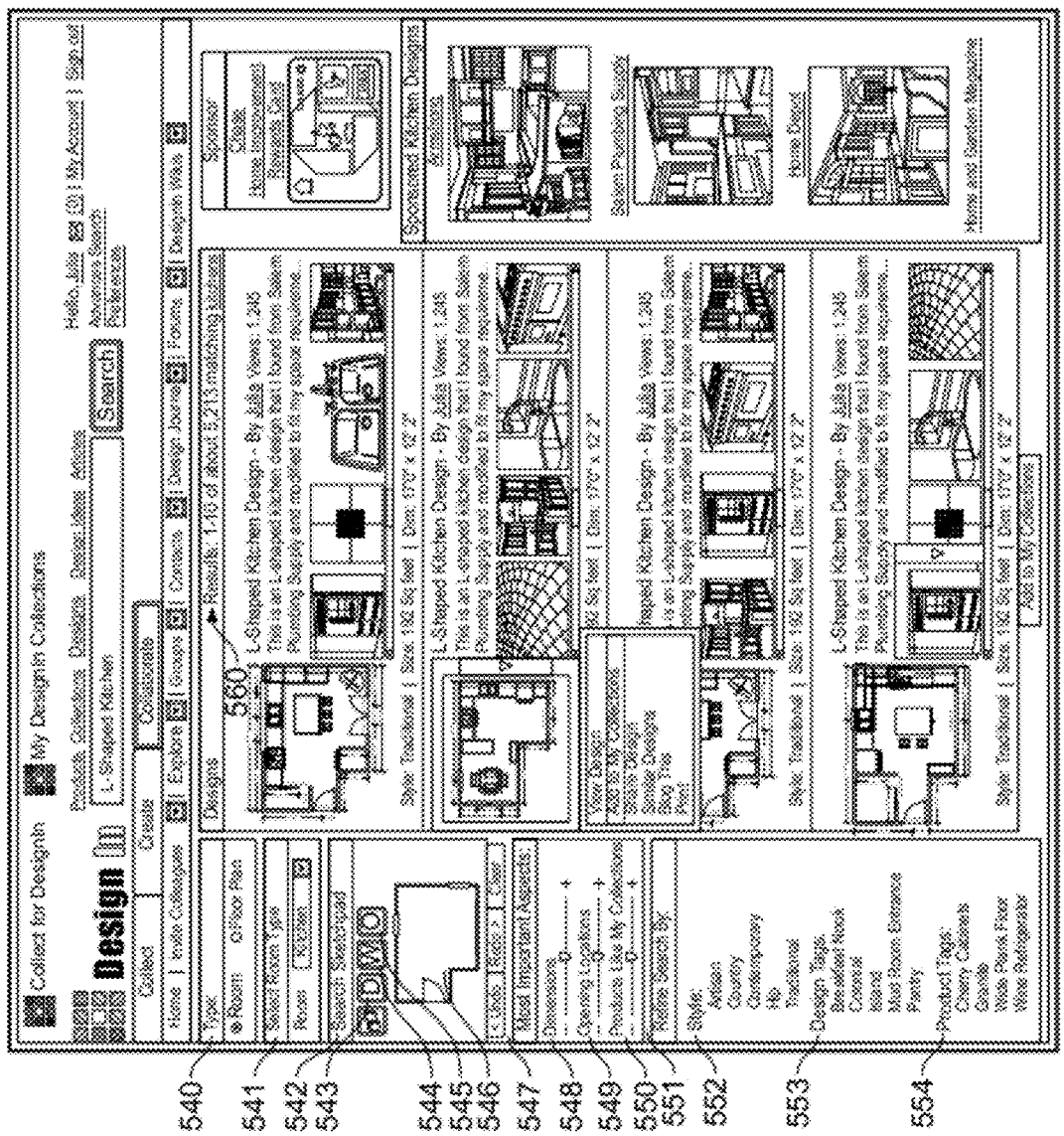
FIG. 28 is a web interface.

FIG. 28 shows how the user can select a room, type and then draw walls, windows, doors and door openings in the search sketch pad to find room designs to use in their overall FloorPlan. The user can set importance of search criteria such as room dimensions; wall, window and wall openings; and similarity of objects in the design to the users collections to find designs with similar tastes and dimensional information. Users can drag these rooms into their designs to become part of the overall floor plan as outlined below or simply use the room as a starting point or to gather ideas for their own designs.

For example, the home design tool can receive one or more inputs from the user that rank or select properties of room designs that can be used to sort the search results. This searching allows the user to view room designs that are most similar in shape and/or design to their room based on the received inputs.

The design tool allows the user to enter the type of floorplan they are searching for. For example, the user can search for either a room or an entire floor plan (as indicated by arrow 540). In order to select either the room or floor plan as the type of design for which, the user is searching, the user clicks on the appropriate button in the home design tool.

The user can also enter a room type that can be used to further limit the search results presented to the user (as indicated by arrow 541). By entering the room type, the user can view only rooms that will be used for the same function as their intended use of a room. For example, if a user is searching for kitchen designs, it can be beneficial to present only kitchens having similar shape and design to the room rather than present bedrooms or other types of rooms. Exemplary room types include bedroom, bathroom, living room, kitchen, study, play room, dining room, and the like.

The home design tool also allows the user to enter the basic shape of the design (e.g., as described above in relation to FIGS. 27A and 27B). In some implementations, the home design tool includes a search sketchpad 542. The search sketchpad is a tool that allows the user to enter the general shape of the room and any doors (using door button 543), windows (using window button 544), and other openings (e.g., using openings button 545).

In addition to the type of room (as indicated by arrow 541) and the general shape of the room entered in the sketchpad 542, other information can be used to further limit the search results. For example, information about the importance of various search criteria can be entered, for example, based on a slider bar for each type of information that ranks the importance of that feature. The home design tool uses the information about the importance of the various features to filter the search results. As shown in FIG. 28, the user can select the amount of relevance the home design tool places on the dimensions of the room (as indicated by slider bar 548). If the slider bar is moved to indicate a greater emphasis on the dimensions of the room (e.g., moved to the right), the home design tool will limit the displayed search results to rooms having dimensions more closely matched to the dimensions entered by the user. The user can also select the amount of relevance the home design tool places on the openings of the room such as any doors or windows (as indicated by slider bar 549). If the slider bar is moved to indicate a greater emphasis on the openings present in the room (e.g., moved to the right), the home design tool will limit the displayed search results to rooms having openings more closely matched to the openings entered by the user. The user can select the amount of relevance the home design tool places on the products in their collection of visual bookmarks (as indicated by slider bar 550). This allows the user to limit the search results to designs with similar products as those that have been gathered and selected by the user. If the slider bar is moved to indicate a greater emphasis on the matching the types of products (e.g., moved to the right), the home design tool will limit the displayed search results to rooms that include home design products more closely matched to the home design products stored in the user's collection of visual bookmarks, it is believed that allowing the user to limit the displayed search results based on the types of products they have stored in their visual bookmarks can provide the advantage of allowing the user to more easily locate designs that may be of interest to him/her. For example, if the user has generated visual bookmarks for products with a very contemporary style, they are not likely to have interest in a rustic, country themed design. As such, by filtering the results based on the visual bookmarks of the user, the user may be presented with results that have a more contemporary feel The room dimensions, room openings, and type of home design products can be used to filter the search results (e.g., as indicated by slider bars 548, 549, and 550 respectively). Other characteristics could be used in addition or instead of these features.

In some implementations, e.g., as shown in FIG. 28, the user can refine the search results to display rooms with particular characteristics. For example, a user might desire to have a contemporary feel to the room. In order to filter the results to show rooms having the desired contemporary feel, the home design tool presents the various style categories (as indicated by arrow 552) and the user can select to view only rooms that have a desired style. In addition, the user of the home design tool could also select to limit the search results to rooms having particular type tags (as indicated by arrow 553) or product tags (as indicated by arrow 554) included as part of the design. The type tags (as indicated by arrow 553) provide categories of designs that are sorted based on the type of room. The product tags (as indicated by arrow 554) provide categories of designs that are sorted based on particular products. For example, if the user has selected a type of cabinets they would like to use in their design, then they can search for only rooms that include that type of cabinets.

After the user has entered search specifications to search for rooms based on the entered information, the home design tool presents the search results in a list of search results 550. The list of search results can be displayed in an order of relevance. For example, the home design tool can rank each of the search results using a relevancy score that is based on the filtering characteristics entered by the user. The designs can be displayed in the search results list based on the relevancy score. For example, designs that have the highest relevancy score (e.g., the designs that most closely match the entered characteristics) can then be presented at the top of the search results list 550 so that the user can view the most relevant results first. In the exemplary search and search results shown in FIG. 28, the search parameters entered by the user has resulted in 5,213 potentially matching room designs. The designs have been sorted for relevance based on the preferences entered by the user and the ten designs that have the highest relevancy score have been displayed on the user interface (note only 4 of the 10 are shown in FIG. 28). The user can view additional results by selecting a button to navigate to the next set of results ranked in terms of relevance (e.g., the results ranked 11 to 20), The search results can be displayed to include various information about the room design. For example, as shown in FIG. 28, the search results can be displayed to include information that is believed to be beneficial to the user in determining whether to view the design. For example, the search results can include a CAD model of the room, a short description of the design, and pictures of home design products used in the room. The search results can also be displayed to show the style, size and dimensions of the room.

Referring back to FIG. 26, after the home design tool receives information about the floor plan (382) and extracts the floor plan characteristics (384), the home design tool receives information about the room type from the user (386). By providing the room type, the search results can be limited to the same type of room (e.g., kitchen, living room, bedroom, study, play room, dining room, etc.). The home design tool, searches for rooms having the same room type and similar floor plan characteristics (388). The user may also type words such as room names, architectural styles, room characteristics and any other term, that may help refine the search into the search field to find designs of interest. The system uses taxonomy based categories and folksonomy based tags to identify matches. The system also presents the user with a list of categories and tags to further refine the search. This search can be a vector based search in which the system identifying similar designs as outlined above. The input could also be raster graphics from a user scanned and imported sketch of their design. After generating a list of related room designs based on the search algorithm, the home design tool presents the search results to the user (390).

In some implementations, a user may input a floor plan that includes multiple rooms into the home design tool and subsequently desire to make changes to a particular one of the rooms, hi order to make changes to one of the rooms in the floor plan it can be beneficial to have the room be able to exist as a reference to an overall floor plan. As a referenced room that may be able to be viewed separately from the other rooms in the floor plan, the user can view, edit, and share the room using the home design tool. The user can also use the home design tool to search for other rooms having similar layouts.

Figure 30:
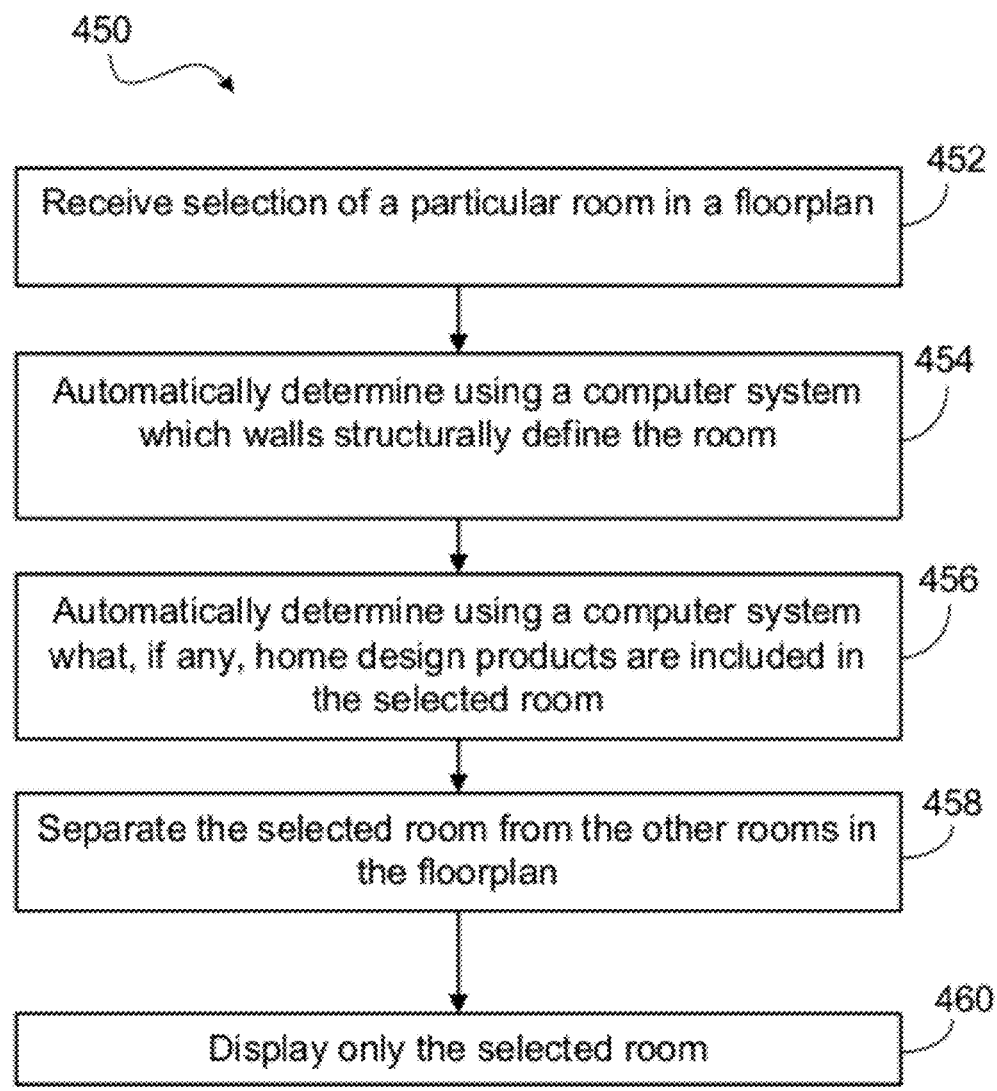
FIG. 30 is a flow chart of a process for separating adjoined rooms in a floor plan into separate, non-adjoined rooms.

FIG. 30 shows a process 450 for separating or referencing a room from adjoining rooms (e.g., rooms that share walls) in a floor plan. The user can draw an entire floor plan using walls, doors, windows and other objects. In order to view a particular room from the floor plan, the user selects a room to view. For example, the user can select the room by clicking on the room using a mouse or other selection device. When the user selects a room, the home design tool receives the selection (452) and automatically determines which walls in the floor plan that includes multiple adjoined rooms structurally define the selected room (452). The system determines which walls belong to the room by looking for walls that define the space as well as room divisions where the user has used a room divider tool designated by a dashed line that shows that even though two rooms are connected in an open floor plan, there are two distinct spaces. As the user creates rooms with wall tools and room divider tools, the system prompts the user to name rooms. The system may automatically prompt the user for a name if objects related to a specific room such as a kitchen are included in the design. The home design tool also automatically determines which, if any, home design products are included in the floor plan for the selected room (456). The system determines which home design products are to be associated with the room by the boundaries of the room and any objects such as doors, windows and wall openings are included in the boundary walls. Objects inside the room or attached to the interior of the walls are also included as part of the room. After determining which walls and home design products should be included in the room, the home design tool creates a reference of the selected room from the other rooms in the floor plan (458) and displays only the selected room to the user (460).

Figure 31:
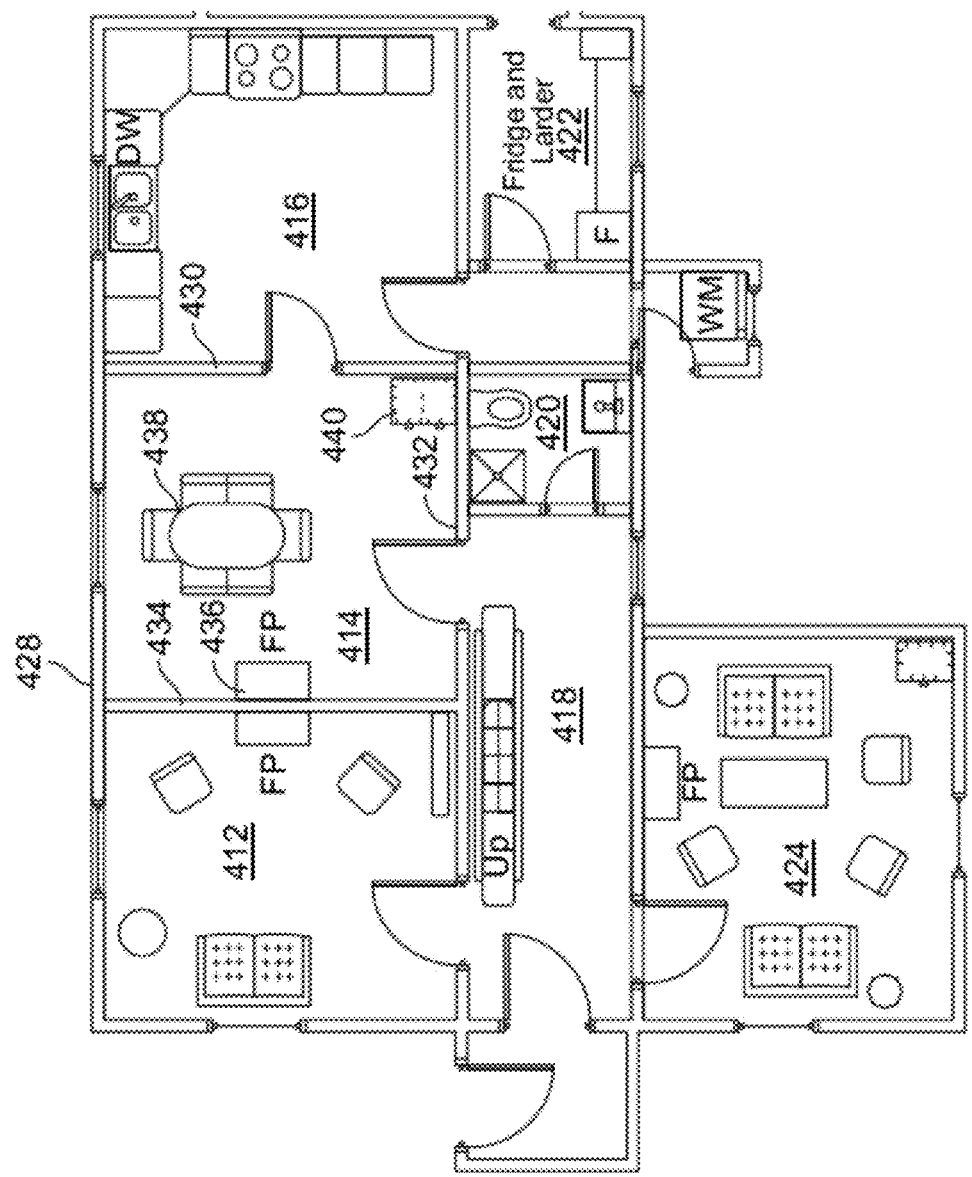
FIG. 31 is a diagram of a floor plan.
Figure 32:
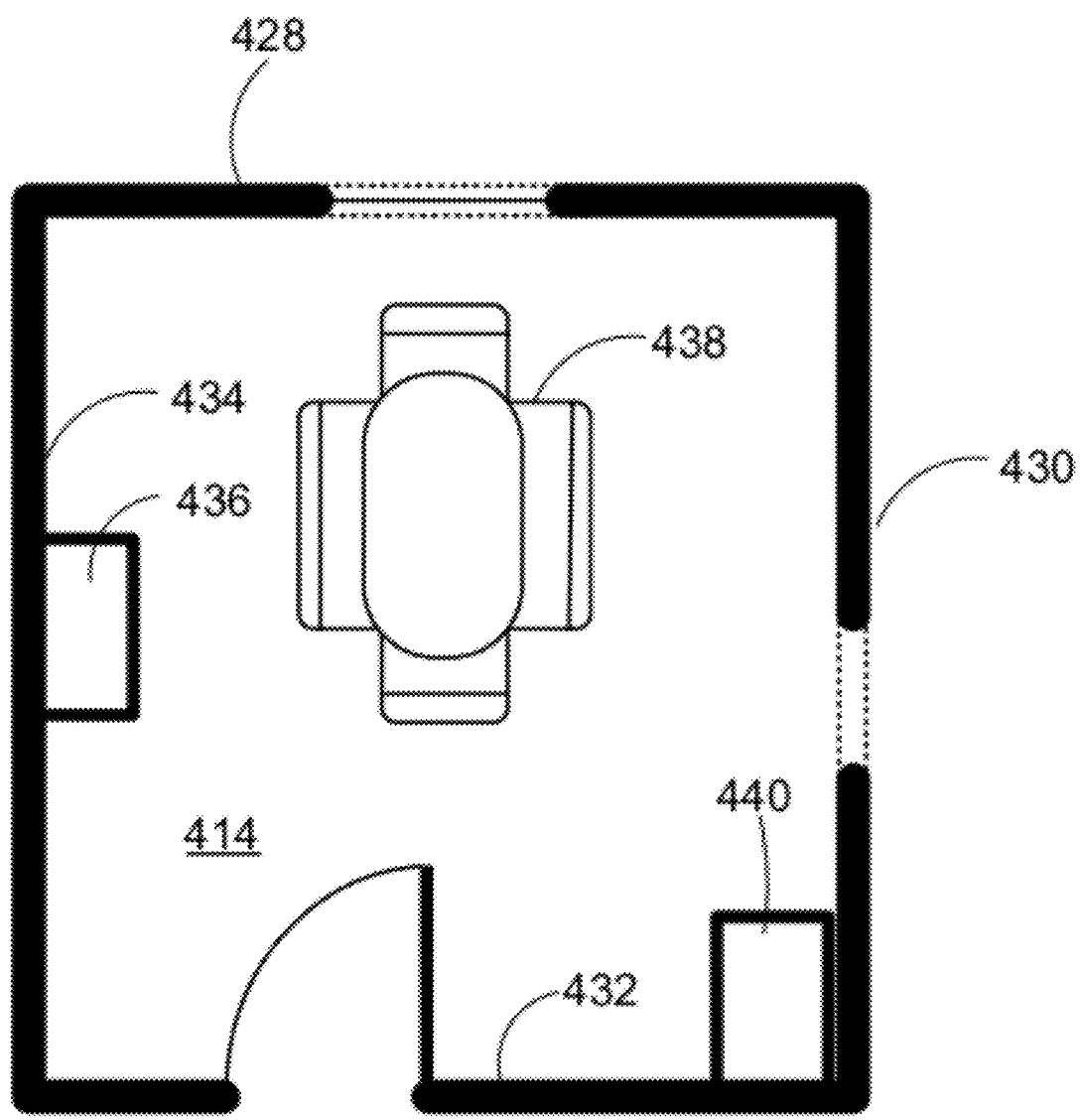
FIG. 32 is a diagram of a room from the floor plan of FIG. 31.

FIGS. 31 and 32 show an example of referencing a single room from other rooms in a floor plan. As shown in FIG. 31 a floor plan 410 includes multiple rooms 412, 414, 416, 418, 420, 422 and 424 that share common walls. A user may desire to view and/or edit a single room from the floor plan. For example, if the user desires to view and/or edit the dining room 414, the user can select the dining room 414 by clicking on the dining room 414 using a computer based selection tool such as a mouse or keyboard. Upon receiving the selection, the home design tool automatically determines that the dining room 414 is defined by walls 428, 430, 432, and 434 and that the dining room includes a table 438, a fireplace 436 and a cabinet 440. The home design tool either generates a dining room separate from the floor plan 410 based on the walls and home design, products included in the dining room 414 (e.g., as shown in FIG. 32) or simply references these elements in a separate view. As can be seen in FIG. 32, the separated dining room 414 includes the same walls 428, 430, 432, and 434 and the same table 438, fireplace 436 and cabinet 440 that were included in the entire floor plan 410.

After the user has referenced or separated one room from, the other adjoining rooms in a floor plan, the user can edit or change the floor plan for the newly non-adjoined room. The user may edit anything within the room while viewing the room independently except the walls that define boundary of the room and windows, doors and wall openings included in these walls. Walls, windows, doors, and door openings maybe added within the room during this view mode, After completing the edits, the user may return to view the entire floor plan and the edits appear within this view as well.

It is believed that referencing and/or separating a floor plan into individual rooms can provide various advantages. For example, by dividing floor plans into rooms within the database included in the home design tool, not only the entire floor plan but now every room generated by each user can be easily explored, searched on, viewed, edited, and incorporated into other designs. This allows other users to drag an entire room from another user into their floor plans, as a staring point for their own designs. As soon as the user makes any edits to the room design that they incorporated into, their design, the system breaks the reference to the original, design. In other implementation, the system will break the reference as soon as a user drags another user's room design into his/her floor plan. However, users may be able to select a hyperlink back to the original design to view the original design.

Figure 33:
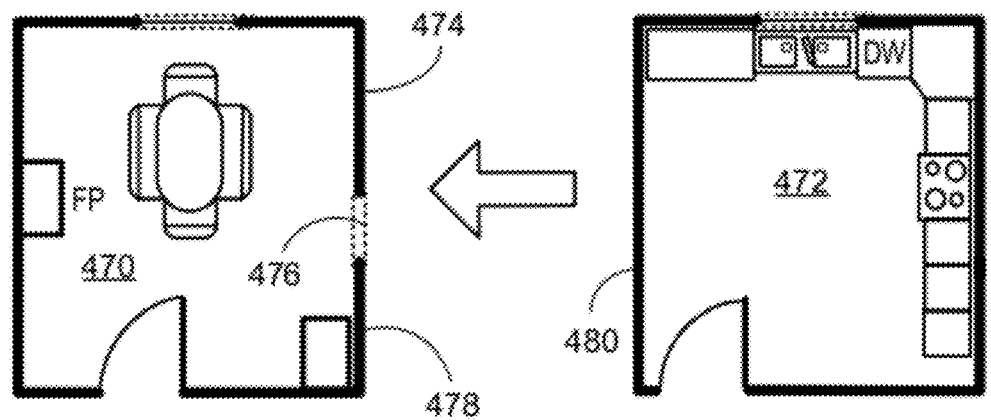
FIG. 33 is a diagram of two rooms.
Figure 34:
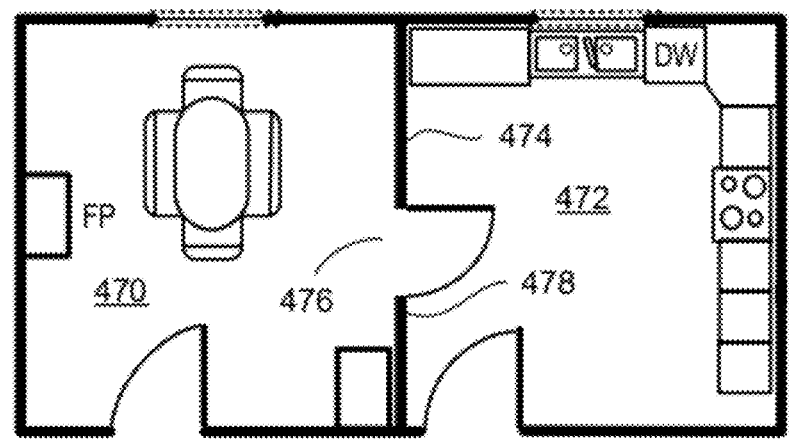
FIG. 34 is a diagram of the two room's of FIG. 33 after being joined.

In some implementations, a user may desire to combine multiple different rooms from different users or from different floor plans to generate a floor plan that includes multiple adjoined rooms, in order to combine multiple rooms into a unified floor plan, the home design tool includes a system that allows a user to snap together rooms that were submitted from two distinct users (or from, the same user) and from two distinct floor plans. A user that already has a room design in the floor plan drawing area, can drag a new room into their design. The walls that are parallel to each other will merge and the system will prompt the user to choose which wall openings they wish to delete. Until two rooms are merged, the user can select and move an entire room by clicking on the floor and moving it. For example, as shown in FIGS. 33 and 34, a user might desire to combine a dining room 470 with a kitchen 472. In order to join the two rooms (e.g., the dining room 470 with kitchen 472), the home design tool must determine which walls need to be merged and bow to merge the walls. For example, the dining room 470 includes a door 476 between the portions 474 and 478 of one of the walls but the kitchen 472 does not include a door on the wall 480 that is to be joined with the wall of the dining room 470. As such, the home design tool determines whether to keep the door 476 when merging the two walls (e.g., as shown in FIG. 34).

FIG. 35 shows a process 480 implemented by the home design tool for merging two walls to join two rooms in a floor plan. The home design tool receives an indication from a user to merge two rooms (482). For example, in one implementation, a user can drag one rooms towards another room on a user interface to indicate that the two moms should be joined in a floor plan. When the home design tool receives an indication to join two rooms, the home design tool determines which walls from the two rooms are to be combined into one shared wall (484). For example, in one implementation, the system can determine that walls that are approximately parallel in the two rooms should be merged when the rooms are joined.

The home design tool determines whether either of the walls that are to be merged when joining the rooms does not have any wall objects such as windows, doors, or other openings (486). If one of the walls does not have any wall objects, the system determines that the other wall (e.g., the wall with wall objects) should be given priory when merging the two walls. Since the wall with wall objects-(if any) is given priority, the home design tool merges the walls by adding any wall objects (if any) from the wall with wall objects to the wall without wall objects (494). On the other hand, the home design tool determines that both of the walls have wall objects, the home design tool presents a wall preference question to the user (488). In response to the wall preference question, the home design tool receives a user selection of a wall to be given preference in the wall merging process when joining the two rooms (490). Once the wall merging preference is known, the home design tool merges the walls by giving priority to the selected wall such that wall objects such as doors and windows on the non-selected wall are removed and any wall objects from the selected wall become part of the merged wall in the joined rooms (492).

While in the embodiment described above when both walls from, two rooms to be joined include wall objects the user selects the wall to be given priority, however other selection methods are possible. For example, the home design tool could assign, priority to the room that remains stationary or to the room that was inserted into the floor plan first.

If the walls of the joining walls are different lengths, the system identifies how the user drags the room next to the other room to determine the merging process. For example, if the corner (vertex) of the wall from the new room and the wall from the existing room are within two inches of each other and the walls are parallel to each other, the system will automatically assume the user intended to merge the two corners of the wall and position the new room accordingly without adjusting its size. If the vertices are not within two incites of each other, the system will simply assume that the user wishes to merge the walls and not the vertices. When, the user first drags a new room towards another room, they hold the left mouse button down. If they hover a wall from the room they are moving over the wall of a room they wish merge with the system will allow the user to slide the new room along the wall of the existing room. When, the left mouse button is released the room position is set. Dimensions may appear during this process to show the offset from the corner of the wall, for one room to the corner of the wall for another room. The user can use these dimensions to set the room position. If the user is within two inches of the vertex of the existing room's wall, the new room will slide into place to merge the vertices. A possible feature is to automatically adjust a wall length to of one of the joining walls when the merge occurs. However, this is not one of the most common approaches.

Figure 36A:
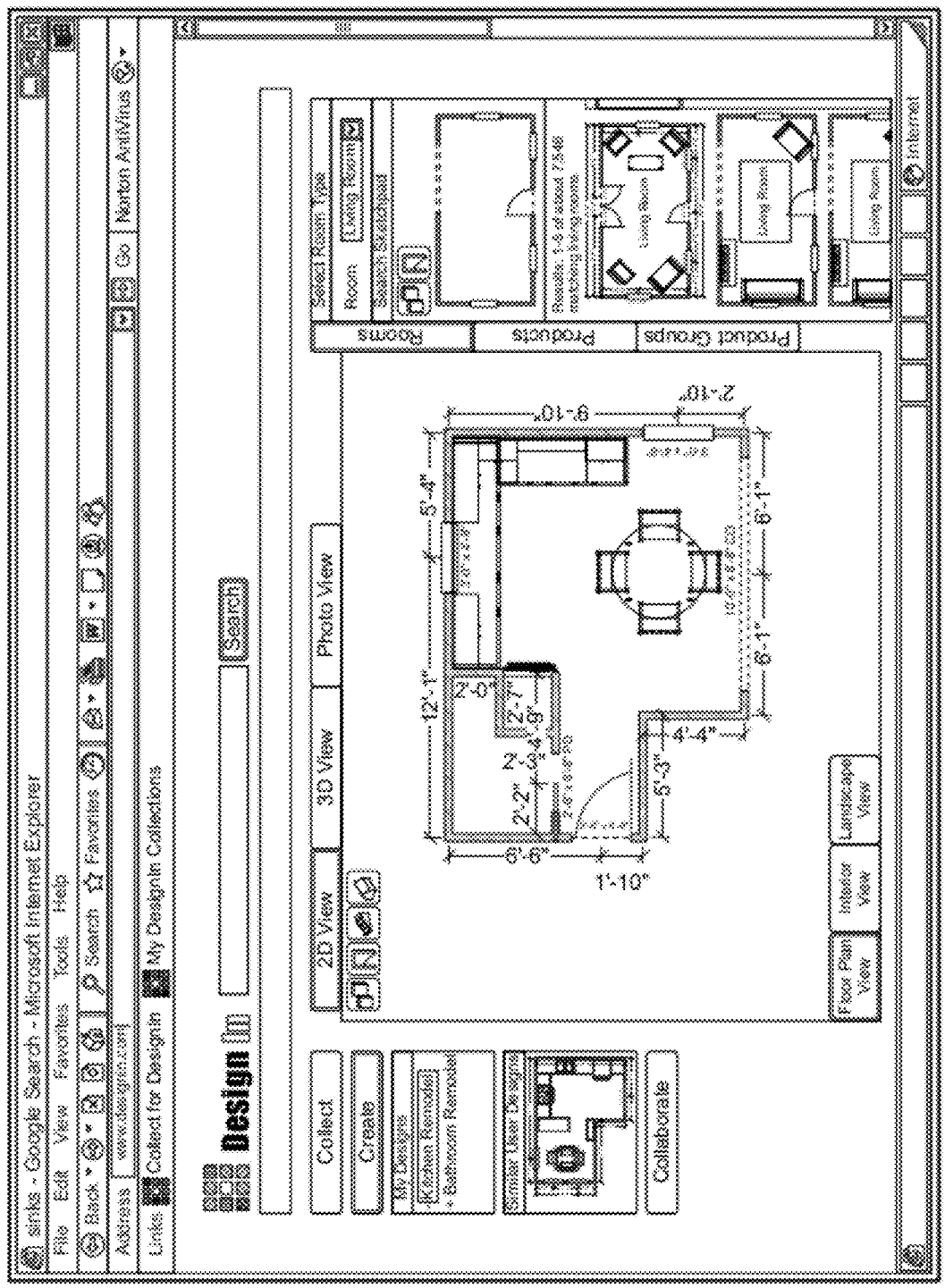
FIGS. 36A-36B show diagrams of a floor plans.
Figure 36B:
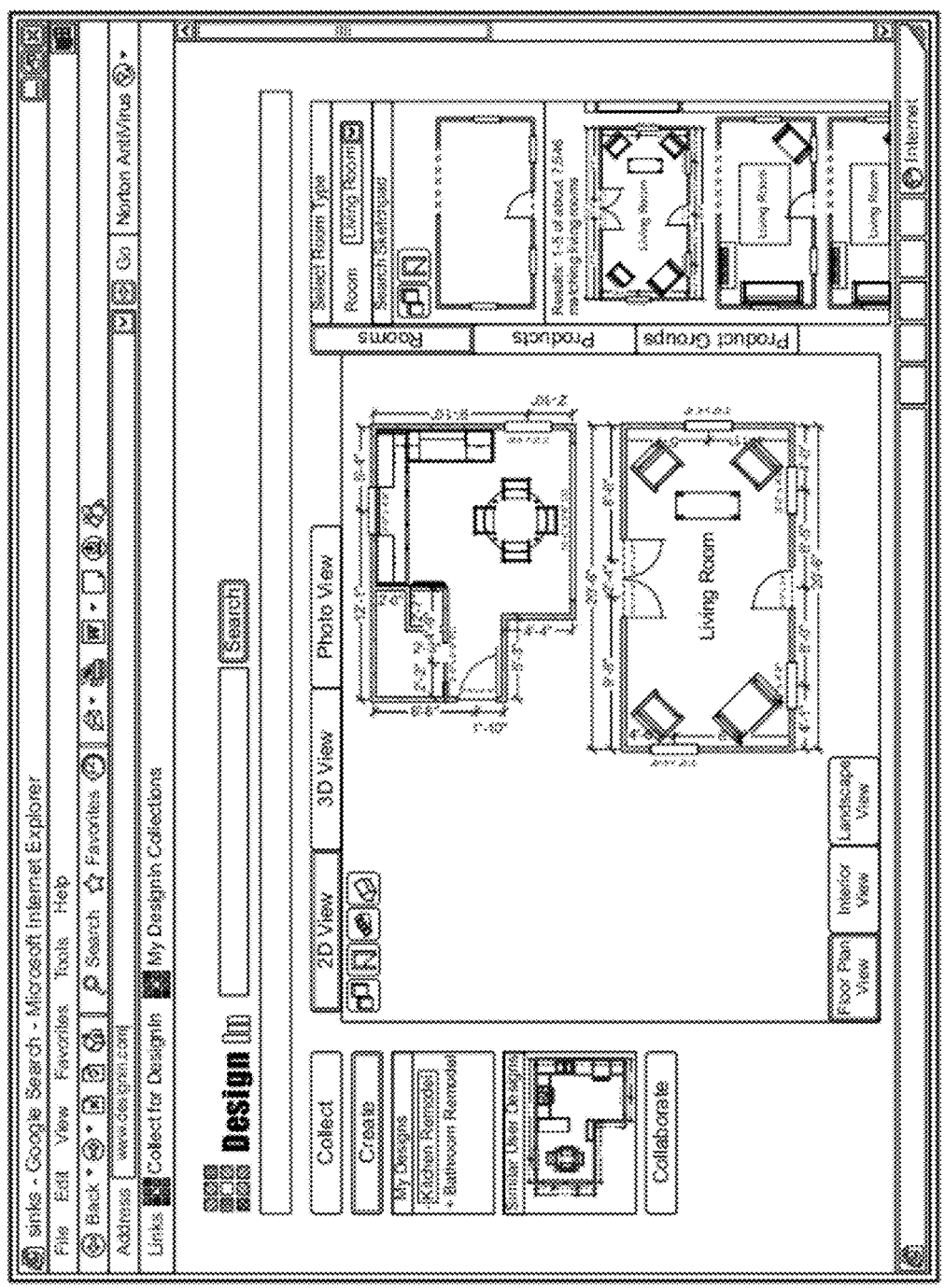
Figure 36C:
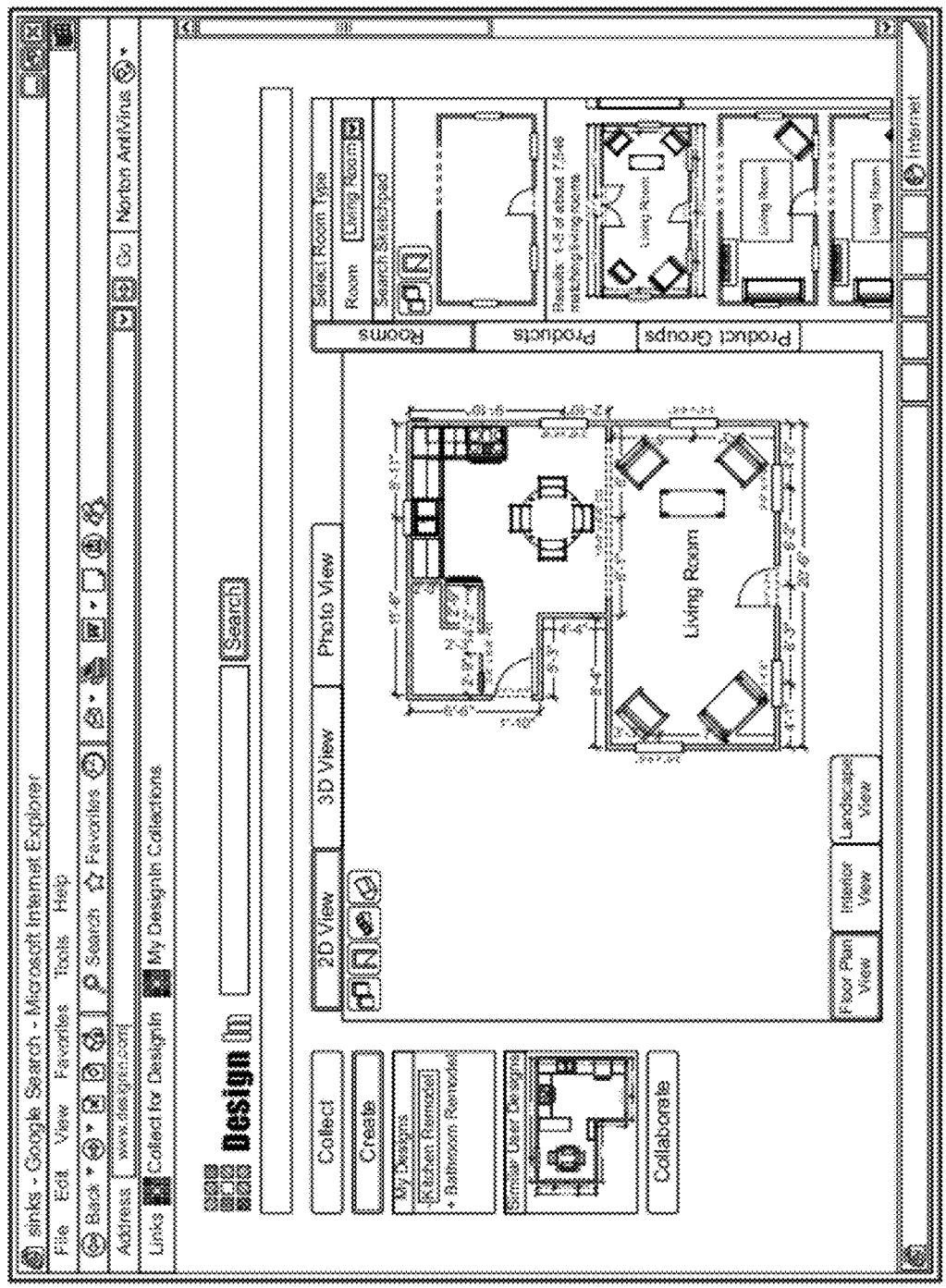
Figure 36D:
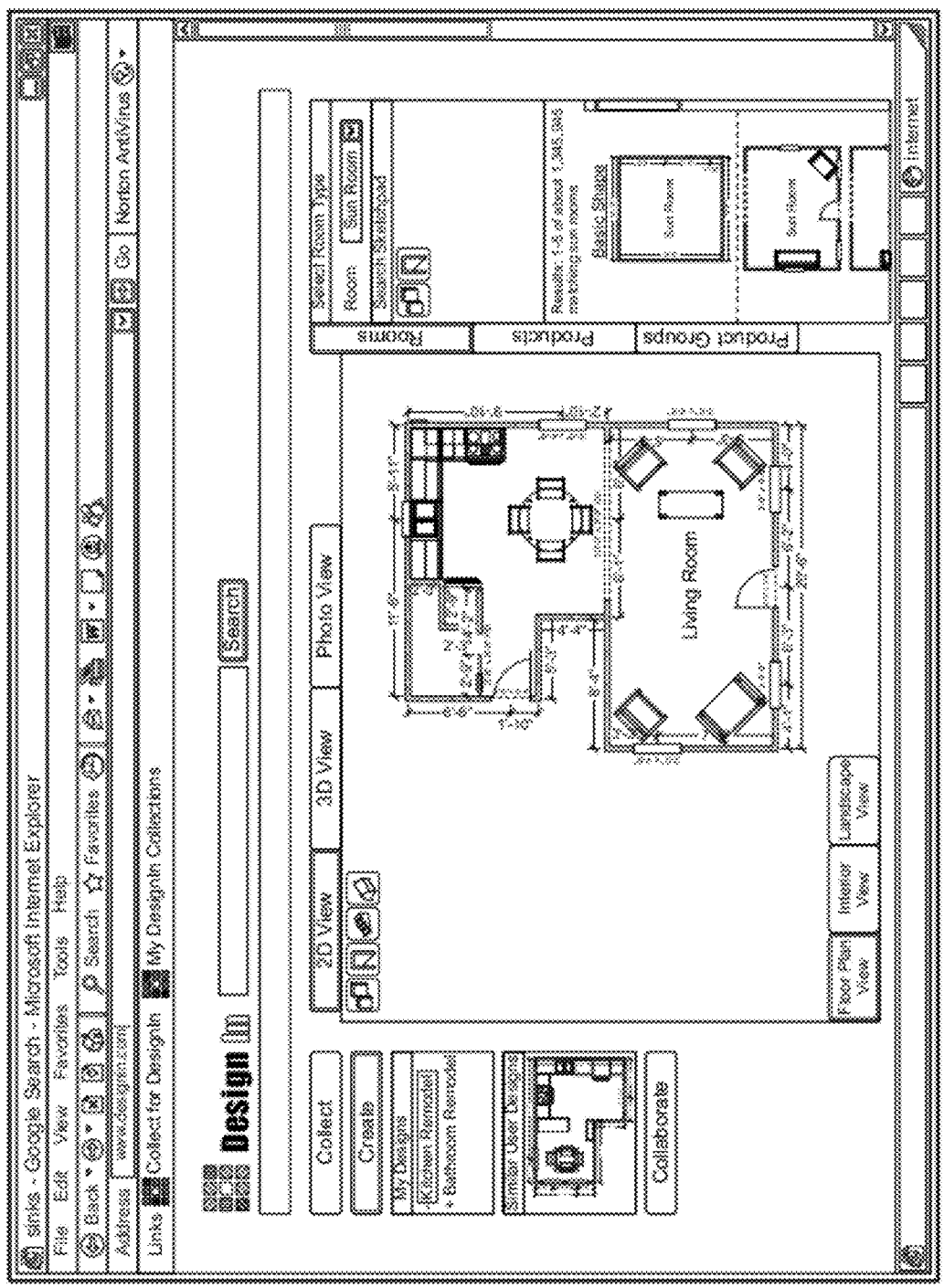
Figure 36E:
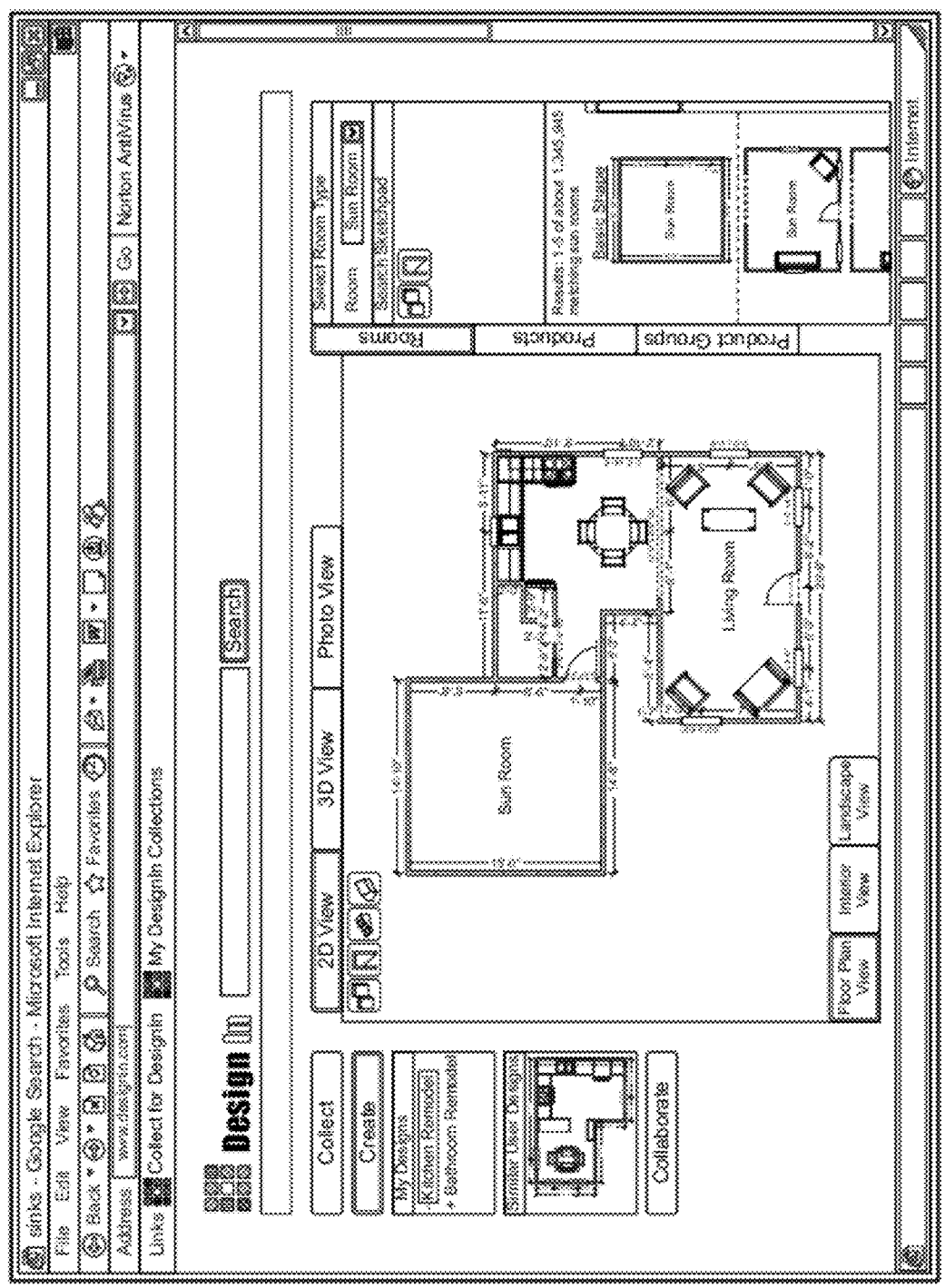

FIGS. 36A-36E show an exemplary use of the joining of distinct rooms to generate a floor plan that includes multiple adjoined rooms. As shown in FIG. 36A, a user has generated a CAD model for a kitchen. The user can select living room as the room type to search for a living room to add to the lay out by using the sketch pad to enter the general shape of the room (e.g., as described above). In response, the home design, tool presents the user with various previously created rooms matching the user's criteria (e.g., as shown below the sketchpad). In order to join one of the living rooms presented in the search results, the user selects the design using a mouse or other input tool and drags the room to the desired location in the layout (e.g., as shown in FIG. 36B). When the user drags the rooms together, the home design tool determines how to merge the walls of the rooms to generate adjoined rooms (e.g., as shown in FIG. 36C). The user can then search for additional rooms (e.g., a sunroom as shown in FIG. 36D) and add additional rooms to the layout (e.g., as shown in FIG. 36B).

Figure 38:
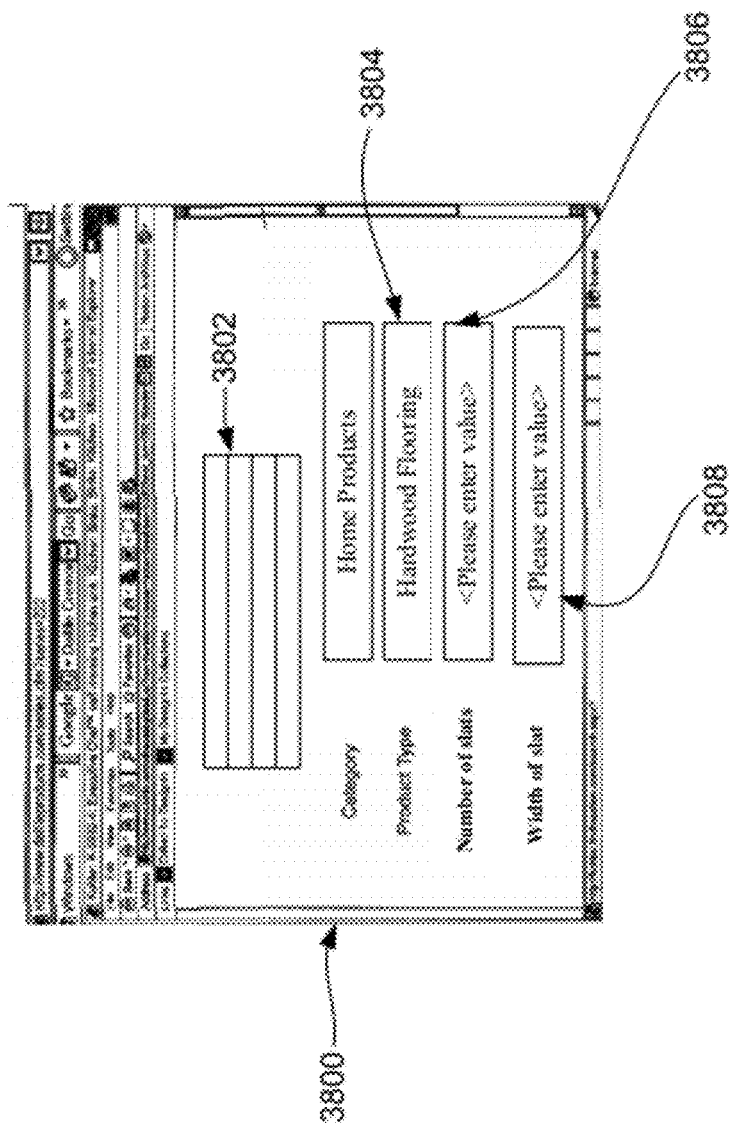
FIG. 38 is a diagram of a web interface and a menu for selecting product information related to a home design product.

FIG. 38 is a diagram of a web interface 3800 and a menu for selecting product information related to a home design product 3802. In the example of FIG. 38, the home design product 3802 is hardwood flooring, which is indicated by block 3804. The home design tool prompts the user to enter the number of slats shown in the image (e.g., as indicated in block 3806), and may also prompt the user to enter the width of a slat (e.g., as indicated in block 3808). In this example, the user would input the number four since there are four slats shown in the selected image. The home design tool can then map the texture to a surface using techniques similar to those described above using floor tile as the home design product.

While in the implementations described above, one wall was given priority over another wall when two walls are merged to join rooms in a floor plan, however other merging processes are possible. For example, a user could select particular wall objects from one or both of the walls to remain in the joined wall. In another implementation, the home design tool could give preference to different types of wall objects and merge the walls according to an assigned preference. For example, the home design tool could give priority to doors over windows or existing room over a new room. Other priorities will be set by which types of objects are included in the design. For example a kitchen design may be given priority over a living room design if the kitchen has objects like wall cabinets included on the merged wall of the design and the living room design has door opening in the same location.

The system and methods described herein can be implemented in digital electronic circuitry, or in computer hardware, firmware, software, or in combinations thereof. The methods and systems described herein can be implemented in a computer program product tangibly embodied in a machine-readable storage device for execution by a programmable processor and method actions can be performed by a programmable processor executing a program of instructions to perform functions described herein by operating on input data and generating output. The systems, software, and methods described herein can be implemented advantageously in one or more computer programs that are executable on a programmable system including at least one programmable processor coupled to receive data and instructions from, and to transmit data and instructions to, a data storage system, at least one input device, and at least one output device. Each computer program can be implemented in a high-level procedural or object oriented programming language, or in assembly or machine language if desired, and in any case, the language can be a compiled or interpreted language. Suitable processors include, by way of example, both general and special purpose microprocessors. Generally, a processor will receive instructions and data from a read-only memory and/or a random access memory. Generally, a computer will include one or more mass storage devices for storing data files, such devices include magnetic disks, such as internal hard disks and removable disks, magneto-optical disks, and optical disks. Storage devices suitable for tangibly embodying computer program instructions and data include all forms of nonvolatile memory, including, by way of example, semiconductor memory devices, such as EPROM, EEPROM, and flash memory devices; magnetic disks such as, internal hard disks and removable disks; magneto-optical disks; and CD_ROM disks. Any of the foregoing can be supplemented by, or incorporated in, ASICs (application-specific integrated circuits).

Figure 37:
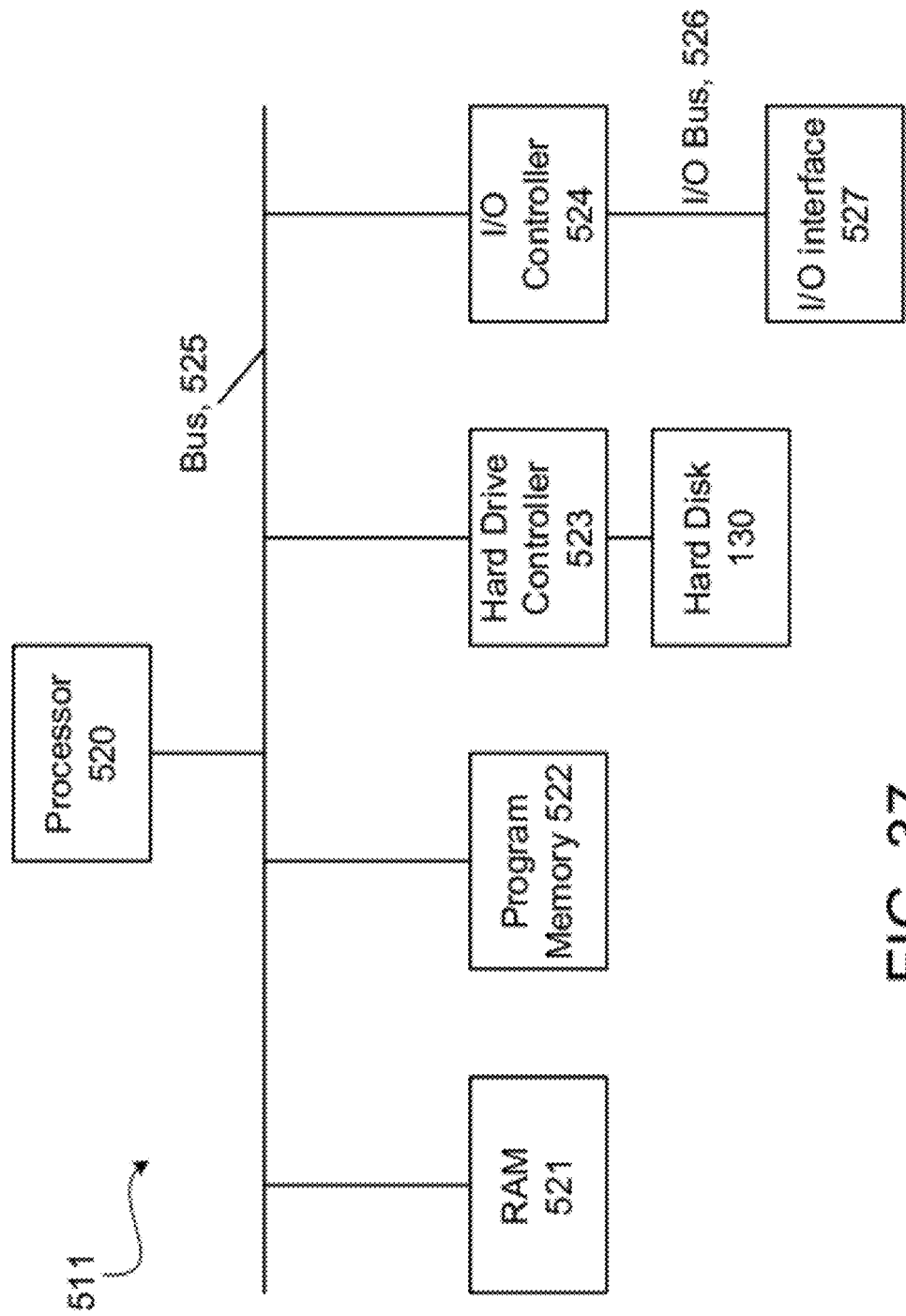
FIG. 37 is a block diagram of a computer system.

An example of one such type of computer is shown in FIG. 37, which shows a block diagram of a programmable processing system (system) 511 suitable for implementing or performing the apparatus or methods described herein. The system 511 includes a processor 520, a random access memory (RAM) 521, a program memory 522 (for example, a writeable read-only memory (ROM) such as a flash ROM), a hard drive controller 523, and an input/output (I/O) controller 524 coupled by a processor (CPU) bus 525. The system 511 can be preprogrammed, in ROM, for example, or it can be programmed (and reprogrammed) by loading a program from another source (for example, from a floppy disk, a CD-ROM, or another computer).

The hard drive controller 523 is coupled to a hard disk 130 suitable for storing executable computer programs, including programs embodying the present methods, and data including storage. The I/O controller 524 is coupled by an I/O bus 526 to an I/O interface 527. The I/O interlace 527 receives and transmits data in analog or digital form over communication links such as a serial link, local area network, wireless link, and parallel link.

While the system and methods described above have been directed to an implementation of the home design tool, for design and layout of rooms for a house, the tool is not limited to home designs, as such, other implementations are possible. For example, the home design tool, could be used to generate a layout of an office building or other commercial space, in addition, the home design tool could be used to generate layouts of garden or other landscaping features.

Elements, of different implementations described herein may be combined to form other implementations not specifically set forth above. Other implementations not specifically described, herein are also within the scope of the following claims.

What is claimed is:

1. A computer-implemented method for use in generating a home design layout, the method comprising:
    receiving, by a computer system, a floor plan that comprises multiple adjoining rooms;
    receiving, by the computer system, a user selection of a first room from the multiple adjoining rooms, the user selection activating a portion of the floor plan associated with the first room with a selection device;
    in response to the user selection of the first room, determining, by the computer system, each wall in the floor plan that structurally defines the layout of first room;
    storing information about the layout of the first room in a database, the information about the layout of the first room comprising information associated with one or more determined walls; and
    in response to the user selection of the first room, presenting, on a user interface, a computer-aided design (CAD) model of the first room in its entirety without presenting CAD models for the multiple adjoining rooms.

2. The computer-implemented method of claim 1, further comprising:
    determining if any home design products are associated with the first room in the floor plan; and
    storing information about the home design products associated with the first room with the information about the layout of the first room in the database.

3. The computer-implemented method of claim 1, further comprising searching the database for other rooms that have a layout that is similar to the layout of the first room.

4. The computer-implemented method of claim 1, further comprising updating information about the first room.

5. A computer-implemented method for use in generating a home design layout, the method comprising:
    receiving, by a computer system, a request, the request comprising a request to join a first room and a second room in a computer-generated floor plan, the first room comprising a first wall and the second room comprising a second wall;
    automatically assigning, by the computer system, a priority to one of the first and second rooms, the priority indicating a preference for merging the first wall of the first room with the second wall of the second room, and the priority being based on one or more features of the first wall of the first room or the second wall of the second room; and
    merging, by the computer system, the first wall of the first room and the second wall of the second room based at least in part on the assigned priority.

6. The computer-implemented method of claim 5, wherein merging the first wall of the first room and the second wall of the second room based on the assigned priority comprises determining a placement of a door based on the location of a door in the room assigned the priority.

7. The computer-implemented method of claim 5, wherein merging the first wall of the first room and the second wall of the second room based on the assigned priority comprises joining first and second rooms using a wall from the room assigned the priority.

8. The computer-implemented method of claim 5, wherein assigning the priority comprises receiving a user input of a preference of one of the first and second rooms.

9. A computer program product, tangibly embodied in a non-transitory computer-readable medium, for executing instructions on a processor, the computer program product configured to cause a machine to:

receive a floor plan that comprises multiple adjoining rooms;

receive a user selection of a first room from the multiple adjoining rooms, the user selection activating a portion of the floor plan associated with the first room with a selection device;

in response to the user selection of the first room, determining each wall in the floor plan that structurally defines the layout of first room;

store information about the layout of the first room in a database, the information about the layout of the first room comprising information associated with one or more determined walls; and in response to the user selection of the first room, present, on a user interface, a computer-aided design (CAD) model of the first room in its entirety without presenting CAD models for the multiple adjoining rooms.

10. The computer program product of claim 9, further comprising instructions to cause a machine to:

determine if any home design products are associated with the first room in the floor plan; and store information about the home design products associated with the first room with the information about the layout of the first room in the database.

11. The computer program product of claim 9, further comprising instructions to cause a machine to:

search the database for other rooms that have a layout that is similar to the layout of the first room.

12. A computer program product, tangibly embodied in a non-transitory computer-readable medium, for executing instructions on a processor, the computer program product configured to cause a machine to:

receive a request, the request comprising a request to join a first room and a second room in a computer-generated floor plan, the first room comprising a first wall and the second room comprising a second wall;

automatically assign a priority to one of the first and second rooms, the priority indicating a preference for merging the first wall of the first room with the second wall of the second room, and the priority being based on one or more features of the first wall of the first room or the second wall of the second room; and;

merge the first wall of the first room and the second wall of the second room based at least in part on the assigned priority.

13. The computer program product of claim 12, wherein the instructions to cause a machine to merge the first wall of the first room and the second wall of the second room based on the assigned priority comprise instructions to cause a machine to determine a placement of a door based on the location of a door in the room assigned the priority.

14. The computer program product of claim 12, wherein the instructions to cause a machine to merge the first wall of the first room and the second wall of the second room based on the assigned priority comprise instructions to cause a machine to join first and second rooms using a wall from the room assigned the priority.

15. The computer program product of claim 12, further comprising instructions to cause a machine to receive a user input of a preference of one of the first and second rooms.

16. The computer program product of claim 12, wherein the priority being based on one or more features of the first wall of the first room or the second wall of the second room comprises the priority being based on one or more wall objects of the first wall of the first room or the second wall of the second room.

17. The computer program product of claim 12, wherein the priority being based on one or more features of the first wall of the first room or the second wall of the second room comprises the priority being based on one or more wall objects of the first wall of the first room if the second wall of the second room is without wall objects.

18. The computer-implemented method of claim 5, wherein the priority being based on one or more features of the first wall of the first room or the second wall of the second room comprises the priority being based on one or more wall objects of the first wall of the first room or the second wall of the second room.

19. The computer-implemented method of claim 5, wherein the priority being based on one or more features of the first wall of the first room or the second wall of the second room comprises the priority being based on one or more wall objects of the first wall of the first room if the second wall of the second room is without wall objects.

* * * * *